(12) United States Patent
Han et al.

(10) Patent No.: US 12,101,542 B2
(45) Date of Patent: Sep. 24, 2024

(54) CAMERA DEVICE

(71) Applicant: LG INNOTEK CO., LTD., Seoul (KR)

(72) Inventors: Sang Yeon Han, Seoul (KR); Deok Yong Lee, Seoul (KR); Woo Yeong Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 165 days.

(21) Appl. No.: 17/922,552

(22) PCT Filed: May 4, 2021

(86) PCT No.: PCT/KR2021/005620
§ 371 (c)(1),
(2) Date: Oct. 31, 2022

(87) PCT Pub. No.: WO2021/225362
PCT Pub. Date: Nov. 11, 2021

(65) Prior Publication Data
US 2023/0247272 A1 Aug. 3, 2023

(30) Foreign Application Priority Data

May 7, 2020 (KR) .................. 10-2020-0054708
May 8, 2020 (KR) .................. 10-2020-0055035
May 14, 2020 (KR) .................. 10-2020-0057453

(51) Int. Cl.
*H04N 23/54* (2023.01)
*H04N 23/52* (2023.01)
*H04N 23/90* (2023.01)

(52) U.S. Cl.
CPC ............. *H04N 23/54* (2023.01); *H04N 23/90* (2023.01); *H04N 23/52* (2023.01)

(58) Field of Classification Search
CPC ........ H04N 23/54; H04N 23/90; H04N 23/52; H04N 23/00; H04N 23/45; H04N 23/51;
(Continued)

(56) References Cited

U.S. PATENT DOCUMENTS 7,663,818 B2 * 2/2010 Chung .................. H02K 33/18
359/822
2013/0033584 A1 * 2/2013 Seo ........................ G03B 35/10
348/47

(Continued)

FOREIGN PATENT DOCUMENTS

KR 10-2015-0113675 A 10/2015
KR 10-2019-0137657 A 12/2019
KR 10-2020-0039975 A 4/2020

*Primary Examiner* — Nhan T Tran
(74) *Attorney, Agent, or Firm* — Birch, Stewart, Kolasch & Birch, LLP

(57) ABSTRACT

The present embodiment relates to a camera device comprising: a bracket comprising a first hole and a second hole; a first camera module disposed in the first hole of the bracket; a second camera module disposed in the second hole of the bracket; a first magnet disposed on the outer surface of the first camera module; and a second magnet disposed at a position corresponding to the first magnet on the outer surface of the bracket, wherein the first magnet is fixed to the outer surface of the first camera module and the second magnet is movably disposed on the bracket.

20 Claims, 41 Drawing Sheets

(58) Field of Classification Search
CPC ........ H04N 23/55; H04N 23/57; G03B 17/55;
H05K 1/02; H05K 1/11
See application file for complete search history.

(56) References Cited

U.S. PATENT DOCUMENTS

| | | |
|---|---|---|
| 2018/0246344 A1 | 8/2018 | Hu et al. |
| 2019/0285827 A1* | 9/2019 | Wu ........................ G03B 19/22 |
| 2019/0356862 A1 | 11/2019 | Lu |
| 2019/0369678 A1* | 12/2019 | Park .................... H04M 1/0264 |
| 2021/0405508 A1* | 12/2021 | Kim ....................... H04N 23/51 |

* cited by examiner

CAMERA DEVICE

CROSS REFERENCE TO RELATED APPLICATIONS

This application is the National Phase of PCT International Application No. PCT/KR2021/005620, filed on May 4, 2021, which claims priority under 35 U.S.C. § 119(a) to Patent Application Nos. 10-2020-0054708, 10-2020-0055035, and 10-2020-0057453 filed in the Republic of Korea on May 7, 2020, May 8, 2020, and May 14, 2020, respectively, all of which are hereby expressly incorporated by reference into the present application.

TECHNICAL FIELD

The present embodiment relates to a camera device.

BACKGROUND ART

Since it is difficult to apply the technology of a voice coil motor (VCM) used in a typical general camera module to a camera module for ultra-small size and low power consumption, related researches have been actively conducted.

In the case of a camera module mounted on a small electronic product such as a smartphone, the camera module may be frequently impacted during use, and the camera module may be slightly shaking according to a user's hand tremble and the like while photographing. In consideration of such aspects, a technique for additionally installing a hand tremble prevention means to a camera module has recently been developed.

Meanwhile, recently, a camera device for arranging two camera modules side by side has been studied. However, in a typical camera device, after assembling the camera module to the bracket, fine adjustment is impossible, so there is a problem in that it is difficult to align between the camera modules.

Meanwhile, recently, the application of a high-pixel image sensor for sharp image quality to a camera module has been studied. However, since the high-pixel image sensor generates more heat than the typical image sensor, a method for reducing the heat of the high-pixel image sensor and the printed circuit board mounted with an image sensor is required.

DETAILED DESCRIPTION OF THE INVENTION

Technical Subject

The first embodiment of the present invention provides a camera module and an optical apparatus capable of: reducing the length in an optical axis direction and the size in a direction perpendicular to the optical axis; increasing the separation distance between the lens module and the filter; and improving the coupling force between the holder and the circuit board.

The second embodiment of the present invention is to provide a camera device capable of fine adjustment for optical axis alignment after the camera module is inserted inside the bracket.

A third embodiment of the present invention is to provide a printed circuit board comprising a structure for attenuating the heat being generated in an image sensor. In addition, it is intended to provide a camera module comprising the printed circuit board and a high-pixel image sensor.

Technical Solution

A camera module according to a first embodiment of the present invention comprises: a circuit board; a base being coupled to an upper surface of the circuit board; a holder being disposed inside the base; an image sensor being disposed on an upper surface of the circuit board and being disposed inside the holder; a filter positioned on the image sensor and being disposed on the holder; and a circuit element being disposed on an upper surface of the circuit board, wherein a groove is formed on a lower surface of the holder, and wherein at least a portion of the circuit element may be accommodated inside the groove.

At least a portion of the holder may be overlapped with an optical axis direction and the circuit element.

The holder may comprise a seating part being recessed from an upper surface, and an opening formed on a bottom surface of the seating part, and an edge of the filter may be disposed on the bottom surface of the seating part.

The base may comprise a first opening, wherein the holder may comprise a second opening positioned below the first opening and facing the first opening, and wherein the image sensor may be disposed inside the second opening.

The holder may be spaced apart from the base, and the base may be overlapped with the image sensor in a direction perpendicular to the optical axis.

The camera module may comprise a housing being disposed on the base; and a lens module being disposed inside the housing and being moved in an optical axis direction, wherein the circuit element is positioned between the holder and the base and may be overlapped with at least a portion of the lens module in an optical axis direction.

A lower surface of the holder may comprise a first region being overlapped with a bottom surface of the seating part in an optical axis direction, wherein the first region may be coupled to the circuit board.

A lower surface of the holder may comprise a second region not being overlapped with a bottom surface of the seating part in the optical axis direction, wherein the second region may be coupled to the circuit board.

The groove may be formed in the second region.

The groove may comprise a first surface having a step difference in an optical axis direction from a lower surface of the holder, and a second surface connecting the lower surface of the holder and the first surface, wherein the first surface may be positioned higher than the bottom surface.

A camera module according to another embodiment comprises: a circuit board; a lens moving device comprising a base being disposed on the circuit board and having a first opening, a housing being disposed on the base, and a bobbin disposed inside the housing and movable in an optical axis direction; a lens module being coupled to the bobbin and facing the first opening; a holder comprising a second opening facing the lens module, being coupled to an upper surface of the circuit board, and being disposed inside the base; an image sensor being disposed on an upper surface of the circuit board and being positioned inside the second opening of the holder; a filter being disposed in the holder and being disposed on the image sensor; and a circuit element being disposed on an upper surface of the circuit board and being disposed between the holder and the base, wherein a lower portion of the base is coupled to the circuit board, wherein the circuit element is being disposed between the base and the holder, and wherein at least a portion of the circuit element may be overlapped with the holder in an optical axis direction.

A camera device according to a second embodiment of the present invention comprises: a bracket comprising a first hole and a second hole; a first camera module being disposed in the first hole of the bracket; a second camera module being disposed in the second hole of the bracket; a first magnet being disposed on an outer surface of the first camera module; and a second magnet being disposed on an outer surface of the bracket at a position corresponding to the first magnet, wherein the first magnet is fixed to the outer surface of the first camera module, and wherein the second magnet may be movably disposed in the bracket.

The bracket may comprise a groove being formed on the outer surface of the bracket, and the second magnet may be movable within the groove of the bracket.

An attractive force may act between the first magnet and the second magnet.

When the second magnet moves within the groove of the bracket, the first camera module may move together with the second magnet by an attractive force between the first magnet and the second magnet.

The first magnet comprises a first internal magnet through which a first axis perpendicular to an optical axis of the first camera module passes and a second internal magnet through which the optical axis of the first camera module and a second axis perpendicular to the first axis pass, wherein the second magnet may comprise a first external magnet through which the first axis passes and a second external magnet through which the second axis passes.

The first external magnet and the second external magnet may be movable in different directions.

The first external magnet may be movable in the optical axis direction, and the second external magnet may be movable in the first axis direction.

The first external magnet is limited in movement in the first axis direction and the second axis direction, and the second external magnet may be limited in movement in the optical axis direction and the second axis direction.

The first external magnet may be movable in the optical axis direction and the second axis direction.

The groove of the bracket comprises: a first groove in which the first external magnet is disposed; and a second groove in which the second external magnet is disposed, wherein the length of the first groove in the optical axis direction may be longer than the length of the first groove in the second axis direction.

A length of the first groove in the second axis direction may be the same as the length of the first external magnet in the second axis direction.

A length of the second groove in the first axis direction may be longer than the length of the second groove in the optical axis direction.

The length of the second groove in the optical axis direction may be the same as the length of the second external magnet in the optical axis direction.

The first magnet comprises a first internal magnet being disposed on a first outer side surface of the first camera module, and a second internal magnet being disposed on a second outer surface inclinedly disposed on the first outer side surface of the first camera module, wherein the second magnet comprises a first external magnet being disposed on an outer side surface of the first sidewall of the bracket and a second external magnet being disposed on an outer surface of the second sidewall of the bracket, wherein the first internal magnet and the first external magnet are disposed at positions corresponding to each other with the first sidewall of the bracket interposed therebetween, and wherein the second internal magnet and the second external magnet may be disposed at positions corresponding to each other with the second sidewall of the bracket interposed therebetween.

The groove of the bracket may be spaced apart from an edge of the outer surface of the bracket.

The first magnet and the second magnet may be formed in corresponding shapes.

A surface of the first magnet facing the second magnet may be formed in a circular shape, and a surface of the second magnet facing the first magnet may be formed in a circular shape.

The first camera module and the second camera module may be disposed such that an optical axis of the first camera module and an optical axis of the second camera module are parallel.

A sealing member being disposed between the second camera module and the bracket may be comprised.

The second camera module may comprise a cover member, a bobbin being disposed inside the cover member, and a coil and a magnet being disposed inside the cover member and moving the bobbin.

An optical device according to a second embodiment of the present invention may comprise: a main body; the camera device being disposed in the body; and a display being disposed in the main body and outputting an image being photographed by the camera device.

A camera device according to a second embodiment of the present invention comprises: a bracket comprising a first hole and a second hole; a first camera module being disposed in the first hole of the bracket; a second camera module being disposed in the second hole of the bracket; a first magnet being disposed on the first camera module; and a second magnet being movably disposed on the bracket, wherein the first magnet and the second magnet are disposed at positions corresponding to each other with the bracket interposed therebetween, and wherein when the second magnet moves, the first camera module may move together with the second magnet by an attractive force between the first magnet and the second magnet.

A camera module according to a third embodiment of the present invention comprises: a printed circuit board; an image sensor being disposed on the printed circuit board; a lens driving device being disposed on the printed circuit board; and a lens being coupled to the lens driving device, wherein the printed circuit board comprises an insulation layer and a conductive layer disposed on the insulation layer, wherein the insulation layer of the printed circuit board comprises an upper surface facing the lens driving device, a lower surface being disposed at an opposite side of to the upper surface, and a side surface connecting the upper surface and the lower surface, wherein the image sensor is being disposed on the upper surface of the insulating layer, wherein the conductive layer comprises a first conductive layer being disposed on the upper surface of the insulation layer, and wherein the first conductive layer may be extended from an edge of the upper surface of the insulation layer.

The edge of the insulation layer comprises a first edge disposed in a first direction perpendicular to the optical axis; the first conductive layer comprises a first portion being extended from the first edge of the insulation layer; and the length of the first portion of the first conductive layer in the first direction may be longer than the length of the image sensor in the first direction.

The edge of the insulating layer comprises a second edge being disposed in a second direction perpendicular to the optical axis and the first direction; the first conductive layer comprises a second portion being extended from the second edge; and the first portion and the second portion of the first conductive layer may be connected at the upper surface of the insulating layer.

The first conductive layer may be spaced apart from a corner where the first edge and the second edge of the insulating layer meet.

The length of the second portion of the first conductive layer in the second direction may be longer than the length of the image sensor in the second direction.

The conductive layer may comprise a second conductive layer being disposed in the side surface of the insulation layer, and the first conductive layer may be directly connected to the second conductive layer at the edge of the insulation layer.

The side surface of the insulating layer comprises first to fourth side surfaces; the second conductive layer comprises a first portion being disposed on the first side surface of the insulation layer; and the first portion of the second conductive layer may cover an area of 90% or more of the first side surface of the insulation layer.

The conductive layer of the printed circuit board may comprise a third conductive layer being disposed on the lower surface of the insulating layer, and the second conductive layer may connect the first conductive layer and the third conductive layer.

The printed circuit board may comprise a via hole penetrating the insulation layer in an optical axis direction.

The conductive layer may comprise a fourth conductive layer being disposed on an inner circumferential surface of the via hole and connecting the first conductive layer and the third conductive layer.

The insulation layer comprises a plurality of insulation layers; the conductive layer comprises a fifth conductive layer being disposed between the plurality of insulation layers; and the fifth conductive layer may be connected to at least one of the first conductive layer and the third conductive layer through the fourth conductive layer.

The side surface of the insulation layer may comprise four side surfaces, and the second conductive layer may be disposed on two side surfaces being disposed at an opposite side to each other among the four side surfaces of the insulation layer.

The upper surface of the insulation layer may comprise four side surfaces, and the second conductive layer may be disposed on at least three side surfaces among the four side surfaces of the insulation layer.

The side surface of the insulation layer comprises four side surfaces; the edge of the upper surface of the insulation layer comprises four edges corresponding to the four side surfaces; and the first conductive layer may be spaced apart from at least one among the four edges of the insulation layer.

The second conductive layer may comprise a hole being formed in the second conductive layer to expose a portion of the side surface of the insulation layer.

The lens driving device comprises: a metal cover member; a bobbin being disposed inside the cover member and being coupled to the lens; and a coil and a magnet being disposed inside the cover member to move the bobbin, wherein the cover member may be electrically connected to the first conductive layer.

The second conductive layer may dissipate heat generated in the image sensor.

The conductive layer may be electrically connected to the image sensor.

The conductive layer may comprise copper.

An optical apparatus according to a third embodiment of the present invention comprises: a main body; the camera module being disposed in the main body; and a display being disposed in the main body and outputting an image being photographed by the camera module.

A printed circuit board according to a third embodiment of the present invention comprises an insulation layer, and a conductive layer being disposed on the insulation layer; the insulation layer comprises an upper surface, a lower surface being disposed at an opposite side of the upper surface, and a side surface connecting the upper surface and the lower surface; the conductive layer comprises a first conductive layer being disposed on the upper surface of the insulation layer, and a second conductive layer being disposed on the side surface of the insulation layer; and the first conductive layer is extended from an edge of the upper surface of the insulation layer and may be directly connected to the second conductive layer at the edge.

Advantageous Effects

In a first embodiment of the present invention, a holder is disposed at an inner side of the base of the lens driving device, and the lower surface of the base is directly coupled to the upper surface of the circuit board, thereby reducing the height of the camera module.

In a first embodiment of the present invention, since the lower surface of the support part of the holder for supporting the filter is directly coupled to an upper surface of the circuit board, it is possible to increase the separation distance in an optical axis direction between the filter and the lens module, and collision between the wire connecting the image sensor and the circuit board and the support part of the holder can be prevented.

In a first embodiment of the present invention, the size of the camera module in a horizontal direction can reduced by disposing or arranging the circuit elements on a circuit board so that at least a part of the circuit elements is overlapped with the holder in an optical axis direction.

According to a first embodiment of the present invention, the coupling force between the holder and the circuit board can be improved, the shear force can be increased, and the holder and the circuit board can be prevented from being separated from each other by an external impact.

Through the second embodiment of the present invention, fine adjustment for optical axis alignment may be possible even after the camera module is inserted inside the bracket.

In more detail, after assembling the main camera module in the bracket and inserting the sub camera module, by using a magnet, it can be aligned by fine-tuning the optical axis of the sub camera module with respect to the optical axis of the main camera module.

Through the third embodiment of the present invention, heat generated by the image sensor can be dispersed throughout the printed circuit board to reduce heat generation.

In addition, the ground signal area on the printed circuit board is increased, which is advantageous in terms of noise.

In addition, the number of via holes can be reduced. Through this, management of the image sensor mounting becomes advantageous. Through this, the camera module defect rate due to tilt can be reduced.

BRIEF DESCRIPTION OF DRAWINGS

FIG. 8b is a plan view of the configurations of FIG. 8a.

FIG. 9b is a bottom perspective view of the holder of FIG. 9a.

FIG. 10 is a cross-sectional view of a camera module comprising the holder of FIG. 9a.

FIG. 11b shows a collision between the support part of the holder and the wire in the camera module of FIG. 11a.

BEST MODE

Figure 1:
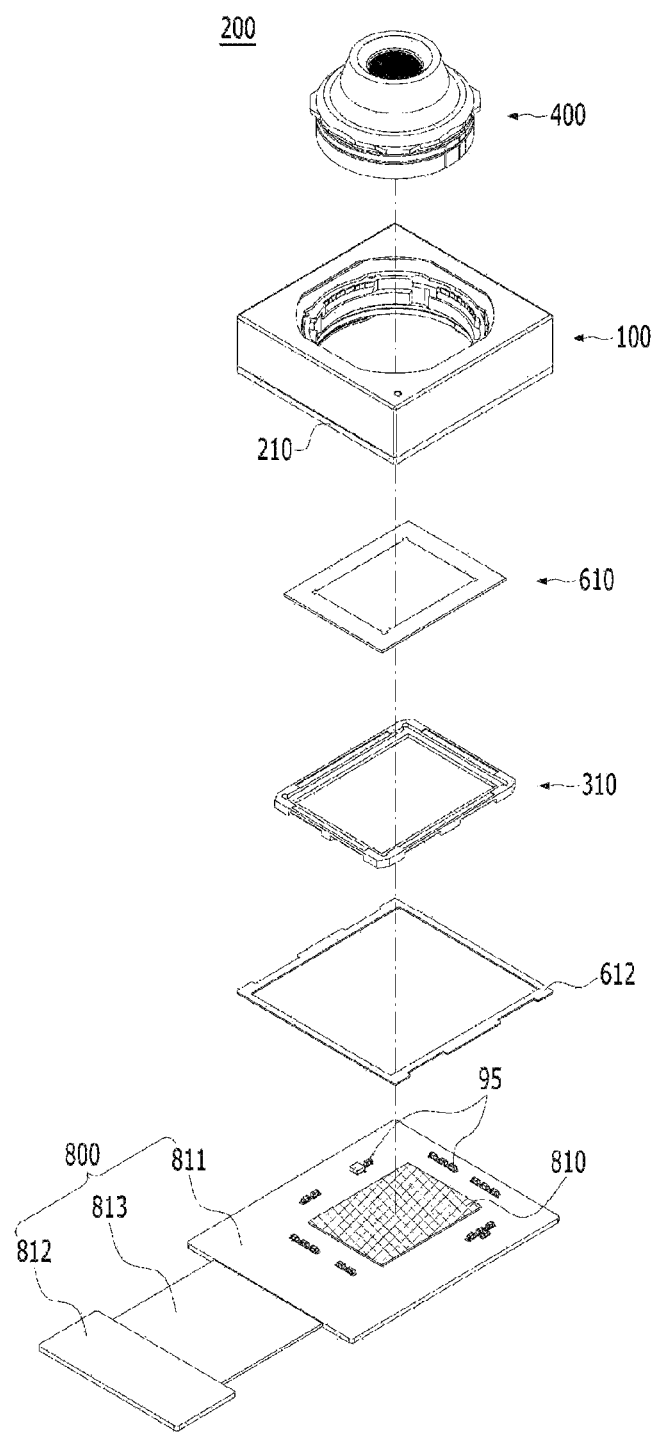
FIG. 1 is an exploded view of a camera module according to a first embodiment of the present invention.

Hereinafter, embodiments of the present invention that can specifically realize the above objects will be described with reference to the accompanying drawings.

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (comprising technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may comprise the plural form unless specifically stated in the phrase, and when described as "at least one (or more than one) of A and B and C", it may comprise one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also comprise cases of being 'connected', 'coupled', or 'interconnected' due that another component between that other components.

In addition, when described as being formed or arranged in "on (above)" or "below (under)" of each component, "on (above)" or "below (under)" means that it comprises not only the case where the two components are directly in contact with, but also the case where one or more other components are formed or arranged between the two components. In addition, when expressed as "on (above)" or "below (under)", the meaning of not only an upward direction but also a downward direction based on one component may be comprised.

Hereinafter, a camera module according to an embodiment and an optical apparatus comprising the same will be described with reference to the accompanying drawings. For convenience of description, the camera module according to the embodiment is described using a Cartesian coordinate system (x, y, z), but may be described using other coordinate systems, and the embodiment is not limited thereto. In each drawing, the x-axis and y-axis mean a direction perpendicular to the z-axis, which is the optical axis (OA) direction; the z-axis direction, which is the optical axis (OA) direction, is referred to as a 'first direction'; the x-axis direction is referred to as a 'second direction'; and the y-axis direction may be referred to as a 'third direction'.

The 'hand tremble correction function' applied to the camera module of a mobile device such as a smartphone or tablet PC may be a function that moves a lens in a direction perpendicular to the optical axis direction or tilts the lens with respect to the optical axis in order to cancel vibration (or movement) caused by the user's hand tremble.

In addition, 'auto-focusing function' may be a function automatically focusing on the subject by moving the lens in the optical axis direction according to the distance of the subject in order to obtain a clear image of the subject on the image sensor.

Figure 2:
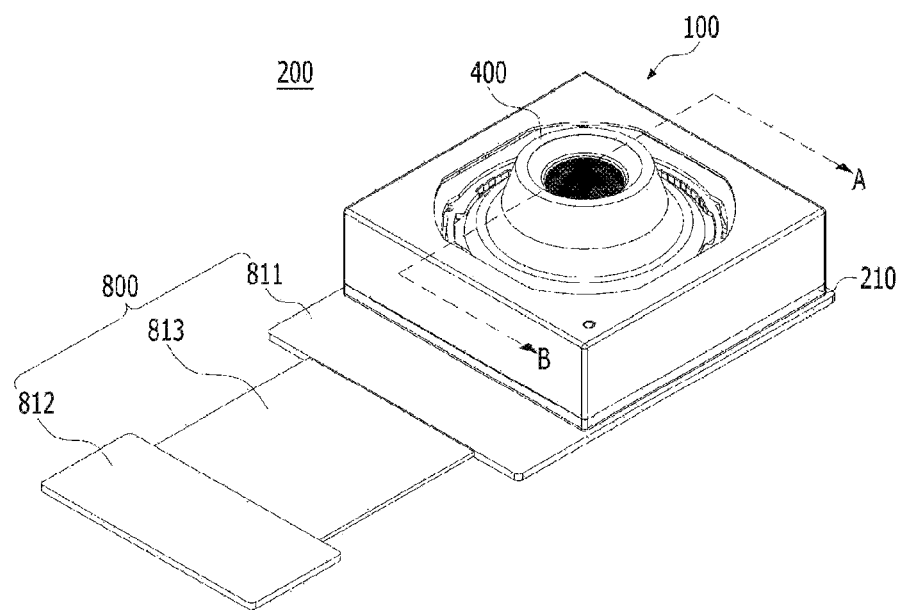
FIG. 2 is a perspective view of the camera module of FIG. 1.
Figure 3A:
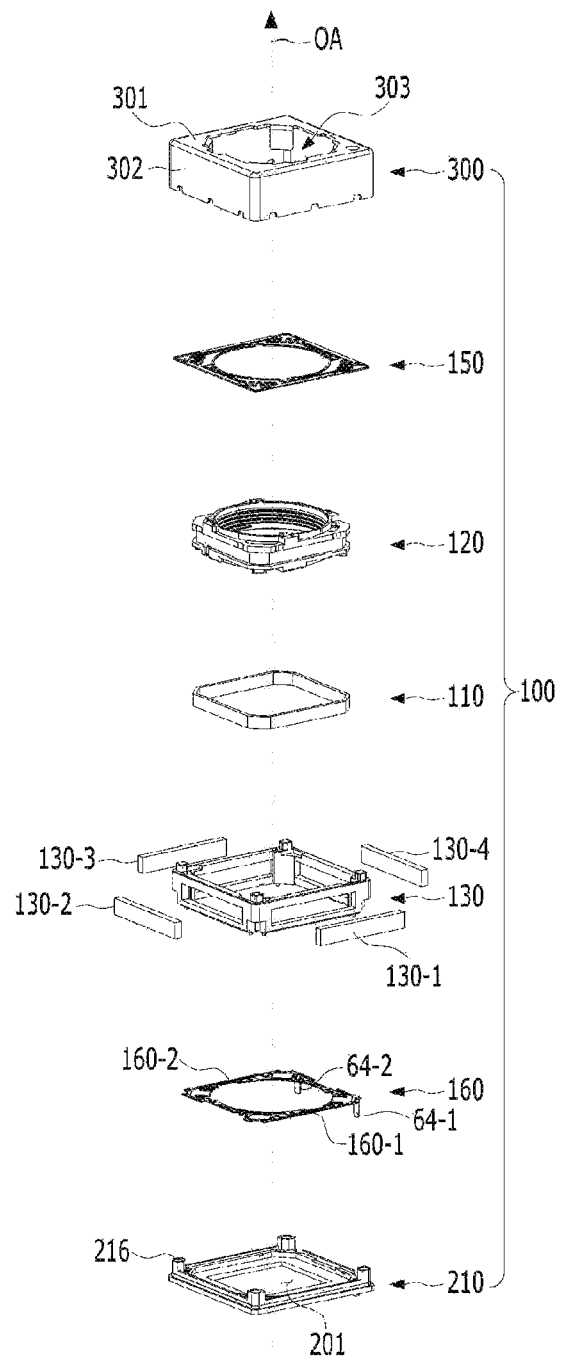
FIG. 3a is an exploded view of a lens driving device according to an embodiment.
Figure 3B:
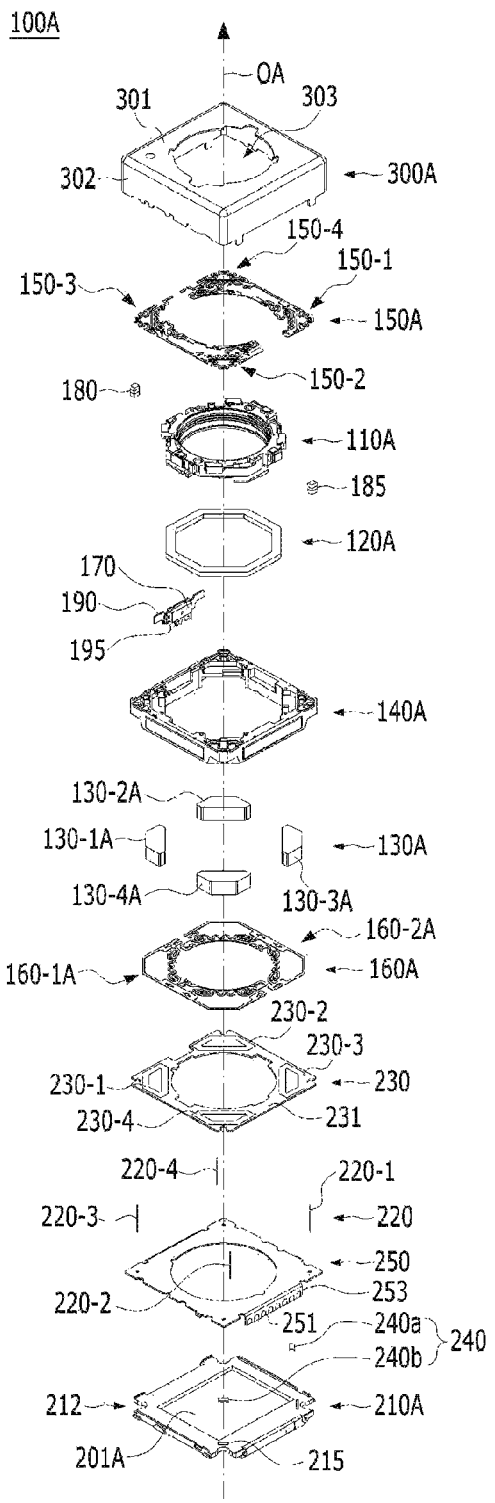
FIG. 3b is an exploded view of a lens driving device according to another embodiment.
Figure 3C:
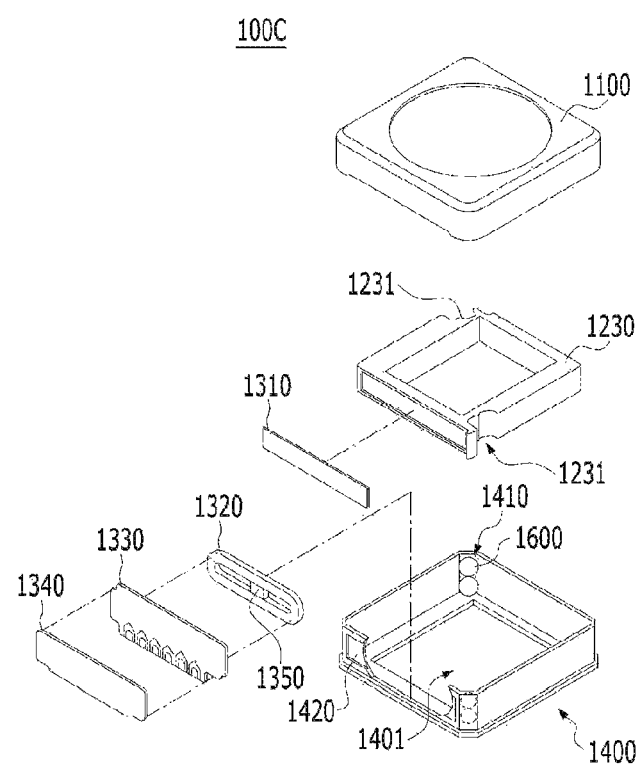
FIG. 3c is an exploded view of a lens driving device according to another embodiment.
Figure 3D:
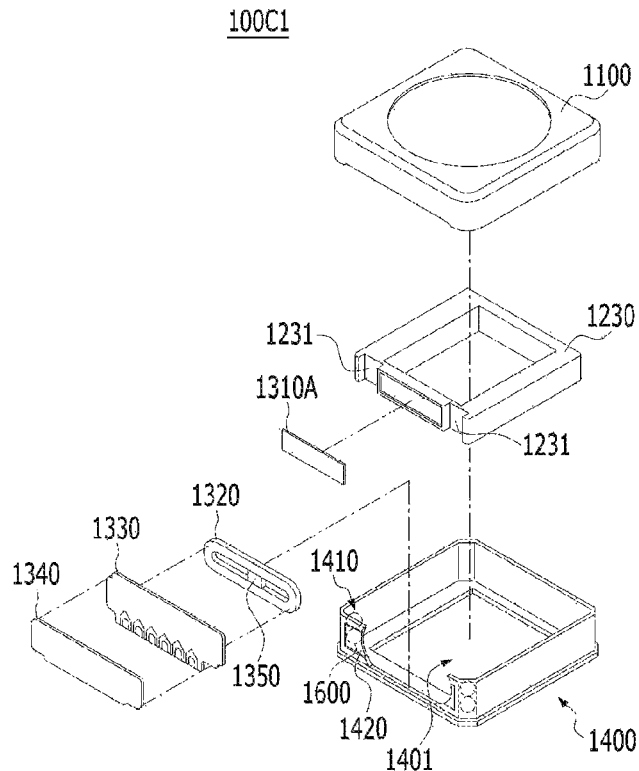
FIG. 3d is an exploded view of a lens driving device according to another embodiment.
Figure 4:
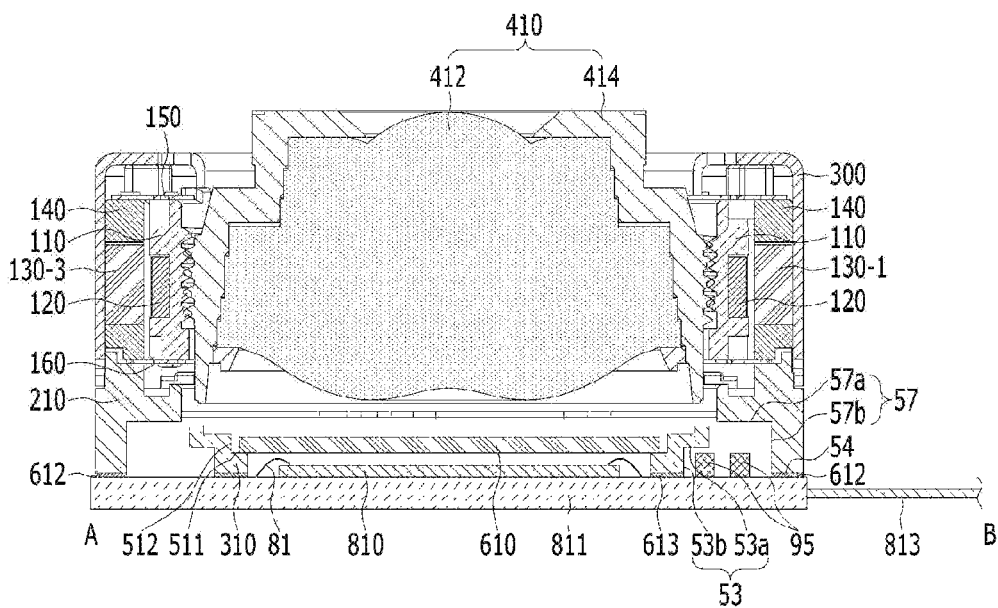
FIG. 4 is a cross-sectional view taken in the AB direction of the camera module of FIG. 2.
Figure 5:
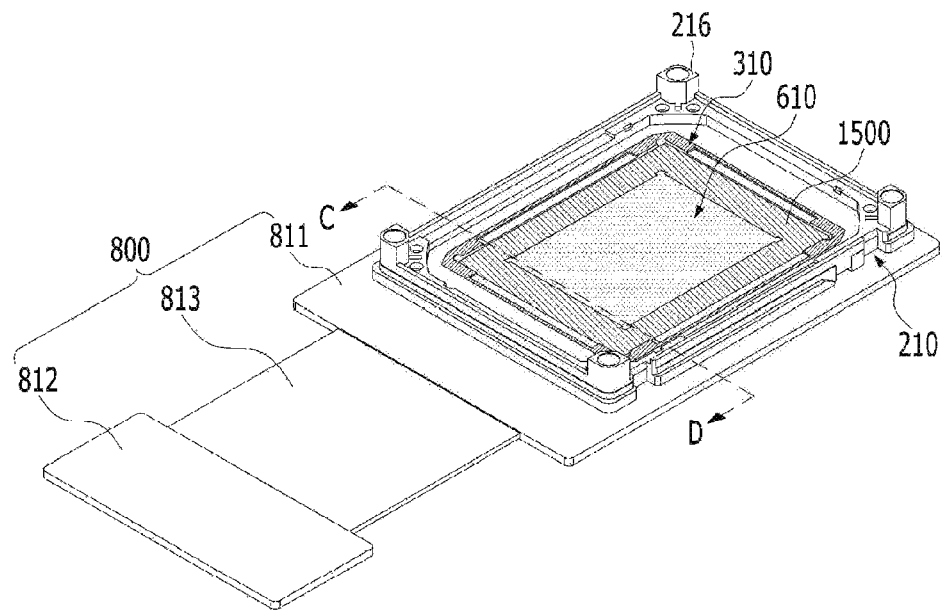
FIG. 5 is a perspective view of a base, a filter, a holder, and a circuit board of a lens driving device.
Figure 6:
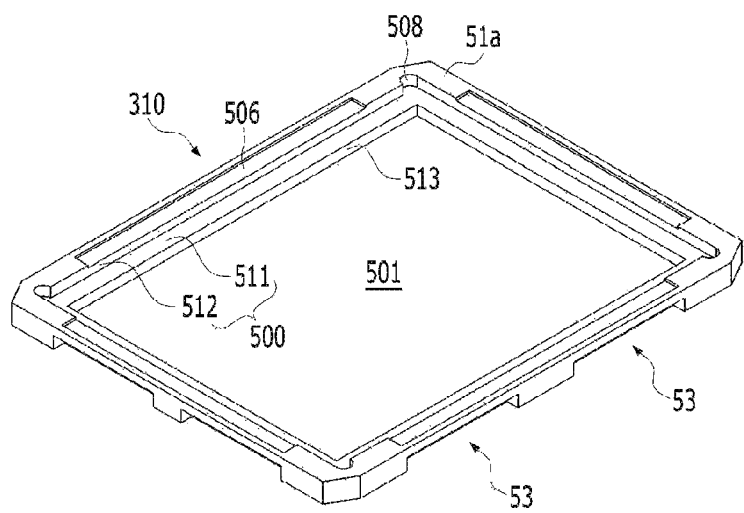
FIG. 6 is a top perspective view of a holder.
Figure 7:
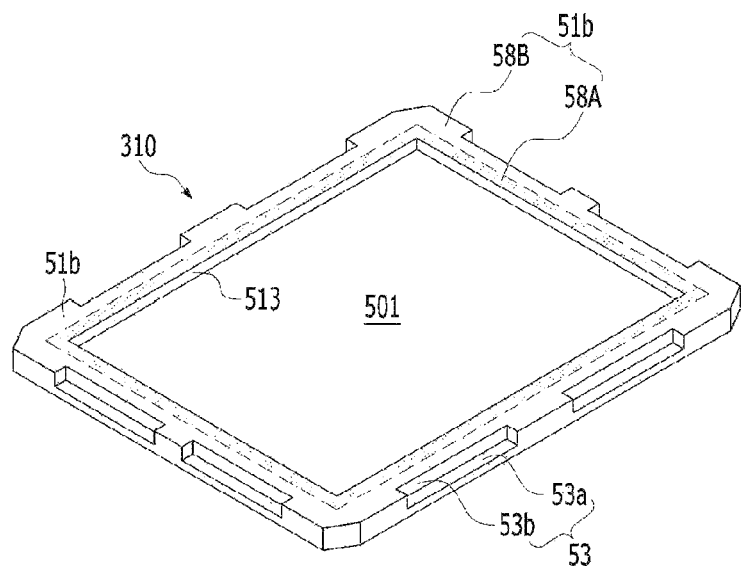
FIG. 7 is a bottom perspective view of a holder.
Figure 8A:
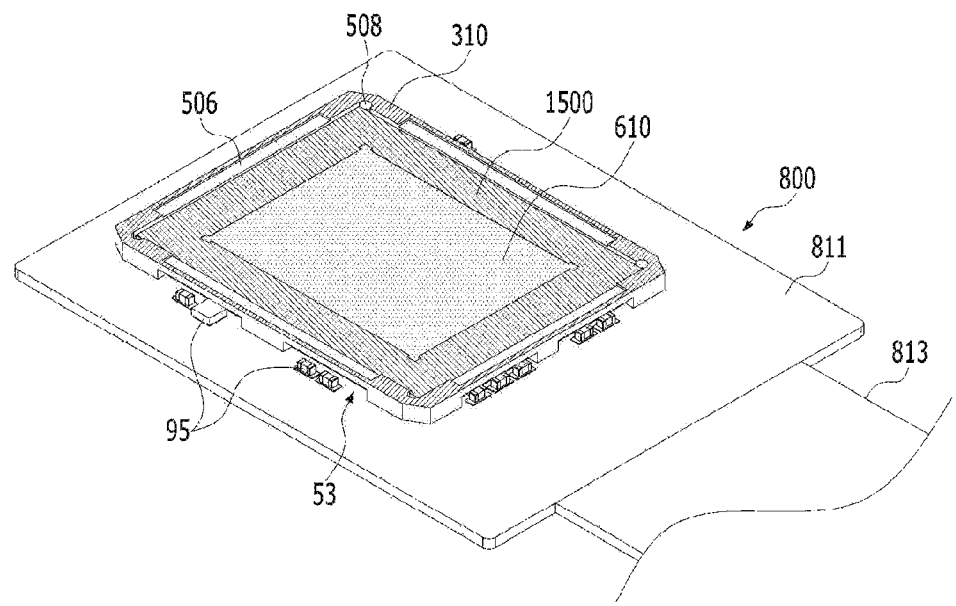
FIG. 8a is a perspective view of a circuit board, a circuit element, a holder, and a filter.
Figure 8B:
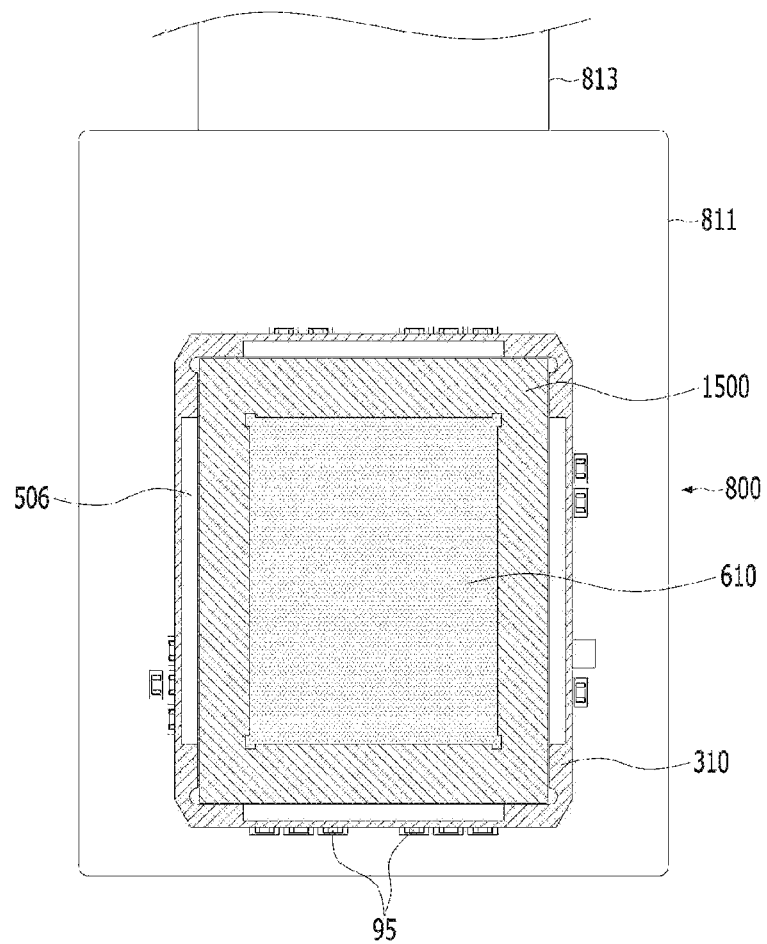

FIG. 1 is an exploded view of a camera module 200 according to a first embodiment of the present invention; FIG. 2 is a perspective view of the camera module 200 of FIG. 1; FIG. 3*a* is an exploded view of a lens driving device 100 according to an embodiment; FIG. 3*b* is an exploded view of a lens driving device 100A according to another embodiment; FIG. 3*c* is an exploded view of a lens driving device 100B according to another embodiment; FIG. 3*d* is an exploded view of a lens driving device 100B according to another embodiment; FIG. 4 is a cross-sectional view taken in the AB direction of the camera module 200 of FIG. 2; FIG. 5 is a perspective view of a base 210, a filter 510, a holder 310, and a circuit board 800 of a lens driving device 100; FIG. 6 is a top perspective view of a holder 310; FIG. 7 is a bottom perspective view of a holder 310; FIG. 8*a* is a perspective view of a circuit board 800, a circuit element 95, a holder 310, and a filter 610; and FIG. 8*b* is a plan view of the configurations of FIG. 8*a*.

Referring to FIGS. 1 to 8*b*, the camera module 200 may comprise a lens module 400, a lens driving device 100, a filter 610, a holder 600, a circuit board 800, and an image sensor 810.

Here, "camera module" may be expressed by replacing it with "image capturing device" or "photographying device", and the holder 310 may be expressed by replacing it with a housing, a base, or a "sensor base".

In addition, the lens module 400 may be expressed by replacing it with a "lens", a "lens unit", or a "lens assembly". The lens module 400 is coupled to the lens driving device 100 and may comprise at least one of a lens and a lens barrel.

In addition, the camera module 200 is disposed between the lens driving device 100 (for example, the base 210) and the circuit board 810, and an adhesive member 612 for coupling or attaching the lens driving device 100 (for example, the base 210) and the circuit board 810 may be further comprised.

In addition, the camera module 200 may further comprise an adhesive member 613 (refer to FIG. 4) being disposed between the holder 310 and the circuit board 800.

In addition, the camera module 200 may further comprise a circuit device 95 (or an electronic device) being disposed or mounted on the circuit board 800.

The lens module 400 may be positioned inside the housing 140 to face the opening 201 of the base 210 and may be moved in an optical axis direction.

For example, the lens module 400 may be mounted in the bobbin 110 of the lens driving device 100.

The lens driving device 100 may drive the lens module 400 and may move the lens module in an optical axis direction.

The camera module 200 may be either a camera module for Auto Focus (AF) or a camera module for optical image stabilizer (OIS). It may be said that the camera module for AF can perform only an autofocus function. A camera module for OIS refers to one that can perform autofocus and optical image stabilizer (OIS) functions.

The lens driving device 100 illustrated in FIG. 3*a* is a lens driving device for AF, but the embodiment is not limited thereto. In another embodiment, the lens driving device may be a lens driving device for OIS. Here, the meaning of "for AF" and "for OIS" may be the same as described in the camera module for AF and the camera module for OIS.

In addition, although the bobbin and the housing are supported by an elastic member in FIG. 3*a*, it is not limited thereto, and in another embodiment, the bobbin and the housing may be supported by a ball or a ball bearing.

Referring to FIG. 3*a*, the lens driving device 100 may comprise: a housing 140; a bobbin 110 being disposed inside the housing 140 and for mounting a lens module 400; a coil 120 being disposed on the bobbin 110; a magnet 130 being disposed in the housing 140 and facing the coil 120; at least one upper elastic member 150 being coupled to an upper portion of the bobbin 110 and an upper portion of the housing 140; at least one lower elastic member 160 being coupled to a lower portion of the bobbin 110 and a lower portion of the housing 140; and a base 210.

In another embodiment, the coil may be disposed in the housing, and the magnet may be disposed in the bobbin.

In addition, the lens driving device 100 may further comprise a cover member 300 being coupled to the base 210 and for providing a space for accommodating the components of the lens driving device 100 together with the base 210. The cover member 300 may comprise an upper plate 301, a side plate 302 being connected to the upper plate 301, and an opening 303 being formed in the upper plate 301.

The base 210 is disposed below the bobbin 110 (or the housing 140). For example, the base 210 may be disposed below the lower elastic member 160.

The housing 140 may be disposed on the base 210. For example, the base 210 may be coupled to the housing 140. In another embodiment, the base 210 and the housing 140 may be integrally configured, and this configuration may be defined as a "base", or a "housing".

The base 210 may have an opening 201 corresponding to an opening of the bobbin 110, or/and an opening of the housing 140, and it may have a shape that matches or corresponds to the cover member 300, for example, a rectangular shape. For example, the opening 201 of the base 210 may be in the form of a through hole penetrating the base 210 in an optical axis direction.

On the upper surface of the base 210, a pillar part (or protruded part, 216 being protruded toward the housing 140 may be formed.

For example, the base 210 may comprise a pillar part 216 protruded a predetermined height upward from each corner or corner portions. For example, the base 210 may comprise four pillar parts being disposed at four corners. In another embodiment, the pillar part 216 may be omitted.

The pillar part of the base 210 may be inserted, fastened, or coupled to a groove formed at a lower portion of the corner of the housing 140 by an adhesive member such as epoxy or silicone.

For example, the coil 120 may be connected to at least one of the upper elastic member 150 and the lower elastic member 160. For example, the lower elastic member 160 may comprise two lower elastic members 160-1 and 160-2. For example, lower springs, and the coil 120 may be connected to the two lower elastic members 160-1 and 160-2.

The upper elastic member 150 may comprise; a first inner side frame (or first inner side portion) being coupled with the bobbin 110; a first outer frame (or first outer side portion) being coupled with the housing 140; and a first connecting portion connecting the first inner side frame and the first outer side frame.

In addition, the lower elastic member 160-1 and 160-2 may comprise: a second inner side frame (or second inner side portion) being coupled to the bobbin 110; a second outer side frame (or second outer side portion) being coupled to the housing 140; and a second connecting portion connecting the second inner side frame and the second outer side frame.

For example, one end of the coil 120 may be connected to the second inner side frame of the first lower elastic member 160-1, and the other end of the coil 120 may be connected to the second inner side frame of the second lower elastic member 160-2.

The first lower elastic member 160-1 may comprise a first terminal 64-1, and the second lower elastic member 160-2 may comprise a second terminal 64-2. A driving signal of the coil 120 may be inputted from the outside through the first and second terminals 64-1 and 64-2 of the first and second lower elastic members 160-1 and 160-2.

For example, the first terminal 64-1 can be bent from the second outer side frame 162 of the first lower elastic member 160-1 toward the outer side surface (or "first outer side surface") of the base 210.

The second terminal 64-2 can be bent from the second outer side frame 162 of the second lower elastic member 160-2 toward the outer side surface (or "first outer side surface") of the base 210.

At least a portion of each of the first and second terminals 64-1 and 64-2 may be disposed on an outer side surface of the holder 310 and may be electrically connected to the circuit board 800.

The circuit board 800 may provide a driving signal to the coil 120 through the first and second terminals 64-1 and 64-2 of the first and second lower elastic members 160-1 and 160-2, and it may comprise pads (or terminals) being electrically connected to the first and second terminals 64-1 and 64-2 through solder or the like.

In another embodiment, the terminal may not be integrally formed with the lower elastic members 160-1 and 160-2, may be separately disposed on the base 210, and the terminal and the outer side frames of the lower elastic members 160-1 and 160-2 may be coupled to each other by a solder or the like, and may be electrically connected to each other as well.

The coil 120 may be disposed on the outer side surface of the bobbin 110. For example, the coil 120 may be wound on the outer side surface of the bobbin 110 in a ring shape, but is not limited thereto. A driving signal may be provided to the coil 120. The driving signal may be in the form of a current or voltage, and may comprise at least one of a direct current signal or an alternating current signal.

The magnet 130 may be disposed at the side portion of the housing 140. In other embodiments, the magnet may be placed at a corner or corner portion of the housing.

The magnet 130 may comprise a plurality of magnets 130-1 to 130-4, and the magnet 130 disposed in the housing 140 may correspond to, face, or be overlapped with the coil 120 in a direction perpendicular to the optical axis OA.

The moving part may be moved in the optical axis direction by the interaction between the magnet 130 and the coil 120 to which the driving signal is provided. By controlling the displacement of the bobbin 110 in the optical axis direction by the driving signal provided to the coil 120, AF driving may be implemented.

The moving part may comprise a bobbin 110 and a configuration coupled thereto. For example, the moving part may comprise a bobbin 110 and a coil 120. In addition, for example, the moving part may further comprise the lens module 400.

In addition, for the AF feedback driving, the lens driving device 100 of the camera module 200 may further comprise: a sensing magnet (not shown) being disposed in the bobbin; a housing; a base; or an AF position sensor (for example, Hall sensor, not shown) being disposed in the cover member and corresponding to, opposite to, or being overlapped with the sensing magnet.

In addition, the lens driving device 100 may further comprise a circuit board for AF being disposed in the housing 140 and on which the AF position sensor is mounted. At this time, the circuit board may be electrically connected to the coil 120 and the AF position sensor, and a driving signal may be provided to each of the coil 120 and the AF position sensor through the circuit board.

When the AF position sensor is implemented as a hall sensor alone, a driving signal is provided from the outside to the circuit board, and a driving signal may be provided to the coil 120 through the circuit board and the two elastic members 160-1 and 160-2 connected to the circuit board.

When the AF position sensor is a driver IC comprising a Hall sensor, a driving signal is provided from the AF position sensor to the circuit board, and a driving signal may be provided to the coil 120 through the two elastic members 160-1 and 160-2 connected to the circuit board.

The AF position sensor may output an output signal according to the result of detecting the strength of the magnetic field of the sensing magnet according to the movement of the bobbin 100, and the output of the AF position sensor may be transmitted to the circuit board, and may be outputted to the outside through the circuit board.

In another embodiment, the AF position sensor may be disposed in the bobbin, and the sensing magnet may be disposed in the housing. In addition, the lens driving device 100 may further comprise a balancing magnet being disposed in the bobbin 110 and being disposed at an opposite side of the sensing magnet.

A camera module according to another embodiment may comprise a housing being coupled to the lens module 400 and fixing the lens module 400 instead of the lens driving device 100 of FIG. 1, and the housing may be coupled or attached to the upper surface of the circuit board 800.

The housing being attached or fixed to an upper surface of the circuit board 800 will not be moved, and the location of the housing in a state being attached to the circuit board 800, and the lens module being coupled to the housing may be fixed.

The lens driving device 100A illustrated in FIG. 3b may be a lens driving device for OIS.

Referring to FIG. 3b, the lens driving device 100A may comprise: a housing 140A; a bobbin 110A being disposed in the housing 140 and for mounting the lens module 400; a first coil 120A being disposed in the bobbin 110A; a magnet 130A being disposed in the housing 140A and facing the first coil 120; at least one upper elastic member 150A being coupled to an upper portion of the bobbin 110A and an upper portion of the housing 140A; at least one lower elastic member 160A being coupled to a lower portion of the bobbin 110A and a lower portion of the housing 140A; a second coil 230 being disposed below the housing 140A and/or the lower elastic member 160A; a circuit board 250 being disposed below the second coil 230; and a base 210 being disposed below circuit board 250.

The lens driving device 100A may further comprise a support member 220 connecting the upper elastic member 150A and the circuit board 250.

The lens driving device 100A may further comprise a sensing magnet 180 being disposed on the bobbin 110A and a first position sensor 170 being disposed in the housing 140. In addition, the lens driving device 100A may further comprise a balancing magnet 185 being disposed in the bobbin 110A.

Descriptions of the bobbin 110, the coil 120, the magnet 130, the housing 140, the AF position sensor, the sensing magnet, and the balancing magnet of FIG. 3a may be applied to the embodiment of FIG. 3b.

The lens driving device 100A may further comprise a circuit board 190 being disposed on the housing 140, and the circuit board 190 may be disposed on either side portions of the housing 140A.

The first position sensor 170 may be disposed in the circuit board 190 and may be electrically connected to the circuit board 190. In addition, the description of the AF position sensor and circuit board of FIG. 3a may be applied to the embodiment of FIG. 3b.

In addition, the lens driving device may further comprise a capacitor 195 being disposed in the circuit board 190. The capacitor 195 be connected in parallel to two terminals of the circuit board 190 electrically connected to two input terminals of the first position sensor 170 for providing power or a driving signal, or two input terminals of the first position sensor 170. The capacitor 195 may protect the first position sensor 170 from noise or ESD and the like of a high-frequency component being introduced from the outside.

The upper elastic member 150A may comprise a plurality of upper elastic members 150-1 to 150-4. The plurality of elastic members may be electrically connected to the circuit board 190. For example, the four upper elastic members 150-1 to 150-4 may be coupled to and electrically connected to a corresponding one of the first to fourth terminals of the circuit board 190.

The first position sensor 170 may be implemented as a Hall sensor alone or in the form of a driver IC comprising a Hall sensor.

The first position sensor 170 may comprise four terminals, and the four terminals of the first position sensor may be electrically connected to first to fourth terminals of the circuit board 190.

The magnet 130A may comprise a plurality of magnets 130-1A to 130-4A being disposed at the corners of the housing 140A, but is not limited thereto, and in another embodiment, a magnet as shown in FIG. 3a may be disposed at a side portion of the housing 140A.

The support member 220 may comprise a plurality of support members 220-1 to 220-4.

The support members 220-1 to 220-4 may be disposed at corner portions or corners of the housing 140A. A groove or hole for avoiding spatial interference with the support member 220 may be formed at a corner of the housing 140, and the support member 200 may pass through the groove or hole.

One end of each of the plurality of support members 220-1 to 220-4 may be coupled to a corresponding one of the plurality of upper elastic members 150-1 to 150-4, and may be electrically connected.

In addition, one end of each of the plurality of support members 220-1 to 220-4 may be coupled to the circuit board 250 or the circuit member 231 and may be electrically connected to each other.

The circuit board 190 may be electrically connected to the circuit board 250 by the plurality of upper elastic members 150-1 to 150-4 and the support members 220-1 to 220-4, and accordingly, the first position sensor 170 may be electrically connected to the circuit board 250.

The lower elastic member 160 may comprise two lower elastic member 160-1A and 160-2A, and may be electrically connected to the first coil 120A. The first coil 120A may be electrically connected to the circuit board 250 or the first position sensor 170.

A driving signal may be supplied or transmitted from the first position sensor 170 or the circuit board 250 to the first coil 120.

The second coil 230 may be disposed below the bobbin 110A and/or the housing 140A. For example, the second coil 230 may be disposed below the magnet 130A.

The second coil 230 may comprise the magnets 130-1A to 130-4A being disposed in the housing 140A and the coil units 230-1 to 230-4 facing in an optical-axis direction or being overlapped in an optical-axis direction.

For example, the second coil 230 may comprise a circuit member 231 being disposed in the circuit board 250 and a plurality of coil units 230-1 to 230-4 being formed in the circuit member 231. Here, the circuit member 231 may be expressed as a "board", "circuit board", or "coil board". In another embodiment, the second coil 230 may comprise the circuit member 231 and coil units 230-1 to 230-4.

The second coil 230 may be electrically connected to the circuit board 250 and receive power or a driving signal from the circuit board 250.

By the interaction between the magnets 130-1A to 130-4A and the second coils 230-1 to 230-4 provided with the driving signal, the housing 140A may move in a second and/or a third direction, for example, in the X-axis and/or Y-axis direction, whereby hand tremble correction may be performed.

The circuit board 250 is disposed on an upper surface of the base 210A and may be provided with an opening corresponding to the opening of the bobbin 110A, the opening of the housing 140A, and/or the opening 201A of the base 210. The opening of the circuit board 250 may be a through hole or a hollow.

The circuit board 250 may comprise: a body being disposed on an upper surface of the base 210A and having an opening; and at least one terminal surface 253 being bent from the body toward an outer side surface of the base 210A. A plurality of terminals 251 for receiving electrical signals from the outside or transmitting electrical signals to the outside may be formed on the terminal surface 253 of the circuit board 250.

The plurality of terminals 251 of the circuit board 250 may be electrically connected to at least one among the first coil 120, the first position sensor 170, the circuit board 190, the second position sensor 240, and the second coil 230.

Base 210A may comprise opening 201A. The description of the base 210 of the embodiment of FIG. 3a may be applied to FIG. 3b. In another embodiment, the base 210A and the housing 140A may be integrally configured, and this configuration may be defined as a "base" or "housing".

In order to avoid spatial interference with the support member 220, a groove, a concave groove, or a hole-shaped escape 212 may be formed at a corner of the base 210A.

The lens driving apparatus 100A may further comprise a second position sensor 240 being electrically connected to the circuit board 250.

The second position sensor 240 may comprise two sensors 240a and 240b and may be electrically connected to the circuit board 250. Each of the two sensors 240a and 240b may be implemented as a position detection sensor alone such as a Hall sensor, or as a driver comprising a Hall sensor. The base 210A may have a groove 215 for accommodating the sensors 240a and 240b.

Each of the sensors 240a and 240b detects the strength of the magnetic field of the magnets 130-1A to 130-4A as the housing 140 moves in a direction perpendicular to the optical axis, and may output an output signal according to the detected result. A displacement in a direction perpendicular to the optical axis of the housing 140A may be detected using the output signal of each of the sensors 240a and 240b, and the control units 830 and 780 may perform OIS feedback hand tremble correction using the output signals of the sensors 240a and 240b.

The lens driving device 100B illustrated in FIG. 3c may be a ball-type lens driving device.

Referring to FIG. 3c, the lens driving device 100B may comprise: a housing 1400; a bobbin 1230 being disposed inside the housing 1400 and for being coupled to the lens module 400; a coil 1320 being disposed in the housing 1400 and a magnet 1310 being disposed in the bobbin 1230; a ball 1600 being disposed between the housing 1400 and the bobbin 1230; and a yoke 1340 being disposed in the housing 1400. The ball 1600 may be replaced with a "ball member" or a "ball bearing".

The lens driving device 100B may further comprise a cover member 1100 being coupled to the housing 1400 to cover the outer side surface of the housing 1400.

The lens driving device 100B may further comprise a position sensor 1350 being disposed in the housing 1400. In addition, the lens driving device 100B may further comprise a circuit board 1330 being disposed in the housing 1400, the position sensor 1350 may be mounted in the circuit board 1330, and may be electrically connected to the circuit board 1330. The description of the position sensor of FIGS. 3a and 3b may be applied to the position sensor 1350 of FIG. 3c.

The bobbin 1230 may have an opening for coupling with the lens module, and the opening of the bobbin 1230 may be in the form of a through hole penetrating the bobbin in the optical axis direction.

The magnet 1310 may be disposed on an outer side surface of the bobbin 1230. For example, a groove for disposing the magnet 1310 may be formed on the outer side surface of the bobbin 1230.

The coil 1320 may be disposed on one side portion 1420 of the housing 1400 to face the magnet 1310. For example, a groove for disposing the magnet 1310 may be formed in one side portion of the housing 1400.

In another embodiment, the magnet may be disposed in the housing and the coil may be disposed in the bobbin.

The housing 1400 may comprise an opening 1401 corresponding to the lens module 400, and the opening 1401 of the housing 140 may be in the form of a through hole penetrating the housing 1400 in the optical axis direction.

The coil 1320 may be electrically connected to the circuit board 1330.

The ball 1600 may support the relative movement of the bobbin 1230 against the housing 1400. At least a portion of the ball 1600 may be in contact with at least a portion of the housing 1400 and at least a portion of the bobbin 1230, and may reduce the friction between the housing 1400 and the bobbin 1230.

The yoke 1340 may be disposed at one side portion of the housing 1400 and may face the magnet 1310 in a direction perpendicular to the optical axis. For example, the yoke 1340 may be disposed at an outer side of the circuit board 1330, and the coil 1320 may be disposed between the yoke 1340 and the magnet 1310.

The yoke 1340 may be a material capable of generating an attractive force between the magnet 1310, for example, a magnet or a metal, and accordingly, an attractive force may act between the yoke 1340 and the magnet 1310 in a direction perpendicular to the optical axis direction. By this attractive force, the ball 1600 may maintain the contact state with the bobbin 1230 and the housing 1400.

For example, a first accommodating groove 1410 for accommodating at least a portion of the ball 1600 or in which at least a portion of the ball 1600 is disposed may be formed in the housing 1400.

In addition, for example, a second accommodating groove 1231 for accommodating at least another portion of the ball 1600 or in which at least another portion of the ball 1600 is disposed may be formed in the bobbin 1230.

For example, the first accommodating groove 1410 may be formed at an inner side or at an inner surface of at least one corner of the housing 1400, and the second accommodating groove 1231 may be formed at an outer side or at an outer surface of at least one corner of the bobbin 1230. The first accommodating groove 1410 and the second accommodating groove 1231 may face or oppose to each other, the ball 1600 may be disposed between the first accommodating groove 1410 and the second accommodating groove 1231, and the first accommodating groove 1410 and the second accommodating groove 1231 may be in contact with each other.

The number of balls 1600 being disposed between the first accommodating groove 1410 and the second accommodating groove 1231 may be one or more.

For example, in FIG. 3*c*, a first accommodating groove may be formed in each of two corners facing or opposite to each other of the housing 1400, and a second accommodating groove may be formed in each of the two corners of the bobbin 1230 corresponding to the two corners of the housing 140.

In another embodiment, a first accommodating groove may be formed in each of the four corners of the housing 1400, and a second accommodating groove may be formed in each of the four corners of the bobbin 1230 corresponding to the four corners of the housing 140.

In another embodiment, a first accommodating groove may be formed in each of the two corners of the housing 1400 adjacent to the side portion 1420 of the housing 1400 in which the coil 1320 and/or the circuit board 1330 are disposed.

In addition, a second accommodating groove may be formed in each of the two corners of the bobbin 1230 corresponding to the two corners of the two housings 1400 adjacent to the side portion 1420 of the housing 1400.

In another embodiment, a first accommodating groove may be formed in each of two corners adjacent to a side portion positioned at an opposite side of the side portion 1420 of the housing 1400. A second accommodating groove may be formed in each of two corners of the bobbin 1230 corresponding to two corners adjacent to a side portion positioned at an opposite side of the side portion 1420 of the housing 1400.

As illustrated in FIG. 3*c*, the housing 1400 may be implemented as a single body, but is not limited thereto.

In another embodiment, the housing 1400 may comprise a housing and a base being coupled to the housing, as shown in FIGS. 3*a* and 3*b*. At this time, the base may have an opening that is the same as or similar to the opening 1401 of the housing 1400.

Hereinafter, the base 210 of the lens driving device 100 will be described as an example for convenience of description, but is not limited thereto. The following description may be applied or analogously applied to the base 210A of the lens driving device 100A and the housing 1400 of the lens driving device 100B.

FIG. 3*d* may be a modified embodiment 100C1 of FIG. 3*c*.

In FIG. 3*d*, the ball 1600 may be disposed between: two corners adjacent to the side portion 1420 of the housing 1400 on which the coil 1320 and/or the circuit board 1330 are disposed; and an outer side surface of the bobbin 1230 corresponding thereto.

For example, in FIG. 3*d*, a first accommodating groove 1410 may be formed in each of the two corners of the housing 1400 adjacent the side portion 1420 of the housing 1400 in which the coil 1320 and/or the circuit board 1330 are disposed, and the second accommodating groove 1231 may be formed at corners of the bobbin 1230 corresponding to two corners of the housing 1400.

The magnet 1310A may be disposed between the balls 1600 being accommodated in the second accommodating groove 1231 formed at two corners of the bobbin 1230. For example, the magnet 1310A may be disposed between two second accommodating grooves 1231 formed at two corners of the bobbin 1230.

The holder 310 may be disposed on an upper surface of the circuit board 800. The holder 310 may be disposed at an inner side of the base 210. The holder 310 may be expressed by replacing it with "base", "inner base", or "sensor base".

For example, the holder 310 may be disposed at an inner side of the openings 201 and 201A of the bases 210 and 210A of the lens driving device 100 or the openings 1401 of the housing 1400.

For example, the holder 310 may be disposed below the lens module 400.

Referring to FIGS. 5 to 8*b*, the holder 310 may comprise an opening 501 corresponding to the image sensor 810.

For example, the opening 501 of the holder 310 may be located below the opening 201 of the base 210, and may face the opening 201 of the base 210 and/or the lens module 400 in an optical axis direction.

The opening 501 of the holder 310 may penetrate through the holder 310 in an optical axis direction, and may be expressed by replacing it with a "hole", "hollow" or "through hole".

For example, the opening 501 may penetrate through the center of the holder 310, and may be disposed to correspond to or face an active area of the image sensor 810 (for example, the image sensor 810).

The holder 310 is recessed from the upper surface and may comprise a seating part 500 for the filter 610 to be seated, and the filter 610 may be disposed inside the seating part 500.

The opening 501 of the holder 310 may correspond to or oppose the openings of the bases 201 and 201A, or the openings 1401 of the housing 1400. For example, the size or area of the opening 501 of the holder 310 may be smaller than the size or area of the openings of the bases 201 and 201A or the openings 1401 of the housing 1400.

The adhesive member 612 may be disposed between the upper surface of the circuit board 800 and the bases 210 and 210A or the housing 1400 of the lens driving devices 100, 100A, and 100B.

For example, the adhesive member 612 may be disposed between the upper surface of the circuit board 800 and the lower surfaces of the bases 210 and 210A of the lens drive devices 100, 100A, and 100B or the lower surface of the housing 1400. The bases 210 and 210A or the housing 1400 may be coupled or attached to an upper surface of the circuit board 800.

For example, the bases 210 and 210A or the housing 1400 may be supported by the upper surface of the circuit board 800. For example, the lower portions of the bases 210 and 210A or the housing 1400 may be coupled to the upper surface of the circuit board 400.

The seating part 500 may be in the form of a recess, cavity, or hole recessed from the upper surface 51*a* of the holder 310, but is not limited thereto.

The seating part 500 of the holder 310 may comprise a bottom surface 511 and an inner side surface 512, and the edge portion of the filter 610 may be disposed on the bottom surface 511 of the seating part 500 of the holder 310.

The bottom surface 511 may have a step difference from the upper surface 51*a* of the holder 310 in the optical axis direction. For example, the step difference or distance between the upper surface 51*a* and the bottom surface 511 of the holder 310 may be less than or equal to the thickness of the filter 610 (or the length of the filter 610 in the optical axis direction). In another embodiment, the step difference or distance between the upper surface 51*a* and the bottom surface 511 of the holder 310 may be greater than the thickness of the filter 610.

For example, the bottom surface 511 may be located below the upper surface 51a of the holder 310.

For example, among the bottom surface 511 and the upper surface 51a of the holder 310, the bottom surface 511 may be located closer to the lower surface 51b of the holder 312.

For example, the inner side surface 512 may connect the upper surface 51a and the bottom surface 511 of the seating part 500. The inner angle between the inner side surface 512 and the bottom surface 511 may be a right angle, but is not limited thereto, and in another embodiment, the inner angle may be an obtuse angle or an acute angle. For example, the inner side surface 512 may have a chamfer shape.

For example, the opening 501 may be formed in the bottom surface 511 of the seating part 500, and may be disposed spaced apart from the inner side surface 512 of the seating part 500.

The area of the opening 501 of the filter 610 may be smaller than the area of the filter 610 according to the horizontal length and the vertical length of the filter 610 so that it can be disposed on the bottom surface 511 of the seating part 500 of the holder 310.

For example, the edge portion of the lower surface of the filter 610 may face the bottom surface 511 of the seating part 500, and may be coupled or attached to the bottom surface 511 by an adhesive or the like.

For example, the inner side surface 512 of the seating part 500 of the holder 310 may face or opposed to the side surface of the filter 610.

For example, the inner side surface 512 of the seating part 500 may comprise four inner side surfaces, but is not limited thereto, and in another embodiment, the inner side surface 512 of the seating part may have three or more.

The holder 310 may comprise a foreign matters collecting part 506 in the form of a groove being recessed from the upper surface 51a. The foreign matters collecting part 506 may be disposed adjacent to the seating part 500 or the filter 610, but is not limited thereto.

For example, the foreign matters collecting part 506 may have an opening that is opened toward the inner side surface 512 of the seating part 500, but is not limited thereto. In another embodiment, the foreign matters collecting part may also be in the form of a groove that does not comprise an opening.

For example, the foreign matters collecting part 506 may be located between the seating part 500 and the outer side surface of the holder 310.

The foreign matters collecting part 506 may collect foreign matters being introduced from the lens driving device 100. The foreign matters collecting part 506 may be expressed by replacing it with a dust trapper. In FIG. 6, the holder 310 may comprise four foreign matter collecting parts being formed adjacent to the four inner side surfaces of the seating part 500, but is not limited thereto, and in another embodiment, there may be one or two or more.

The foreign matters collecting part 506 may be in the shape of a groove and may comprise a bottom surface and a side surface.

The bottom surface of the foreign matters collecting part 506 may have a step difference with the upper surface 51a of the holder 310 in an optical axis direction.

For example, the step difference (for example, "the first step difference or the first height difference") between the upper surface 51a of the holder 310 and the bottom surface of the foreign matters collecting part 506 may be smaller than the step difference (for example, "second step difference or second height difference") between the upper surface 51a of the holder 310 and the bottom surface 511 of the seating part 500. In another embodiment, the first step difference and the second step difference may be equal to each other.

In addition, the holder 310 may comprise a recessed part 508 being disposed in a corner region of the inner side surface 512 of the seating part 500. The recessed part 508 may have a structure being recessed from the center of the opening 501 of the seating part 500 in a direction toward the corner area (or corner) of the inner side surface 512 of the seating part 500.

For example, the shape of the recessed part 508 viewed from above may be a semicircle, a fan shape, a polygon (for example, a square), or a circle, but is not limited thereto.

The recessed part 508 may prevent an adhesive such as UV epoxy for attaching the filter 610 to the seating part 500 from overflowing out of the seating part 500.

The filter 610 may be disposed inside the seating part 500. The filter 610 may have a plate shape or a flat rectangular shape, but is not limited thereto.

The shape of the opening 501 of the holder 310 may match the shape of the filter 610 or the shape of the image sensor (for example, the shape of the active region of the image sensor).

For example, the shape of the opening 501 of the holder 310 as viewed from above may be a polygonal (for example, quadrangular) shape, but is not limited thereto, and may be a circle or an oval in another embodiment.

Light passing through the lens module 400 may pass through the filter 610 to be incident on the image sensor 810.

The filter 610 may serve to block light having a specific frequency band in the light passing through the lens module 400 from being incident on the image sensor 810. For example, the filter 610 may be an infrared cut filter, but is not limited thereto, and in another embodiment, the filter may be an infrared pass filter. For example, the filter 610 may be disposed to be parallel to an x-y plane perpendicular to the optical axis OA.

For example, the filter 610 may be a glass filter.

An adhesive may be disposed between the filter 610 and the holder 310, and the adhesive may couple the filter 610 and the holder 310. For example, the adhesive may be an epoxy, a thermosetting adhesive (for example, thermosetting epoxy), or an ultraviolet curable adhesive (for example, ultraviolet curable epoxy), or the like.

For example, the filter 610 may be attached to the bottom surface 511 of the seating part 500 of the holder 310 by an adhesive (not shown).

The camera module 200 may further comprise a blocking member 1500 being disposed on the filter 610. The blocking member 1500 may be disposed on an upper surface of the filter 610. The blocking member 1500 may be expressed by replacing it with a "masking unit".

For example, the blocking member 1500 may be disposed in the edge region of the upper surface of the filter 610, and may serve to block at least a portion of light passing through the lens module 400 and incident toward the edge region of the filter 610 from passing through the filter 610. For example, the blocking member 1500 may be coupled or attached to an upper surface of the filter 1610 by an adhesive.

For example, the filter 610 may have a quadrangle when viewed from above, and the blocking member 1500 may be formed symmetrically with respect to the filter 610 along each side of the upper surface of the filter 610. For example, the blocking member 1500 may be formed to have a constant width at each side of the upper surface of the filter 1610. For example, the blocking member 1500 may be formed of an opaque material. For example, the blocking member may be provided in the form of an opaque adhesive material applied to the filter 610 or in the form of a film attached to the filter 610.

The filter 610 and the active region of the image sensor 810 may be disposed to face or to be overlapped with each other in an optical axis direction. For example, the blocking member 1500 may not be overlapped with the active area of the image sensor 810 in an optical axis direction. In addition, for example, the blocking member 1500 may be at least partially overlapped with the terminal and/or the wire 81 of the circuit board 800 in an optical axis direction.

Since the blocking member 1500 is disposed to be overlapped with at least a portion with the terminal and/or the wire 81 of the circuit board 800 in an optical axis direction, it is possible to prevent the occurrence of a flare phenomenon by blocking the light directed to the terminal of the circuit board 800, or/and the wire 81 among the light passing through the lens module 400, and accordingly, it is possible to prevent the image being formed on the image sensor 810 from being distorted or from deterioration of image quality.

For example, the blocking member 1500 may be overlapped with the bottom surface 511 of the holder 310 in an optical axis direction.

The circuit board 800 may be a printed circuit board (PCB). The circuit board 800 may be a printed circuit board 3010 according to a third embodiment of the present invention.

The circuit board 800 is disposed at a lower portion of the holder 310 and the base 210 of the lens driving device 100.

The circuit board 800 may comprise a first board 811, a second board 812 being connected to the first substrate 811, and a third board 813 being connected to the second board 812.

For example, the first board 811 and the third board 192 may be a rigid printed circuit board, and the second board 812 may be a flexible printed circuit board electrically connecting the first board 811 and the third board 813, but is not limited thereto, and in another embodiment, at least one of the first to third boards may be a rigid printed circuit board or a flexible circuit board. In another embodiment, the first to third boards may be one board implemented integrally.

The circuit board 800 may comprise a connector (not shown) being formed in the third board 813 to be electrically connected to an external device.

The image sensor 810 and the circuit element 95 may be disposed in the circuit board 800.

For example, the image sensor 810 and the circuit element 95 may be disposed or coupled to an upper surface of the circuit board 800.

For example, the circuit element 85 may be disposed or mounted in the first board 811.

In addition, the circuit board 800 may comprise at least one terminal being disposed or formed in the first board 811. For example, the number of terminals of the circuit board 800 may be plural, and the plurality of terminals of the circuit board 800 may be electrically connected to the image sensor 810 and the circuit element 95.

For example, a holder 310, an image sensor 810, and a circuit element 95 may be disposed on the first board 811.

The image sensor 810 may be mounted on the circuit board 800 and may be electrically connected to the circuit board 800. The image sensor 810 may be electrically connected to the circuit board 800 by the wire 81. For example, one end of the wire 81 may be coupled to a terminal formed on an upper surface of the image sensor 810, and the other end of the wire 81 may be coupled to a terminal formed on an upper surface of the circuit board 800.

For example, the image sensor 810 may be disposed at an inner side of the holder 310.

For example, the image sensor 810 may be disposed inside the opening 501 of the holder 310. Or, the image sensor 810 may be disposed below the opening 501 of the holder 310.

The image sensor 810 may comprise an active region (or an effective image region) in which the light passing through the filter 610 is incident to form an image comprised in the light.

The optical axis of the image sensor 810 and the optical axis of the lens module 400 may be aligned. The image sensor 810 may convert light irradiated to the active region into an electrical signal and output the converted electrical signal.

For example, the filter 610 and the active region of the image sensor 810 may be spaced apart to face each other in the optical axis OA direction.

The circuit element 95 may be electrically connected to the first board 811, and may constitute a control unit for controlling the image sensor 810 and the lens driving device 100.

For example, circuit element 95 may comprise passive elements and active elements.

For example, the circuit element 95 may comprise at least one among a capacitor, a memory, a controller, a sensor (for example, a motion sensor), or an integrated circuit (IC).

The circuit board 800 may be electrically connected to the lens driving device 100.

Or, in another embodiment, the circuit board 800 may be electrically connected to the circuit board of the lens driving device.

For example, a driving signal may be provided to the coil 120 of the lens driving device 100 through the circuit board 800. Or, in another embodiment, a driving signal may be provided to the AF position sensor (or OIS position sensor) through the circuit board 800. In addition, the output of the AF position sensor (or/and the OIS position sensor) may be transmitted to the circuit board 800.

Although not shown in FIG. 1, another embodiment may further comprise a stiffener being disposed below the circuit board 800 and attached to a lower surface of the circuit board 800 and/or a lower surface of the image sensor. At this time, the stiffener is a plate-shaped member having a predetermined thickness and hardness, and may stably support the circuit board and the image sensor, and may suppress damage to the circuit board due to external impact or contact. In addition, the stiffener may improve the heat dissipation effect of dissipating heat generated from the image sensor to the outside.

For example, the stiffener may be formed of a metal material having high thermal conductivity, for example, SUS, aluminum, or the like, but is not limited thereto. In another embodiment, the stiffener may be formed of glass epoxy, plastic, or synthetic resin and the like.

For example, in an embodiment in which the stiffener is provided, the circuit board 800 may comprise an opening or a through hole, the image sensor may be disposed inside the opening or the through hole of the circuit board, wherein the image sensor 810 may be disposed on the upper surface of the stiffener.

In addition, the stiffener may serve as a ground for protecting the camera module from electrostatic discharge (ESD) by being electrically connected to the ground terminal of the circuit board 800.

The adhesive member 612 may couple or attach the base 210 of the lens driving device 100 to the circuit board 800. For example, the adhesive member 612 may be disposed between the lower surface of the base 210 and the upper surface of the first circuit board 811, and may attach both to each other.

The adhesive member 612 may serve to prevent foreign matters from being introduced into the lens driving device 100 in addition to the aforementioned bonding role. For example, the adhesive member 612 may be an epoxy, a thermosetting adhesive, or an ultraviolet curable adhesive.

For example, the adhesive member 612 may be disposed on an upper surface of the first circuit board 811 to have a ring shape, but is not limited thereto.

The holder 310 is disposed on the circuit board 800 and may support the filter 610.

For example, the lower surface of the base 210 of the lens driving device 100 and the upper surface of the circuit board 800 may face each other in an optical axis direction, and both may be attached to each other by the adhesive member 612.

For example, the lower surface of the base 210 of the lens driving device 100 may be in contact with the upper surface of the circuit board 800, and may be supported by the upper surface of the circuit board 800.

Referring to FIGS. 6 and 7, the holder 310 may comprise a side surface 513 connecting the bottom surface 511 and the lower surface 51b of the seating part 500.

For example, the side surface 513 may be perpendicular to the lower surface 51b of the holder 310, but is not limited thereto. In another embodiment, the inner angle formed by the side surface 513 and the lower surface 51b of the holder 310 may be an acute angle. In another embodiment, the inner angle formed by the side surface 513 and the lower surface 51B of the holder 310 may be an obtuse angle. For example, the side surface 513 may have a chamfer shape.

The lower surface 51b of the holder 310 may comprise a first region 58A located at an opposite side of the bottom surface 511 of the seating part 500.

For example, the bottom surface 511 of the seating part 500 of the holder 310, the first region 58A of the lower surface 51b of the holder 310, and the side surface 513 may form "support part 38A (refer to FIG. 13)" configured to support the filter 610. At this time, the lower surface of the support part 38A may be attached or coupled to an upper surface of the circuit board 800 by the adhesive member 613.

In addition, the lower surface 51b of the holder 310 may comprise a second region 58B positioned between the first region 58A and the periphery (or edge) of the lower surface 51b.

For example, the second region 58B may be located at an outer side of the first region 58A.

For example, the second region 58B may connect the first region 58A and the outer side surface of the holder 310.

For example, the first region 58A may be overlapped with the bottom surface 511 of the seating part 500 in an optical axis direction. In addition, the second region 58B may not be overlapped with the bottom surface 511 of the seating part 500 in an optical axis direction.

For example, the first region 58A may be overlapped with an edge portion of the filter 510 being disposed on the bottom surface 511 of the seating part 500. In addition, for example, the second region 58B may not be overlapped with an edge portion of the filter 510 being disposed on the bottom surface 511 of the seating part 500.

For example, the first region 58A may be formed along the perimeter of the opening 501 of the holder 310 and may be formed adjacent to the opening 501. For example, the first region 58A viewed from below may have a shape coincident with the opening 501, for example, a polygonal (for example, quadrilateral) shape.

The first region 58A may be coupled to an upper surface of the circuit board 800. In addition, the second region 58B may be coupled to an upper surface of the circuit board 800.

For example, at least a portion of the adhesive member 613 may be disposed between the first region 58A and the upper surface of the circuit board 800, and the first region 58A of the lower surface 51b of the holder 310 may be coupled to the upper surface of the circuit board 800.

In addition, at least another part of the adhesive member 613 may be disposed between the second region 58B and the upper surface of the circuit board 800, and the second region 58B of the lower surface 51b of the holder 310 may be coupled to the upper surface of the circuit board 800.

A groove 53 may be formed in a lower surface 51b of the holder 310. The groove 53 of the holder 310 may be the shape being recessed from the lower surface 51b.

At least a portion of the circuit element 95 may be accommodated or disposed inside the groove 53.

The groove 53 may be overlapped with at least a portion of the circuit element 95 in an optical axis direction, and may serve to prevent the holder 310 and the circuit element 95 from interfering with each other spatially.

For example, the circuit element 95 may be positioned between the holder 310 and the base 210, and may be overlapped with at least a portion of the lens module 400 in an optical axis direction. Or, for example, at least a portion of the circuit element 95 may be overlapped with the bobbin 100 of the lens driving device 100 in an optical axis direction.

For example, at least a portion of the holder 310 and at least a portion of the circuit element 95 may be overlapped with each other in an optical axis direction, at least a portion of the circuit element 95 may be located below the groove 53 of the holder 310, and the circuit element 95 and the holder 310 to be spatially avoided from each other by the groove 53 of the holder 310.

For example, the groove 53 may comprise: a lower surface 51b of the holder 310 and the first surface 53a having a step difference in an optical axis direction; and a second surface 53b for connecting the first surface 53a and the lower surface 51b. The first surface 53a can be expressed by replacing it with a "bottom surface", and the second surface 53b may be expressed by replacing it with a "side surface".

The second surface 53a may be inclined with respect to the first surface 53b. For example, the second surface 53a may have a chamfer shape.

The first surface 53a may be positioned higher than the lower surface 51b of the holder 310. For example, among the first surface 53a and the lower surface 51b, the first surface 53a may be more adjacent to the upper surface 51a of the holder 310.

For example, the groove 53 may not be overlapped with the first region 58A of the lower surface 51b of the holder 310 in an optical axis direction.

For example, the groove 53 may be formed in the second region 58B of the lower surface 51b of the holder 310. This is to prevent the height or step difference of the bottom surface 511 required for seating the filter 610 from being restricted by the formation of the groove 53.

For example, referring to FIG. 4, the first surface 53a may be positioned higher than the bottom surface 511 of the seating part 500. For example, among the bottom surface 511 of the seating part 500 and the first surface 53a of the groove 53, the first surface 53a may be more adjacent to the upper surface 51a of the holder 310.

In addition, for example, among the bottom surface 511 of the seating part 500 and the first surface 53a of the groove 53, the bottom surface 511 may be more adjacent to the lower surface 51b of the holder 310.

For example, the groove 53 may comprise an opening being opened toward the outer side surface of the holder 310, but is not limited thereto, and the opening may be omitted in other embodiments.

Referring to FIG. 7, the groove 53 may comprise a plurality of grooves spaced apart from each other. At least one groove may be formed in at least one of the four sides of the lower surface 51b of the base 210. For example, two grooves 53 spaced apart from each other may be formed on each of the four sides of the lower surface of the base 210, but is not limited thereto, and one or more grooves may be formed in at least one among the four sides.

Referring to FIGS. 4 to 6, the base 210 and the holder 310 may be disposed on an upper surface of the circuit board 800. The holder 310 may be disposed at an inner side of or inside the base 210.

For example, the lower portion of the base 210 may be disposed on the upper surface of the circuit board 800 to surround the holder 310.

For example, at least a portion of the base 210 may be overlapped with the holder 310 in a direction perpendicular to the optical axis.

In addition, for example, at least a portion of the base 210 may be overlapped with the image sensor 810 in a direction perpendicular to the optical axis.

In addition, for example, at least a portion of the base 210 may be overlapped with the filter 610 in a direction perpendicular to the optical axis.

For example, the holder 310 may be disposed to be spaced apart from the base 210. In other embodiments, the holder and the base may be in contact with each other.

For example, the base 210 may be overlapped with the image sensor 810 in a direction perpendicular to the optical axis.

For example, the holder 310 may be disposed inside the opening 201 of the base 210. Or, for example, the holder 310 may be disposed below the opening 201 of the base 210.

For example, the opening 501 of the holder 310 may be smaller than the opening 201 of the base 210.

For example, the holder 310 may be disposed between the opening 201 of the base 210 and an upper surface of the circuit board 800.

For example, the base 210 may have a groove or a step portion 57 being recessed from the lower surface thereof. The step difference portion 57 of the base 210 may comprise: a lower surface 54 of the base 210 and a first surface 57a having a step difference in an optical axis direction; and a second surface 57b for connecting the first surface 57a and the lower surface 54.

For example, the first surface 57a may be located higher than the upper surface of the holder 310, but is not limited thereto, and in another embodiment, the first surface 57a is the same height as the upper surface 51a of the holder 310, or may be positioned lower than the upper surface 51a of the holder 310.

For example, at least a portion of the groove or the step portion 57 of the base 210 may be overlapped with the circuit element 95 in an optical axis direction, and the spatial interference between the circuit element 95 and the base 210 can be avoided by the groove or the step portion. In the base according to another embodiment, the above-described groove or step portion 57 may be omitted.

For example, at least a portion of the circuit element 95 may be overlapped with the bobbin 110 or the lens module 400 of the lens driving device 100 in an optical axis direction.

The lower surface 54 of the base 210 and the first region of the upper surface of the circuit board 800 may be coupled to each other by the adhesive member 612, and the lower surface 51b of the holder 310 and the second region of the upper surface of the circuit board 800 may be coupled to each other by the adhesive member 613. For example, the second region of the circuit board 800 may be located at an inner side of the first region of the circuit board 800.

Figure 9A:
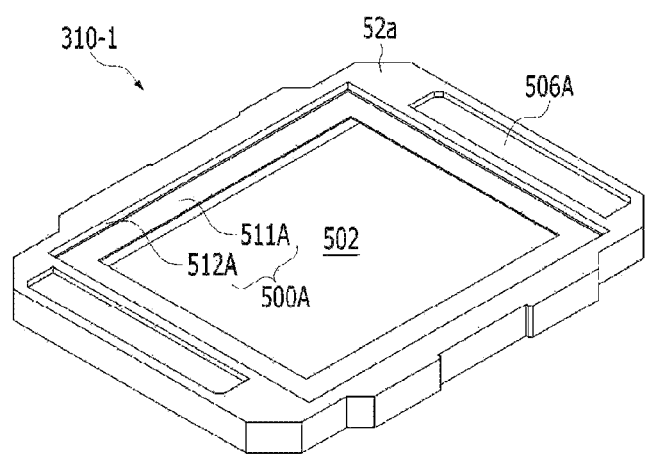
FIG. 9a is a top perspective view of a holder in another embodiment.
Figure 9B:
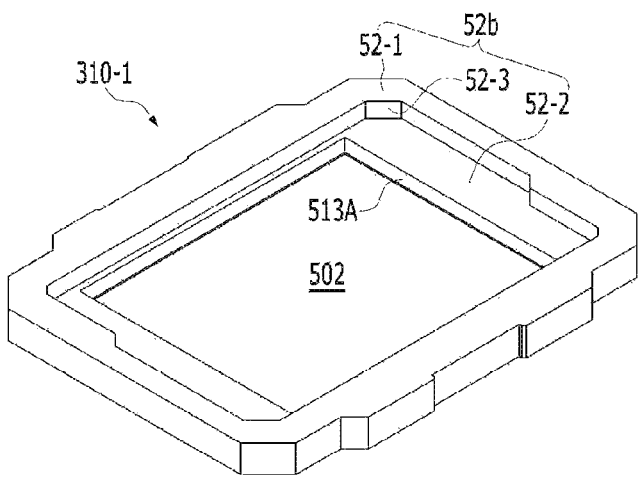

FIG. 9a is a top perspective view of a holder 310-1 in another embodiment; FIG. 9b is a bottom perspective view of the holder 310-1 of FIG. 9a; and FIG. 10 is a cross-sectional view of a camera module comprising the holder 310-1 of FIG. 9a.

Figure 10:
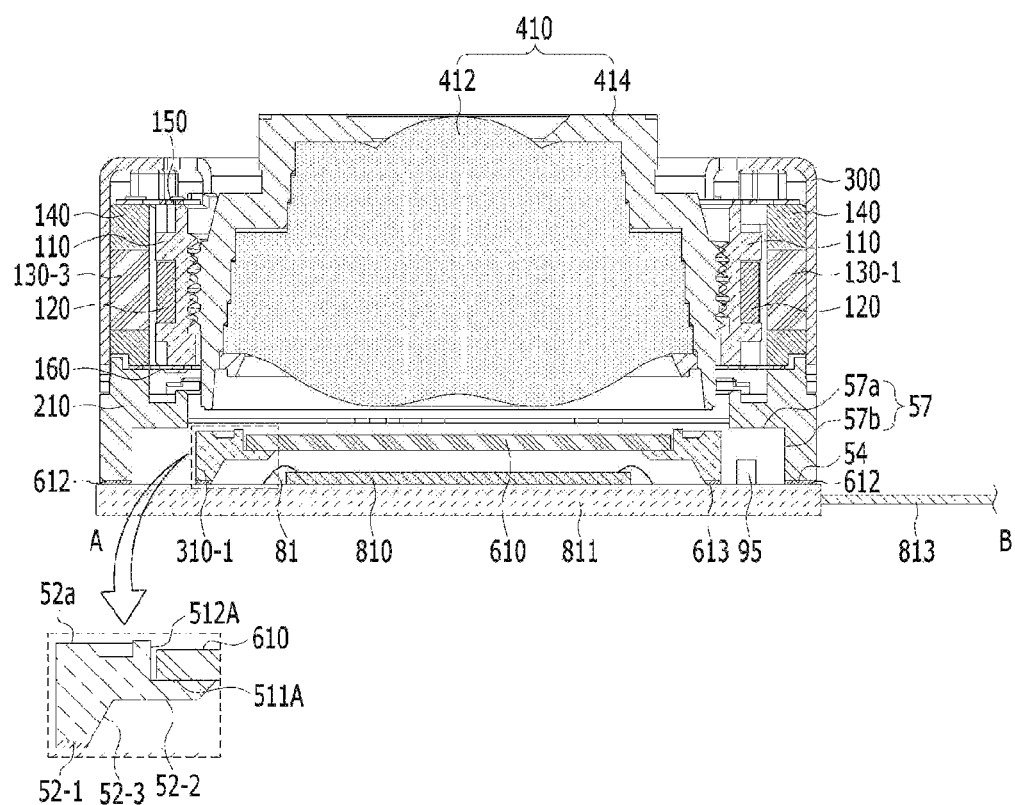

Referring to FIGS. 9a to 10, the holder 310-1 may comprise a seating part 500A comprising a bottom surface 511A and a side surface 512A. In addition, the holder 310-1 may comprise an opening 502 being formed in the bottom surface 511A. A foreign matters collecting part 506A may be formed on the upper surface 52a of the holder 310-1.

The description of the bottom surface 511 and the side surface 512, the opening 501, and the foreign matters collecting part 506 of the seating part 500A of the holder 310 can be applied or applied by analogy to the bottom surface 511A and side surface 512A of the holder 310-1, the opening 501A, and the foreign matters collecting part 506A.

The lower surface 52b of the holder 310 may comprise a first surface 52-1 and a second surface 52-2 having a step difference with the first surface 52-1 in an optical axis direction.

For example, the second surface 52-2 may be positioned higher than the first surface 52-1.

For example, among the first surface 52-1 and the second surface 52-2, the second surface 52-2 may be more adjacent to the bottom surface 511A of the seating part 500A.

The second surface 52-2 may be overlapped with the bottom surface 511 of the seating part 500A in an optical axis direction. For example, the second surface 52-2 may be a surface located at an opposite side of the bottom surface 511A of the seating part 500A.

An adhesive member 613 may be disposed between the first surface 52-1 of the lower surface 52b of the holder 310-1 and the upper surface of the circuit board 800, and the second surface 52-2 of the lower surface 52b of the holder 310 may be spaced apart from the upper surface of the circuit board 800 in an optical axis direction.

For example, the second surface 52-2 of the lower surface 52b of the holder 310 may be positioned higher than the upper surface of the image sensor 810.

The holder 310-1 may comprise a side surface 513A connecting the bottom surface 511A and the second surface 52-2. For example, the side surface 513A may be an inclined surface. For example, the inner angle between the side surface 513A and the bottom surface 511A may be an acute angle, an obtuse angle, or a right angle, and an inner angle between the side surface 513A and the second surface 52-2 may be an obtuse angle, but is not limited thereto.

The bottom surface 511A of the seating part 500A of the holder 310-1, the second surface 52-2 of the lower surface 52b of the holder 310-1, and the side surface 513A may form a "support part 38B (refer to FIG. 13)" for supporting the 610. The support part 38B may be spaced apart from the upper surface of the circuit board 800.

For example, the circuit element 95 may be disposed between the holder 310-1 and the base 210. For example, the circuit element 95 may not be overlapped with the holder 310-1 in an optical axis direction.

Generally, there are design specifications for the separation distance between the image sensor and the lens module, and based on these preset design specifications, the height of the wire that electrically connects the image sensor and the circuit board, the thickness of the filter, the structure of the holder, and/or the range of the stroke in an optical axis direction of the lens module can be set.

Figure 11A:
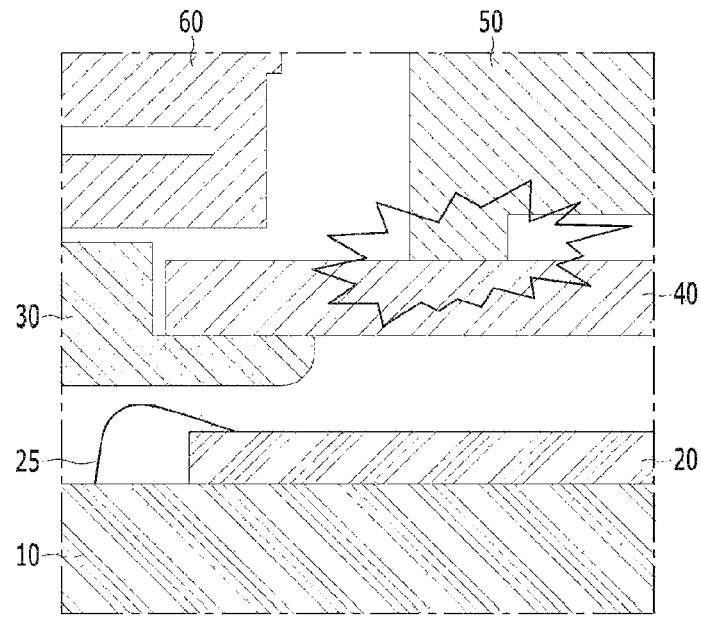
FIG. 11a is a cross-sectional view illustrating a collision between a filter and a lens module in a typical camera module.
Figure 11B:
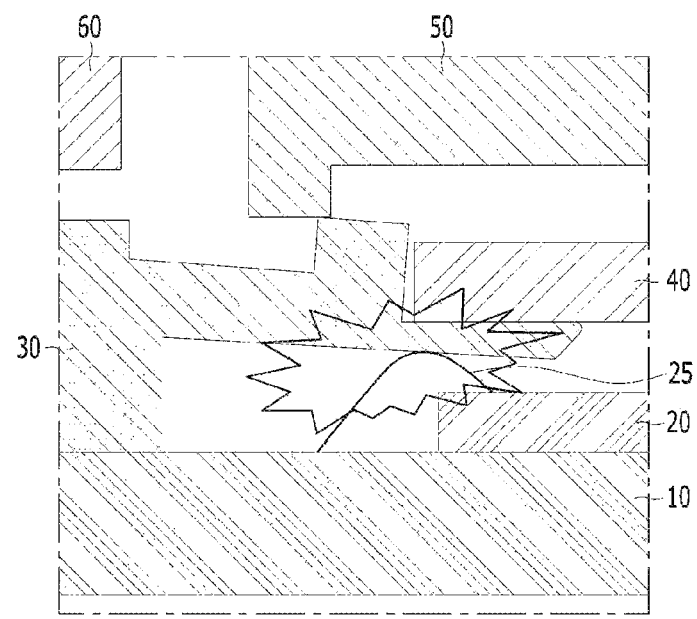

FIG. 11a is a cross-sectional view illustrating a collision between a filter 40 and a lens module 50 in a typical camera module; and FIG. 11b shows a collision between the support part 45 of the holder 30 and the wire 25 in the camera module of FIG. 11a.

Referring to FIG. 11a, the image sensor 20 and the holder 30 are disposed on an upper surface of the circuit board 10, and the base 60 of the lens driving device is disposed on an upper surface of the holder 30. The image sensor 20 and the circuit board 10 may be electrically connected to each other by the wire 25.

The base 60 of the lens driving device is disposed on an upper surface of the holder 30, and the holder 30 comprises a support part 25 for supporting the filter 40.

For example, the holder 30 may have an opening corresponding to the filter 40, and may comprise a support part 45 (or "seating part") for supporting an edge portion of the filter 40. At this time, the support part 45 may be spaced apart from the upper surface of the circuit board 10 or have a structure having a step difference in an optical axis direction.

When manufacturing the holder, which is an injection product, it is necessary to secure the minimum injection thickness of the support part 45, which may be a limitation on the thickness of the camera module in the optical axis direction when designing the camera module, and the distance or the gap between the lens module 50 and the filter 40 may be reduced.

As such, when the separation distance between the lens module 50 and the filter 40 is not sufficiently secured, when a physical shock is applied to the camera module from the outside, as shown in FIG. 11a, the lens module 50 and the filter 40 may collide with each other, and for this reason the filter 40 and the lens module 50 may be damaged.

In addition, when the separation distance or gap between the lens module 50 and the filter 40 is reduced, there may be restrictions on the size of the lens comprised in the lens module, the stroke in the optical axis direction of the lens module may be limited, and for this reason, reliability regarding auto-focusing cannot be ensured.

In addition, in FIGS. 11a and 11b, since the base 60 of the lens driving device is disposed on an upper surface of the holder 30, it is difficult to reduce the length of the camera module in an optical axis direction.

At this time, the length of the camera module in the optical axis direction may be a length that may affect the thickness of the optical apparatus (for example, mobile phone or smart phone). For example, the length of the camera module in the optical axis direction may be the height or distance from the lower surface of the circuit board 10 to the upper surface of the cover member of the camera module.

In addition, referring to FIG. 11b, the support part 45 of the holder 30 is bent by a physical impact applied to the camera module from the outside, so that the support part 45 and the wire 25 may collide, and for this reason, the wire 25 may be damaged, thereby resulting in electrical disconnection of the wire.

According to the trend of slimming or downsizing of the terminal device, size reduction is required in the optical axis direction (for example, Z-axis direction) and the direction perpendicular to the optical axis (for example, X-axis and Y-axis direction) of the camera module mounted on the terminal device.

The camera module according to the embodiment has the following effects.

First, since the holder 310 is disposed inside the base 210 of the lens driving device 100, and the lower surface of the base 210 is directly coupled to the upper surface of the circuit board 800, when compared to the case of FIGS. 11a and 11b, in an embodiment, the height or length of the camera module in an optical axis direction may be reduced.

Figure 12:
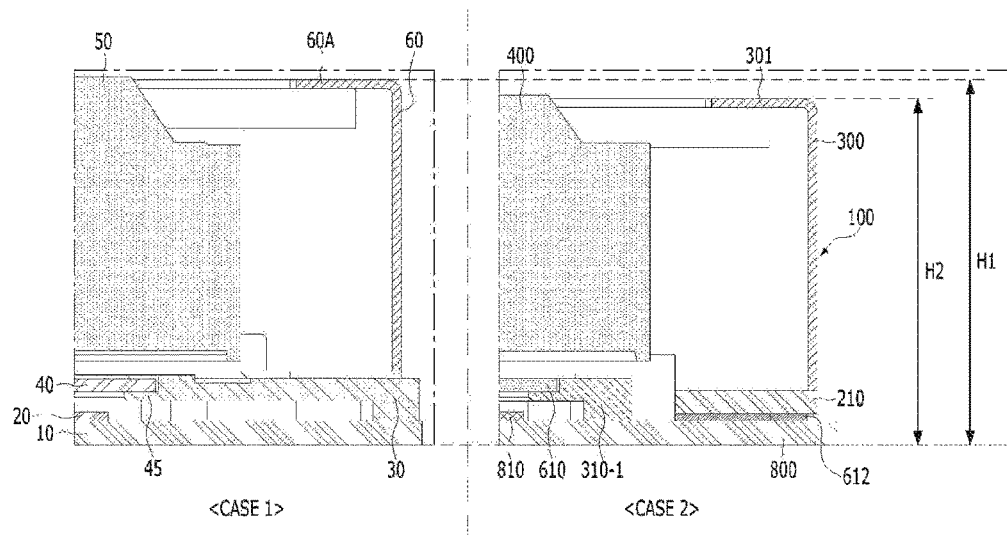
FIG. 12 shows the general camera module of FIG. 11a and the length of a camera module in an optical axis direction according to an embodiment.

FIG. 12 shows the general camera module of FIG. 11a and the length in an optical axis direction of the camera module according to the embodiment. CASE 1 shows a partial cross-sectional view of the general camera module of FIG. 11a, and CASE 2 shows a partial cross-sectional view of the camera module comprising the holder 310-1 of FIG. 10.

Referring to FIG. 12, in CASE 2, since the lower surface of the base 210 of the lens driving device 100 is directly coupled to an upper surface of the circuit board 800, the height of the upper plate 301 of the cover member 300 of the lens driving device 100 may be lowered by the height of the holder 30 of CASE 1. For this reason, the length H2 of the camera module of CASE 2 in the optical axis direction may be smaller than the length H1 of the camera module of CASE 1 in the optical axis direction (H2<H1). Therefore, the length of the camera module according to the embodiment in the optical axis direction can be reduced, and the thickness of the optical apparatus comprising the camera module according to the embodiment may be reduced, and thereby it may be slimmed down.

For example, H1 may be a height or distance from the lower surface of the circuit board 800 to the upper surface of the upper plate 301 of the cover member 300 of the camera module. In addition, H2 may be a height or distance from the lower surface of the circuit board 10 to the upper surface of the upper plate 60A of the cover member 60 of the camera module.

Although FIG. 12 illustrates the holder 310-1 according to the embodiment of FIG. 10, the description of FIG. 12 may be equally applied to the camera module comprising the holder 310 illustrated in FIGS. 6 and 7.

Second, the embodiment may increase the separation distance in the optical axis direction between the filter 610 and the lens module 400.

Figure 13:
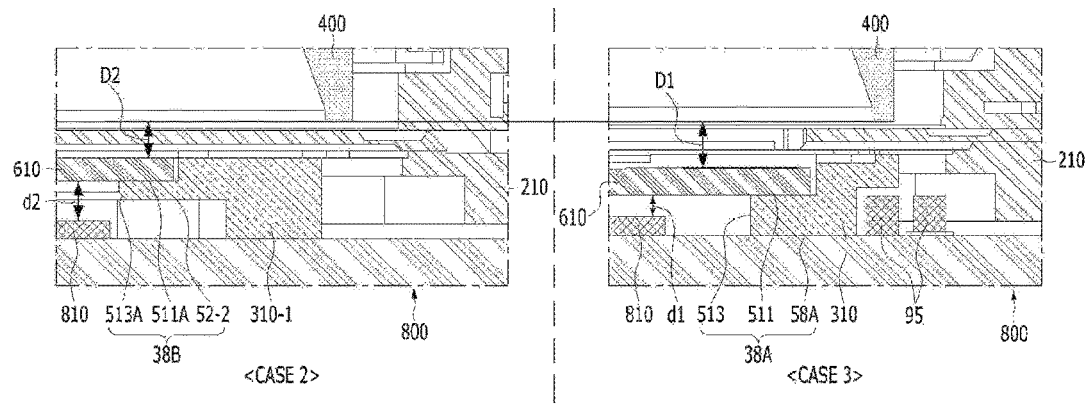
FIG. 13 illustrates a separation distance between a filter and a lens module in an optical axis direction according to embodiments.

FIG. 13 illustrates a separation distance in the optical axis direction between the filter 610 and the lens module 400 according to embodiments. CASE 2 shows a partial cross-sectional view of a camera module comprising the holder 310-1 of FIG. 10, and CASE 3 shows a partial cross-sectional view of a camera module comprising the holder 310 of FIGS. 6 and 7.

Referring to FIG. 13, in CASE 2, a support part 38B in the form of a window for seating the filter 610 is provided, and the support part 38B has a minimum thickness required for injection molding (for example, 0.1 mm~0.2 mm) is required. For example, the cross-sectional shape of the window-shaped support part 38B may be in the shape of a Korean letter "¬".

On the other hand, in CASE 3, since the support part 38A is directly attached to the upper surface of the circuit board 800, there is no need for a window as in CASE 2. The separation distance may be increased. For example, the cross-sectional shape of the support part 38A may have a structure in the shape of a Korean letter "|".

For example, in CASE 3, the separation distance D1 between the lower end of the lens module 400 and the upper surface of the filter 600 may be greater than the separation distance D2 between the lower end of the lens module 400 and the upper surface of the filter 600 in CASE 2 (D1>D2). For example, D1 may be 0.35 mm to 0.45 mm, and D2 may be 0.2 mm to 0.33 mm.

In addition, in CASE 3, since the support part 38A is directly attached to the upper surface of the circuit board 800, the bending of the support part 38A due to an external impact does not occur, and due to this, a collision between the holder 310 and the wire 81 may not occur.

The separation distance d1 between the lower surface of the filter 610 and the image sensor in CASE 3 may be smaller than the separation distance d2 between the lower surface of the filter 610 and the image sensor 810 in CASE 2 (d1<d2).

Third, the embodiment may reduce the size of the camera module in a direction perpendicular to the optical axis. Referring to FIGS. 8a and 8b, there is a design guide that requires a minimum spacing among the components of the camera module (for example, image sensor 810, wire 81, circuit element 95, and holder 310).

In the embodiment, by disposing or arranging the circuit element 95 on the circuit board 810 such that at least a portion of the circuit element 95 is overlapped with the holder 310 in an optical axis direction, the region in which the holder 310 and the circuit element 95 are disposed on an upper surface of the circuit board 800 may be partially shared, and due to this, the size of the camera module in the horizontal direction can be reduced.

Fourth, since the entire area of the lower surface 51b of the holder 310 excluding the groove 53 is attached to the upper surface of the circuit board 800, the bonding force can be improved and the shear force can be increased between the holder 310 and the circuit board 800, and it is possible to prevent the holder 310 and the circuit board 800 from being separated from each other due to an external impact.

In addition, fifth, since D1 of CASE 3 is greater than D2 of CASE 2, if the distance between the lens module 400 of CASE 3 and the upper surface of the filter 610 is designed as D1 of CASE 2, the height from the lower surface of the circuit board 800 of CASE 3 to the upper surface of the upper plate 301 of the cover member 300 of the camera module can be further reduced than H2 described in FIG. 12, thereby the size of the camera module can be further reduced.

Figure 14:
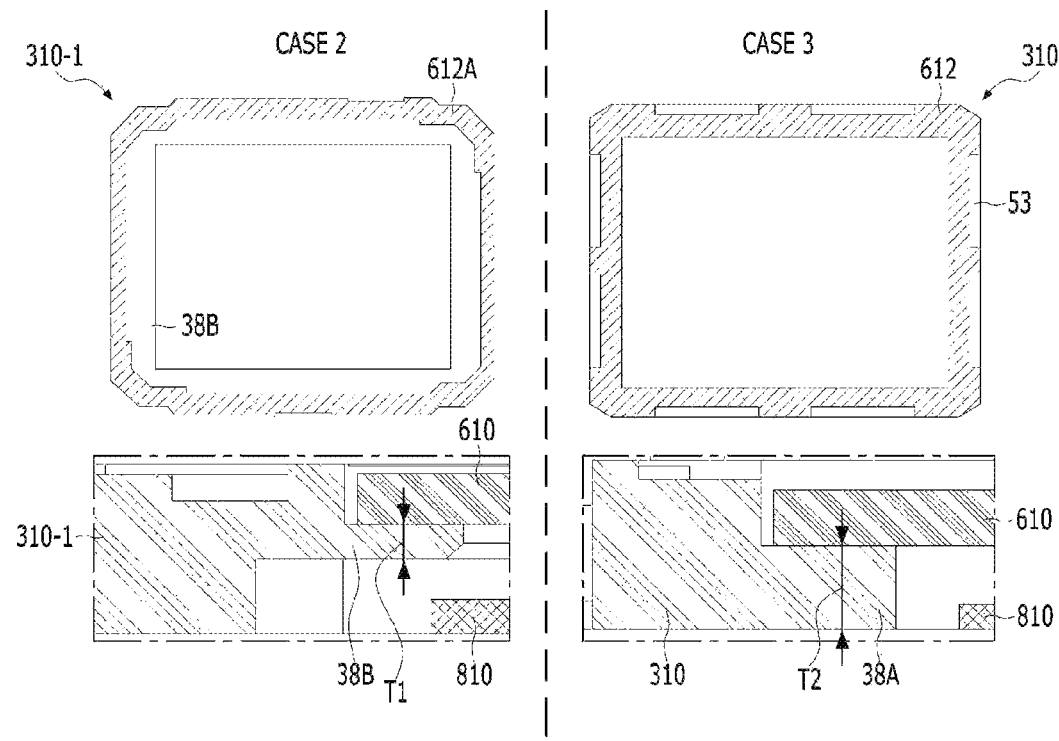
FIG. 14 shows an adhesive member attached to a lower surface of the holder of FIG. 10 and an adhesive member attached to a lower surface of the holder of FIG. 6.

FIG. 14 shows an adhesive member 612A being attached to a lower surface of the holder 310-1 of FIG. 10 and an adhesive member 612 attached to a lower surface of the holder 310 of FIG. 6. CASE 3 shows an embodiment comprising the holder 310 of FIG. 6.

Referring to FIG. 14, in CASE 2, the area of the region where the adhesive member 612A is disposed may be 46.72% compared to the total area of the lower surface of the holder 310-1. In CASE 3, the area of the region in which the adhesive member 612 is disposed relative to the total area of the lower surface of the holder 310 may be 80.14%.

That is, since the area of the lower surface of the holder 310 coupled with the upper surface of the circuit board 800 is larger than the area of the lower surface of the holder 310-1 coupled with the upper surface of the circuit board 800, when compared to CASE 2, in CASE 3, the bonding force between the holder 310 and the circuit board 800 can be further improved, the shear force can be increased more, and it is possible to prevent the holder 310 and the circuit board 800 from being separated from each other due to an external impact.

The thickness T2 of the support part 38A of CASE 3 may be greater than the thickness T1 of the support part 38B of CASE 2, and when compared to CASE 2, the rigidity of the support part 38A of CASE 3 can be increased, and the deflection due to impact can be suppressed.

For example, T1 may be 0.1 mm to 0.2 mm, and T2 may be 0.3 mm to 0.4 mm.

The camera module according to the embodiment may be comprised in optical apparatuses: for forming an image of an object in space using the characteristics of light such as reflection, refraction, absorption, interference, and diffraction; and aiming to increase the visual acuity of the eyes, or aiming to record the image by the lens and its reproduction, or for the purpose of optical measurement, propagation or transmission of images etc. For example, the optical apparatus according to the embodiment may comprise a portable terminal equipped with a smartphone and camera.

Figure 15:
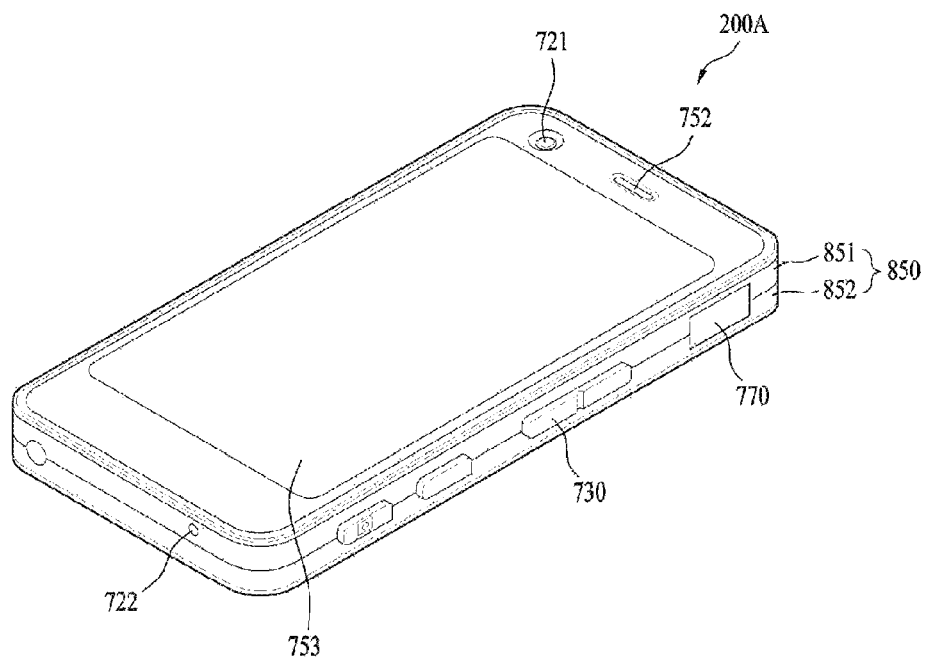
FIG. 15 is a perspective view of a portable terminal according to an embodiment.
Figure 16:
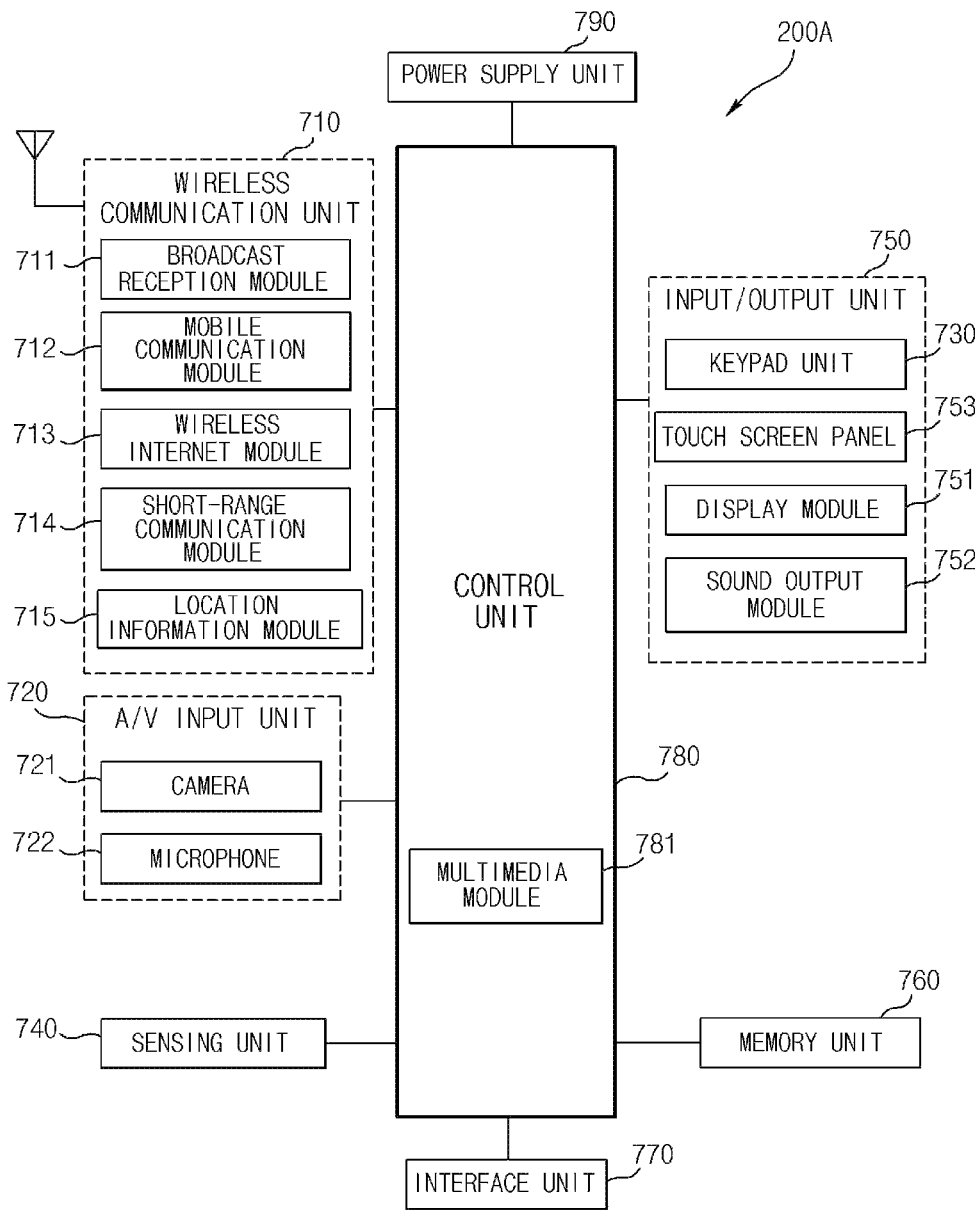
FIG. 16 is a block diagram of the portable terminal illustrated in FIG. 15.

FIG. 15 is a perspective view of a portable terminal 200A according to an embodiment; and FIG. 16 is a block diagram of the portable terminal 200A illustrated in FIG. 15.

Referring to FIGS. 15 and 16, a portable terminal 200A (hereinafter referred to as "terminal") may comprise a body 850, a wireless communication unit 710, an A/V input unit 720, a sensing unit 740, and input/output unit 750, a memory unit 760, an interface unit 770, a control unit 780, and a power supply unit 790.

The body 850 illustrated in FIG. 15 is a bar shape, but is not limited thereto, and it may have various structures such as a slide type, a folder type, a swing type, a swivel type, and the like in which two or more sub-bodies are coupled to be movable relative to each other.

The body 850 may comprise a case (casing, housing, cover, and the like) forming the outer appearance. For example, the body 850 may be divided into a front case 851 and a rear case 852. Various electronic components of the terminal may be embedded in a space formed between the front case 851 and the rear case 852.

The wireless communication unit 710 may comprise one or more modules that enable wireless communication between the terminal 200A and the wireless communication system or between the terminal 200A and the network in which the terminal 200A is located. For example, the wireless communication unit 710 may comprise a broadcast reception module 711, a mobile communication module 712, a wireless Internet module 713, a short-range communication module 714, and a location information module 715.

The A/V input unit 720 is for inputting an audio signal or a video signal, and may comprise a camera 721, a microphone 722, and the like.

The camera 721 may comprise a camera module 200 according to an embodiment.

The sensing unit 740 may generate a sensing signal for controlling the operation of the terminal 200A by detecting the current state of the terminal 200A such as the opening/closing state of the terminal 200A, the position of the terminal 200A, the presence or absence of user contact, the orientation of the terminal 200A, acceleration/deceleration of the terminal 200A, and the like. For example, when the terminal 200A is in the form of a slide phone, it is possible to sense whether the slide phone is opened or closed. In addition, it is responsible for sensing functions related to whether the power supply unit 790 is supplied with power, whether the interface unit 770 is coupled to an external device, and the like.

The input/output unit 750 is for generating an input or an output related to visual, auditory, or tactile sense. The input/output unit 750 may generate input data for controlling the operation of the terminal 200A, and may display information processed in the terminal 200A.

The input/output unit 750 may comprise a keypad unit 730, a display module 751, a sound output module 752, and a touch screen panel 753. The keypad unit 730 may generate input data in response to a keypad input.

The display module 751 may comprise a plurality of pixels whose color changes according to an electrical signal. For example, the display module 751 may comprise at least one among a liquid crystal display, a thin film transistor liquid crystal display, an organic light emitting diode, a flexible display, or a 3D display.

The sound output module 752 outputs audio data being received from the wireless communication unit 710 in call signal reception, call mode, recording mode, voice recognition mode, or broadcast reception mode, and the like, or may output audio data stored in the memory unit 760.

The touch screen panel 753 may convert a change in capacitance being generated due to a user's touch on a specific area of the touch screen into an electrical input signal.

The memory unit 760 may store a program for processing and control of the control unit 780, and may temporarily store input/output data (for example, phone book, message, audio, still image, photo, video, and the like). For example, the memory unit 760 may store an image photographed by the camera 721, for example, a photo or a video.

The interface unit 770 serves as a passage for connecting to an external device being connected to the terminal 200A. The interface unit 770 may receive data from an external device, or is supplied with power and deliver it to each component inside the terminal 200A, or enables data inside the terminal 200A to be transmitted to an external device. For example, the interface unit 770 may comprise: a wired/wireless headset port; an external charger port; a wired/wireless data port; a memory card port; a port for connecting a device equipped with an identification module; an audio input/output (I/O) port; a video input/output (I/O) ports; and an earphone port, and the like.

The control unit 780 may control the overall operation of the terminal 200A. For example, the control unit 780 may perform related control and processing for voice call, data communication, video call, and the like.

The control unit 780 may comprise a multimedia module 781 for playing multimedia. The multimedia module 781 may be implemented inside the control unit 180 or may be implemented separately from the control unit 780.

The control unit 780 may perform a pattern recognition process capable of recognizing a handwriting input or a drawing input performed on the touch screen as characters and images, respectively.

The power supply unit 790 may receive external power or internal power by the control of the control unit 780 and may supply power required for operation of each component.

The camera module according to a first embodiment of the present invention may be applied to a dual camera. In this case, the position of the camera module according to a first embodiment may be adjusted using the bracket 2100 and the magnet according to a second embodiment of the present invention.

Hereinafter, a configuration of a camera device according to a second embodiment of the present invention will be described with reference to the drawings.

Figure 17:
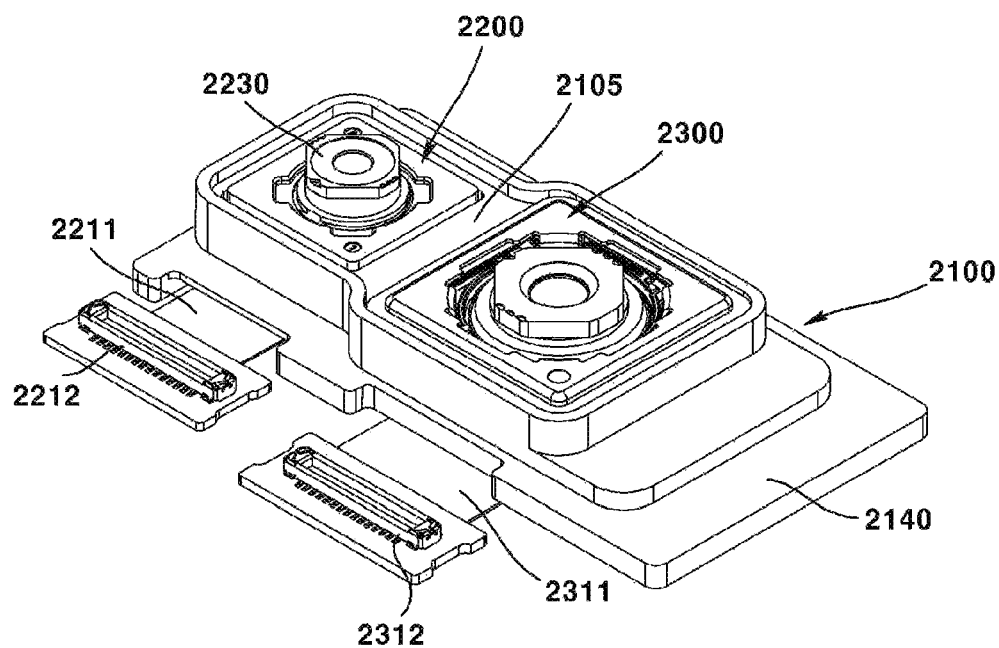
FIG. 17 is a perspective view of a camera device according to a second embodiment of the present invention.
Figure 18:
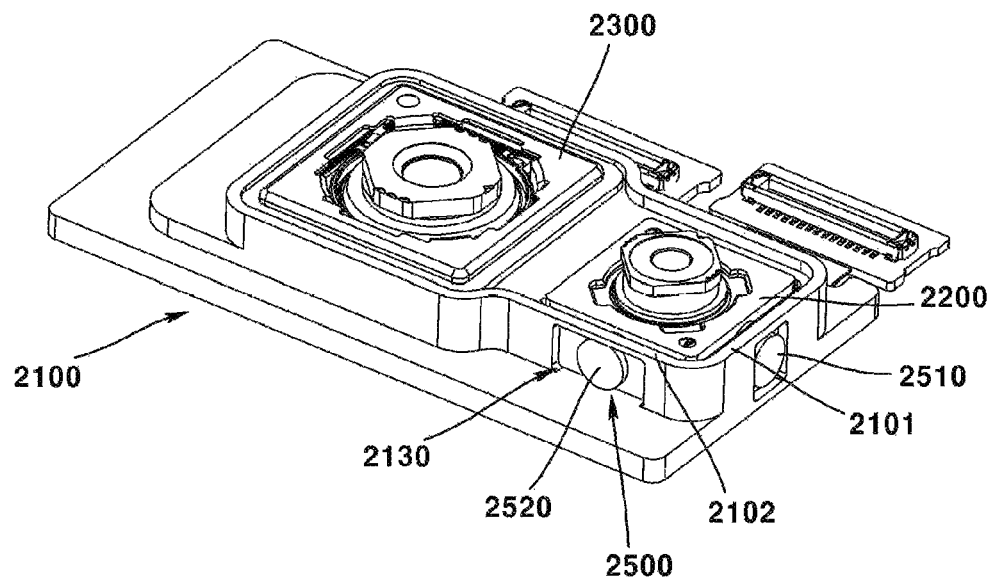
FIG. 18 is a perspective view of a camera device according to a second embodiment of the present invention in a different direction from that of FIG. 17.
Figure 19:
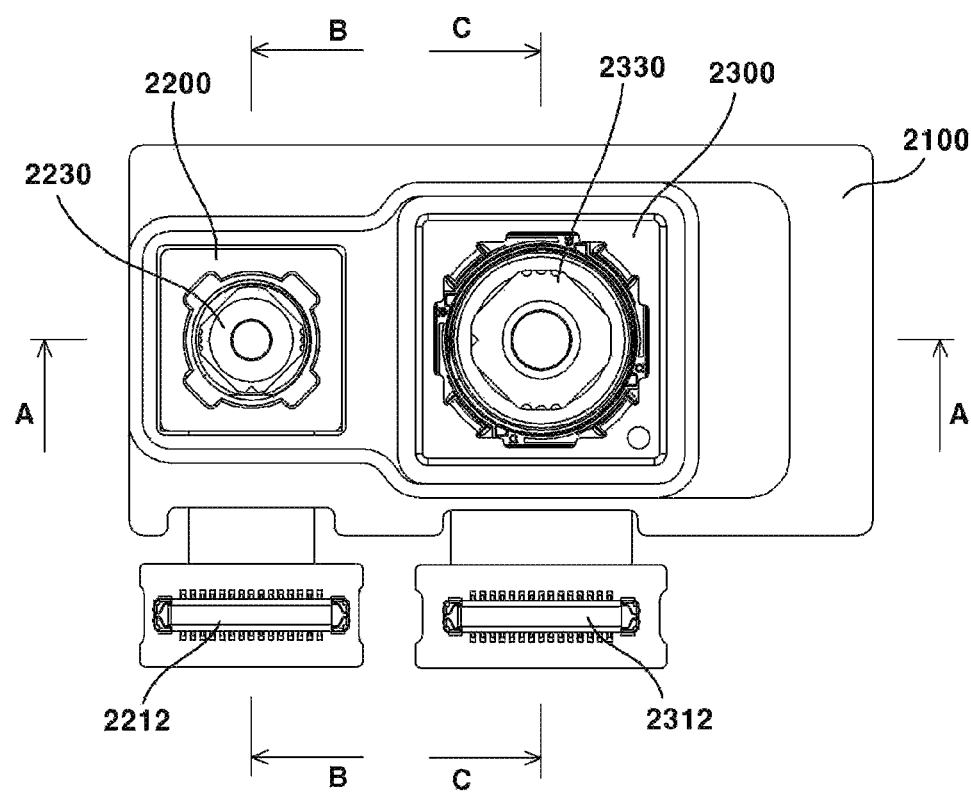
FIG. 19 is a plan view of a camera device according to a second embodiment of the present invention.
Figure 20:
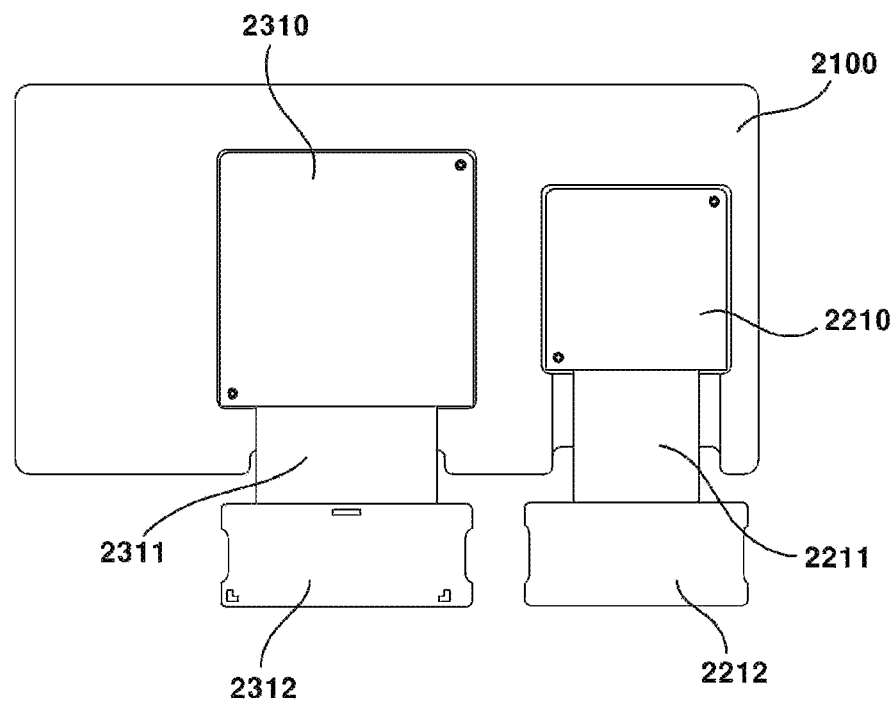
FIG. 20 is a bottom view of a camera device according to a second embodiment of the present invention.
Figure 21:
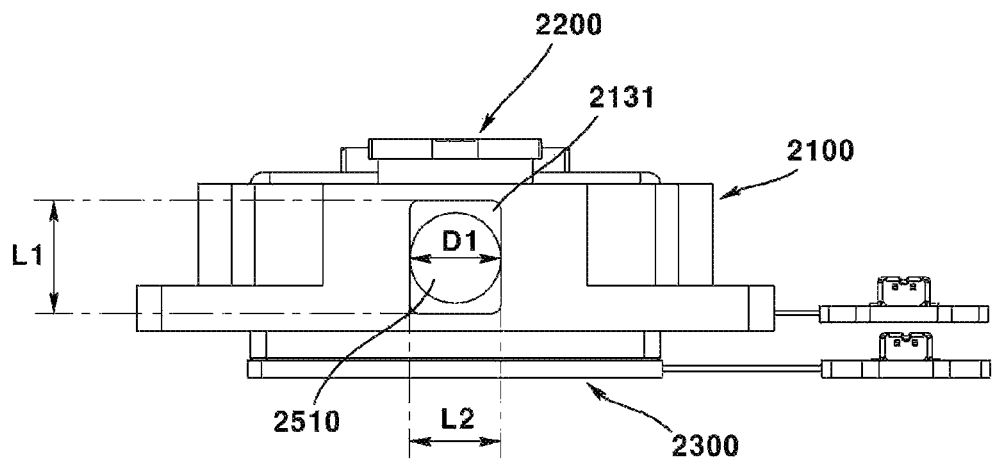
FIGS. 21 to 24 are side views of a camera device according to a second embodiment of the present invention.
Figure 22:
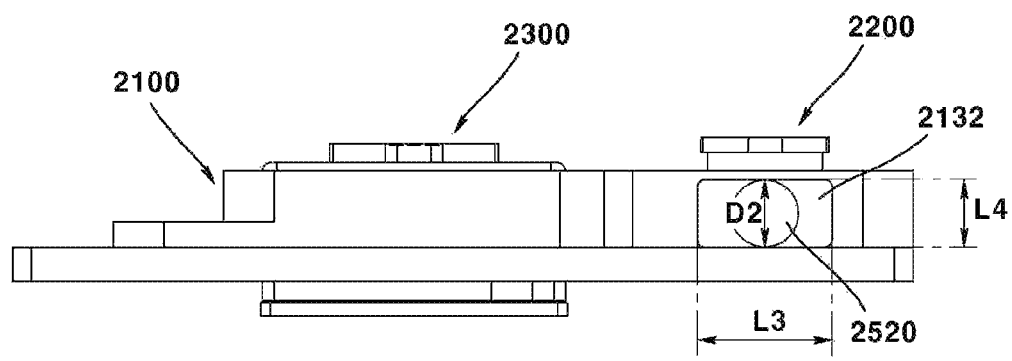
Figure 23:
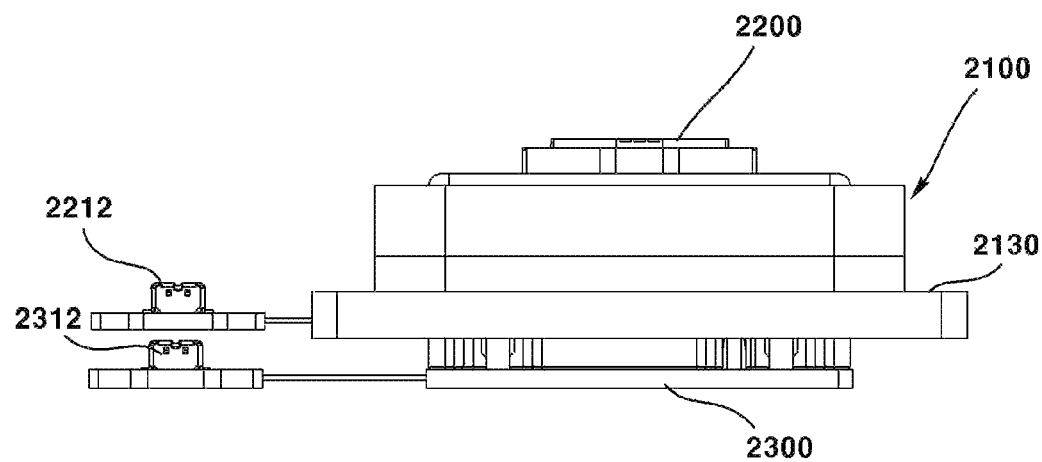
Figure 24:
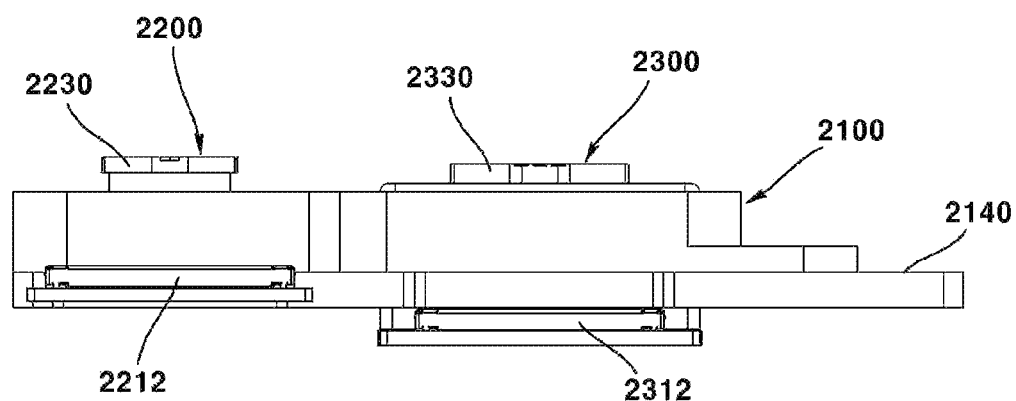
Figure 25:
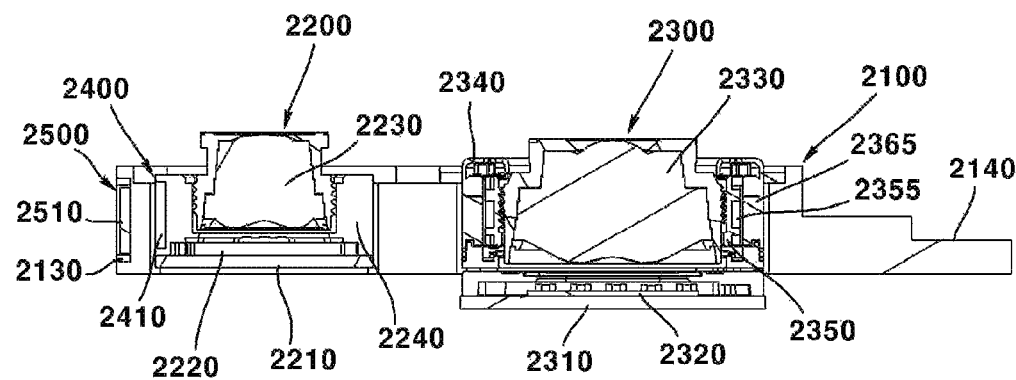
FIG. 25 is a cross-sectional view taken along line A-A of FIG. 19.
Figure 26:
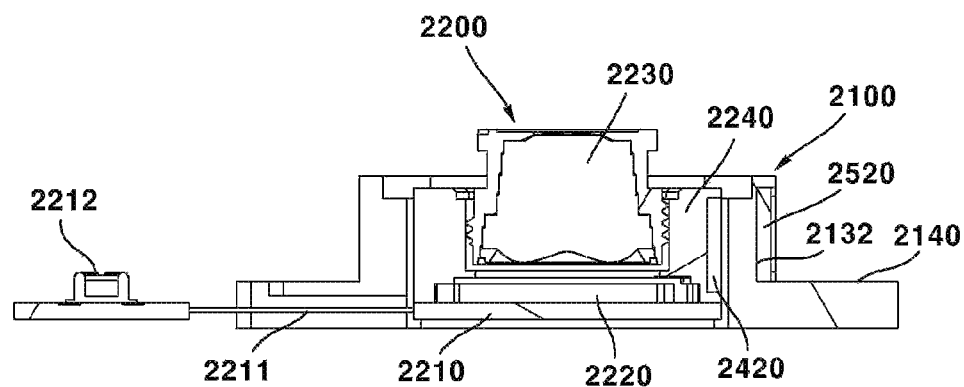
FIG. 26 is a cross-sectional view taken along line B-B of FIG. 19.
Figure 27:
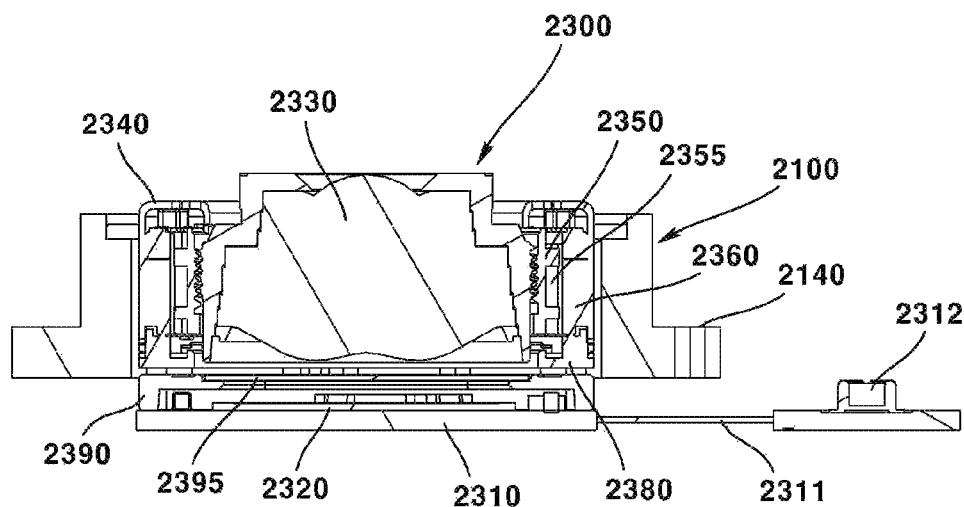
FIG. 27 is a cross-sectional view taken along line C-C of FIG. 19.
Figure 28:
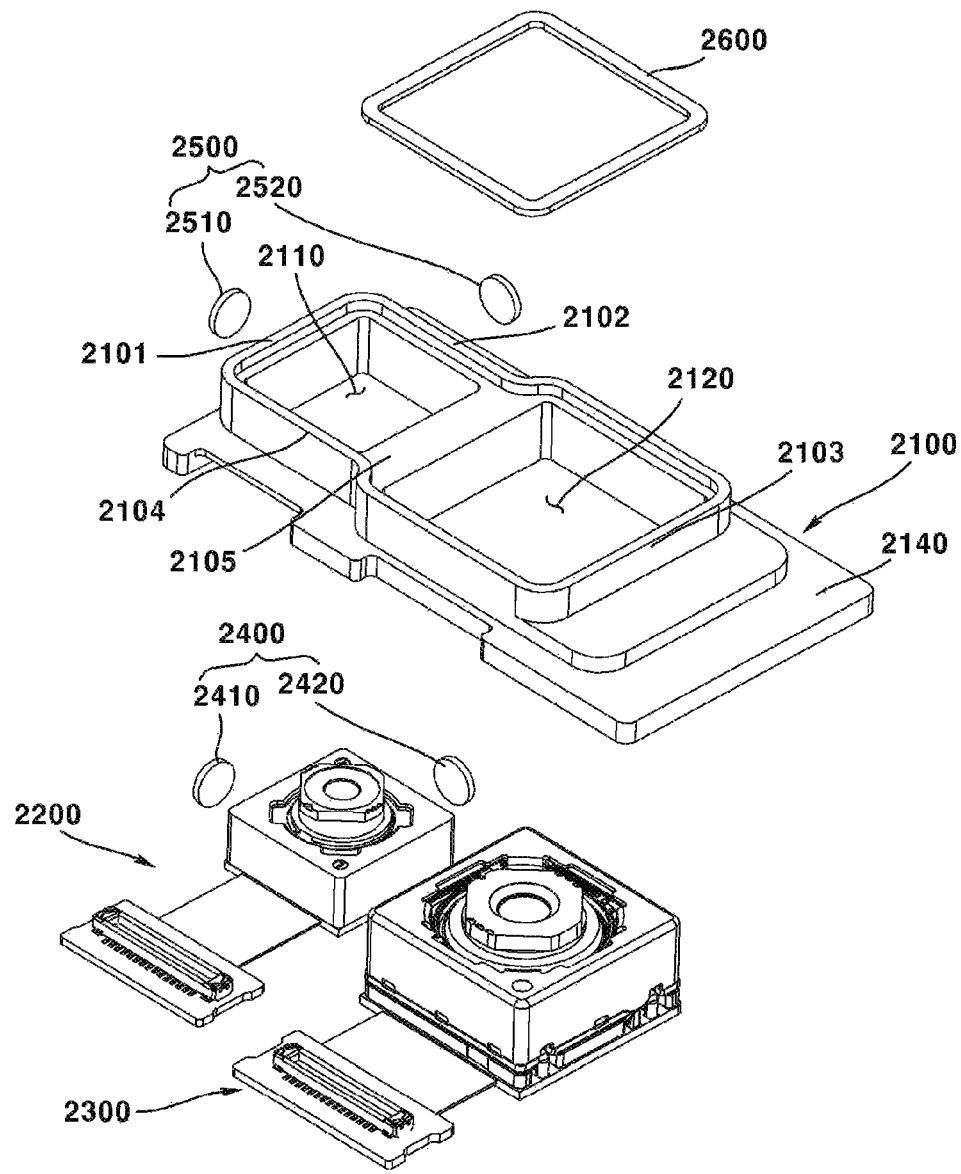
FIG. 28 is an exploded perspective view of a camera device according to a second embodiment of the present invention.
Figure 29:
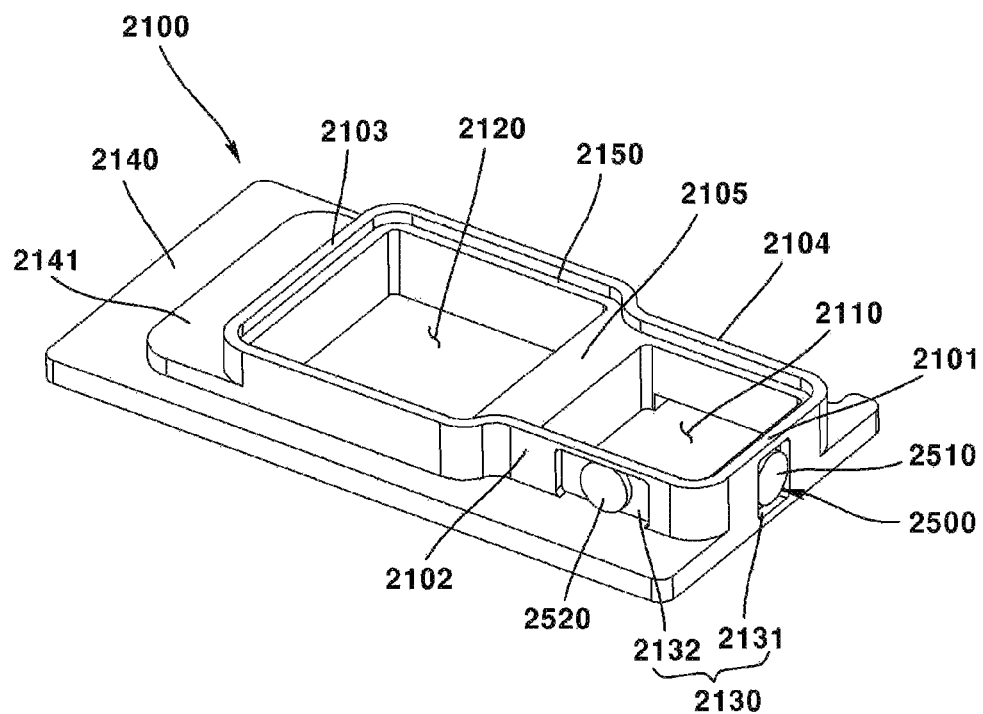
FIG. 29 is a perspective view of a bracket and a magnet of a camera device according to a second embodiment of the present invention.
Figure 30:
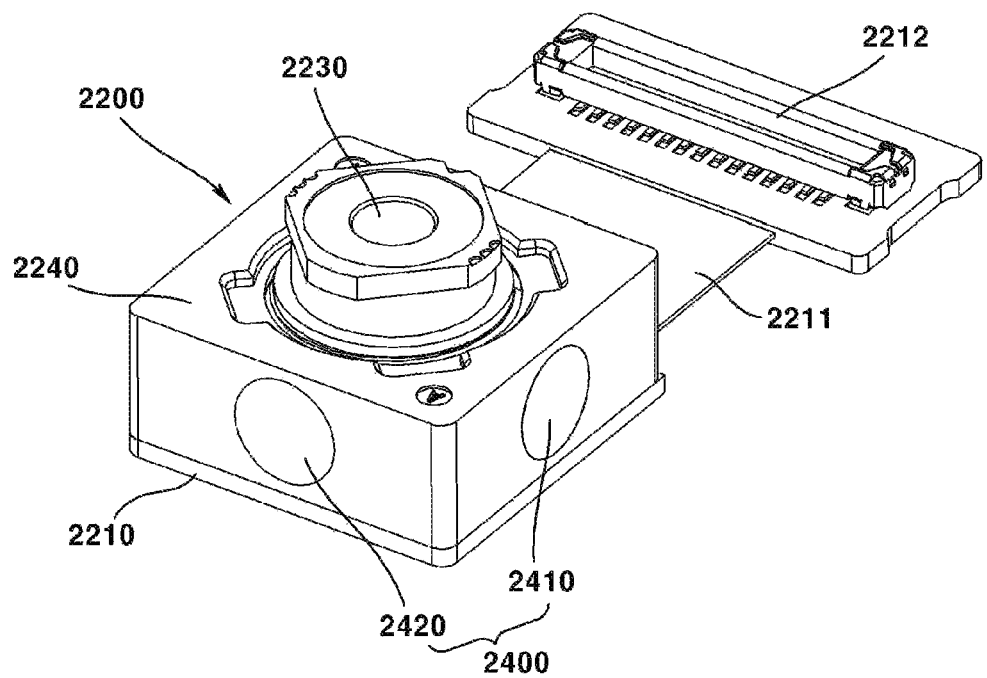
FIG. 30 is a perspective view of a first camera module of a camera device according to a second embodiment of the present invention.
Figure 31:
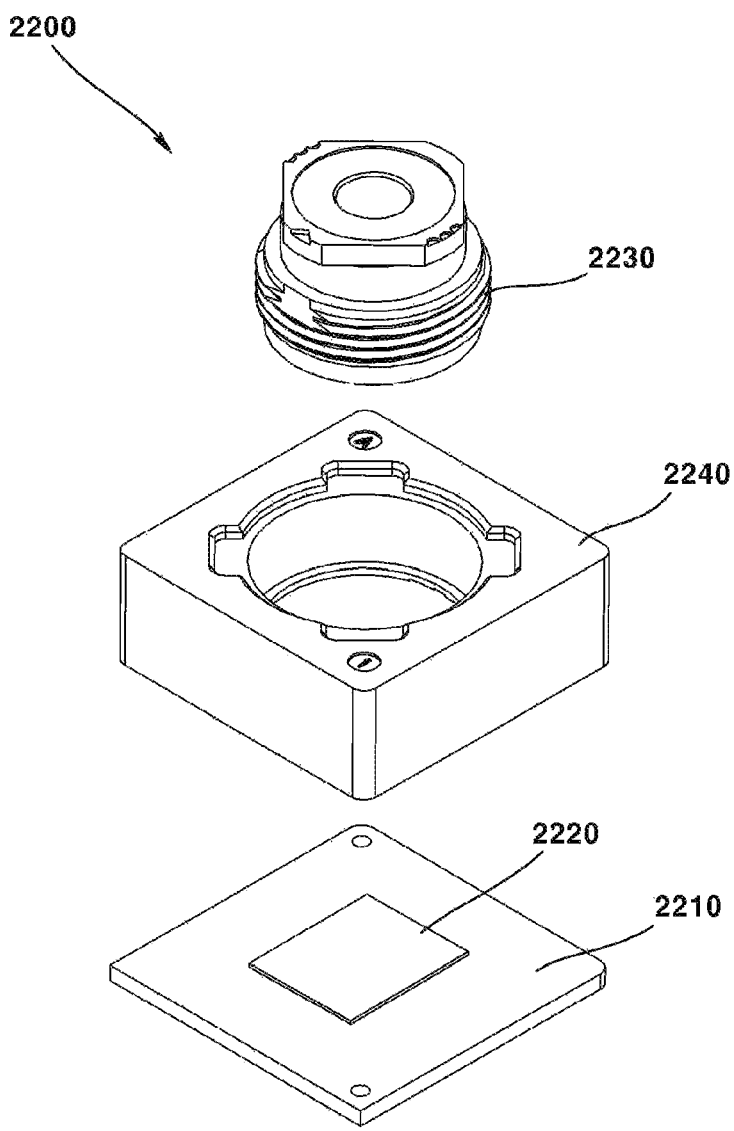
FIG. 31 is an exploded perspective view of a first camera module of a camera device according to a second embodiment of the present invention.
Figure 32:
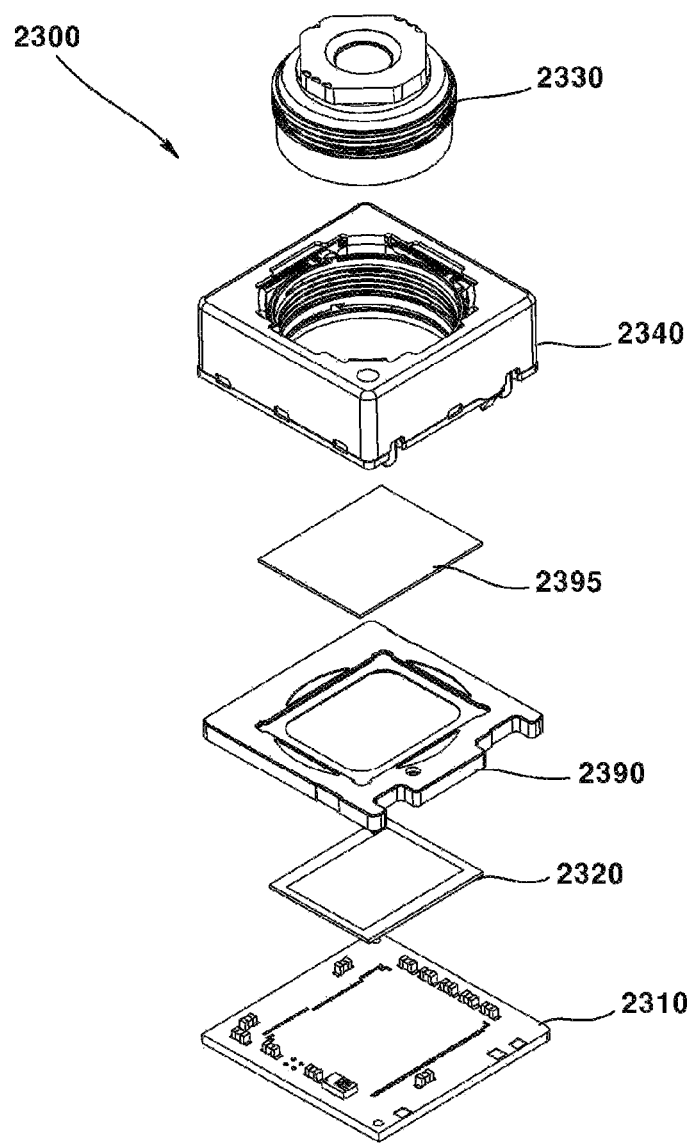
FIG. 32 is an exploded perspective view of a second camera module of a camera device according to a second embodiment of the present invention.
Figure 33:
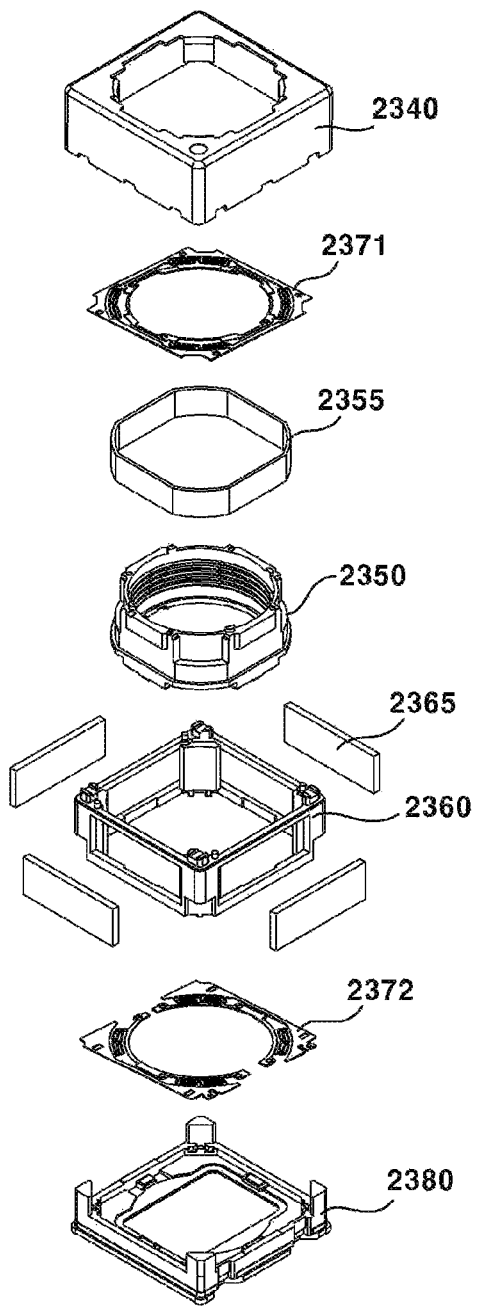
FIG. 33 is an exploded perspective view of a lens driving device of a second camera module of a camera device according to a second embodiment of the present invention.

FIG. 17 is a perspective view of a camera device according to a second embodiment of the present invention; FIG. 18 is a perspective view of a camera device according to a second embodiment of the present invention in a different direction from that of FIG. 17; FIG. 19 is a plan view of a camera device according to a second embodiment of the present invention; FIG. 20 is a bottom view of a camera device according to a second embodiment of the present invention; FIGS. 21 to 24 are side views of a camera device according to a second embodiment of the present invention; FIG. 25 is a cross-sectional view taken along line A-A of FIG. 19; FIG. 26 is a cross-sectional view taken along line B-B of FIG. 19; FIG. 27 is a cross-sectional view taken along line C-C of FIG. 19; FIG. 28 is an exploded perspective view of a camera device according to a second embodiment of the present invention; FIG. 29 is a perspective view of a bracket and a magnet of a camera device according to a second embodiment of the present invention; FIG. 30 is a perspective view of a first camera module of a camera device according to a second embodiment of the present invention; FIG. 31 is an exploded perspective view of a first camera module of a camera device according to a second embodiment of the present invention; FIG. 32 is an exploded perspective view of a second camera module of a camera device according to a second embodiment of the present invention; and FIG. 33 is an exploded perspective view of a lens driving device of a second camera module of a camera device according to a second embodiment of the present invention.

The camera device may comprise a dual camera module. The camera device may comprise a triple camera module. The camera device may comprise a plurality of camera modules.

The camera device may comprise a bracket 2100. The bracket 2100 may fix the first and second camera modules 2200 and 2300. The first and second camera modules 2200 and 2300 may be disposed in the bracket 2100. The bracket 2100 may be disposed to surround the first and second camera modules 2200 and 2300.

The bracket 2100 may comprise a plurality of sidewalls. The bracket 2100 may comprise four sidewalls. The bracket 2100 may comprise first to fourth sidewalls 2101, 2102, 2103, and 2104. The bracket 2100 may comprise a partition wall 2105 between the first hole 2110 and the second hole 2120. The partition wall 2105 may be disposed between the first camera module 2200 and the second camera module 2300. That is, the distance between the first camera module 2200 and the second camera module 2300 may be determined by the width of the partition wall 2105. At least a portion of the first to fourth sidewalls 2101, 2102, 2103, and 2104 may be formed to be rounded. A portion where the first to fourth sidewalls 2101, 2102, 2103, and 2104 meet may be formed to be round.

The bracket 2100 may comprise a hole. The bracket 2100 may comprise a plurality of holes. The bracket 2100 may comprise a first hole 2110 and a second hole 2120. A first camera module 2200 may be disposed in the first hole 2110. The first hole 2110 may be formed in a shape and size corresponding to that of the first camera module 2200. A second camera module 2300 may be disposed in the second hole 2120. The second hole 2120 may be formed in a shape and size corresponding to the second camera module 2300. The first hole 2110 and the second hole 2120 may penetrate the bracket 2100 in an optical axis direction. The first hole 2110 and the second hole 2120 may be spaced apart from each other. Each of the first hole 2110 and the second hole 2120 may be formed as a groove.

The bracket 2100 may comprise a groove 2130. The groove 2130 may be a magnet pocket. The groove 2130 may be formed on an outer surface of the bracket 2100. A second magnet 2500 may be disposed in the groove 2130. At least a portion of the second magnet 2500 may be accommodated in the groove 2130. The groove 2130 may be spaced apart from the edge of an outer surface of the bracket 2100. The width of the groove 2130 in a first direction may correspond to the width in a direction corresponding to the second magnet 2500. The width of the groove 2130 in a second direction may be greater than the width of the second magnet 2500 in a corresponding direction. Through this, the movement of the second magnet 2500 in a first direction inside the groove 2130 may be limited and may be moved in a second direction. The area of the bottom surface of the groove 2130 may be larger than the area of the opposite surface of the second magnet 2500. The second magnet 2500 may reciprocate in a uniaxial direction inside the groove 2130.

The groove 2130 may comprise a plurality of grooves. The groove 2130 may comprise two grooves. The grooves 2130 may be formed in a number corresponding to the second magnet 2500. In a modified embodiment, the groove 2130 may comprise three grooves.

The groove 2130 may comprise a first groove 2131. A first external magnet 2510 may be disposed in the first groove 2131. The first groove 2131 may be recessed in a first axis direction. The length of the first groove 2131 in an optical axis direction (refer to L1 of FIG. 21) may be longer than the length of the first groove 2131 in a second axis direction (refer to L2 of FIG. 21). The length L1 of the first groove 2131 in an optical axis direction may be longer than the length D1 of the first external magnet 2510 in an optical axis direction. In this case, the optical axis may be the z-axis and the second axis may be the y-axis. The first external magnet 2510 may move in an optical axis direction inside the first groove 2131. The length L2 of the first groove 2131 in a second axis direction may be the same as the length of the first external magnet 2510 in a second axis direction (refer to D1 of FIG. 21). Through this, movement of the first external magnet 2510 in an optical axis direction inside the first groove 2131 may be restricted. The length in an optical axis direction of the first external magnet 2510 may be the same as the length in an optical axis direction. The length L1 of the first groove 2131 in an optical axis direction may be within twice the length D1 of the first external magnet 2510 in an optical axis direction.

The groove 2130 may comprise a second groove 2132. A second external magnet 2520 may be disposed in the second groove 2132. The second groove 2132 may be recessed in a second axis direction. The length of the second groove 2132 in a first axis direction (refer to D3 of FIG. 22) may be longer than the length of the second groove 2132 in an optical axis direction (refer to D4 of FIG. 22). The length D3 in a first axis direction of the second groove 2132 may be longer than the length D2 in a first axis direction of the second external magnet 2520. At this time, the first axis may be the x-axis. The second external magnet 2520 may move in a first axial direction inside the second groove 2132. The length L4 of the second groove 2132 in an optical axis direction may be the same as the length of the second external magnet 2520 in an optical axis direction (refer to D2 of FIG. 22). Through this, movement of the second external magnet 2520 in an optical axis direction inside the second groove 2132 may be restricted. The length of the second external magnet 2520 in an optical axis direction may be the same as the length in a first axis direction. The length D3 of the second groove 2132 in a first axis direction may be within 2 times of the length D2 of the second external magnet 2520 in a first axis direction.

The bracket 2100 may comprise a step difference 2140. The step difference 2140 may be formed as a part of the upper surface is recessed. Step difference 2140 may be formed at an outer side of the second camera module 2300. The bracket 2100 may comprise an additional step difference 2141 formed in the step difference 2140. That is, the bracket 2100 may have two step differences 2140 and 2141 formed in two layers. The step differences 2140 and 2141 may be a structure for protecting OIS D-IC and gyro IC. The step differences 2140 and 2141 may serve as a shield can.

The bracket 2100 may comprise a step difference 2150. The bracket 2100 may comprise a step difference 2150 being formed as an upper surface of the bracket 2100 is recessed and in which the first camera module 2200 is disposed around the second camera module 2300. In the step difference 2150, an adhesive or a sealing member for fixing the first camera module 2200 and/or the second camera module 2300 to the bracket 2100 may be disposed. The adhesive or the sealing member may comprise an epoxy. The epoxy may comprise a shape corresponding to the step difference 2150.

The bracket 2100 may comprise a groove. The groove may be recessed from a side surface of the bracket 2100. The groove may be recessed from a lower surface of the bracket 2100. The bracket 2100 may prevent interference with the connection board 2211 of the first camera module 2200 and the connection substrate 2311 of the second camera module 2300 through the groove.

The camera device may comprise a first camera module 2200. The first camera module 2200 may be disposed in the first hole 2110 of the bracket 2100. The first camera module 2200 may be disposed side by side with the second camera module 2300. The first camera module 2200 may be disposed to face the same direction as the second camera module 2300. The first camera module 2200 may be a fixed focus module (FF) module having a fixed focus. The first camera module 2200 may have a different angle of view from the second camera module 2300. The first camera module 2200 may have a resolution different from that of the second camera module 2300. The image photographed by the first camera module 2200 may be overlapped at least in part with the image photographed by the second camera module 2300. The first camera module 2200 may be a sub-camera module.

The first camera module 2200 may comprise a board 2210. The board 2210 may be a circuit board. The board 2210 may be a printed circuit board (PCB). The board 2210 may comprise a rigid printed circuit board. A holder 2240 may be disposed in the board 2210. An image sensor 2220 may be disposed in the board 2210. Various circuits, devices, control units, and the like may be provided on the board 2210 to convert an image formed on the image sensor 2220 into an electrical signal and transmit it to an external device. The first camera module 2200 may comprise a connection board 2211. The connection board 2211 may connect the board 2210 and the connector 2212. The connection board 2211 may be a flexible printed circuit board (FPCB). The first camera module 2200 may comprise a connector 2212. The connector 2212 may be electrically connected to the board 2210. The connector 2212 may comprise a port for electrically connecting to an external device. The board 2210 may be a printed circuit board 3010 according to the third embodiment.

The board 2210 of the first camera module 2200 may be disposed to generate a height difference from the board 2310 of the second camera module 2300. The board 2210 of the first camera module 2200 may be disposed at a higher position than the board 2310 of the second camera module 2300. The board 2310 of the second camera module 2300 may be disposed at a lower position than the board 2210 of the first camera module 2200. The first camera module 2200 may be disposed at a higher position than the second camera module 2300. The second camera module 2300 may be disposed at a lower position than the first camera module 2200.

The first camera module 2200 may comprise an image sensor 2220. The image sensor 2220 may have a configuration in which light passing through the lens 2230 and the filter is incident to form an image. The image sensor 2220 may be disposed in the board 2210. The image sensor 2220 may be disposed above the board 2210. The image sensor 2220 may be disposed on the board 2210. The image sensor 2220 may be mounted on the board 2210. The image sensor 2220 may be electrically connected to the board 2210. For example, the image sensor 2220 may be coupled to the board 2210 by a surface mounting technology (SMT). As another example, the image sensor 2220 may be coupled to the board 2210 by a flip chip technology. The image sensor 2220 may be disposed so that the lens and the optical axis coincide. That is, the optical axis of the image sensor 2220 and the optical axis of the lens may be aligned. The image sensor 2220 may convert light irradiated to the effective image area of the image sensor 2220 into an electrical signal. The image sensor 2220 may be any one among a charge coupled device (CCD), a metal oxide semi-conductor (MOS), a CPD, and a CID.

The first camera module 2200 may comprise a lens module. The lens module may comprise at least one lens 2230. The lens 2230 may be disposed at a position corresponding to the image sensor 2220. The lens module may comprise a lens 2230 and a barrel. The lens module may be coupled to the holder 2240. The lens module may be coupled to the holder 2240 by screws and/or adhesives. The lens module may be fixed to the holder 2240.

The first camera module 2200 may comprise a holder 2240. The holder 2240 may be disposed in the board 2210. The holder 2240 may fix the lens 2230. The holder 2240 may comprise a hole. A lens 2230 may be disposed in the hole of the holder 2240. The inner circumferential surface of the hole of the holder 2240 may be formed with a screw thread. The holder 2240 may be formed of an insulating material. The first camera module 2200 may comprise a cover member separate from the holder 2240. The cover member may comprise an upper plate and a side plate being extended downwardly from the upper plate. The cover member may comprise a shield can made of metal.

The camera device may comprise a second camera module 2300. The second camera module 2300 may be disposed in the second hole 2120 of the bracket 2100. The second camera module 2300 may have a larger volume than the first camera module 2200. The first camera module 2200 and the second camera module 2300 may be disposed such that the optical axis of the first camera module 2200 and the optical axis of the second camera module 2300 are parallel. The second camera module 2300 may be a main camera module.

The second camera module 2300 comprises a cover member 2340, a bobbin 2350 being disposed inside the cover member 2340, a coil 2335 being disposed inside the cover member 2340 and moving the bobbin 2350, and a magnet 2365.

The second camera module 2300 may comprise a board 2310. The board 2310 may be a circuit board. The board 2310 may be a printed circuit board (PCB). The board 2310 may comprise a rigid printed circuit board. A lens driving device may be disposed in the board 2310. A lens driving device may be disposed on the board 2310. The lens driving device may be disposed above the board 2310. An image sensor 2320 may be disposed in the board 2310. Various circuits, devices, control units, and the like may be provided in the board 2310 to convert an image being formed in the image sensor 2320 into an electrical signal and transmit it to an external device. The second camera module 2300 may comprise a connection board 2311. The connection board 2311 may connect the board 2310 and the connector 2312. The connection board 2311 may be a flexible printed circuit board (FPCB). The second camera module 2300 may comprise a connector 2312. The connector 2212 may be electrically connected to the board 2310. The connector 2312 may comprise a port for electrically connecting to an external device. The board 2310 may be a printed circuit board 3010 according to a third embodiment.

The second camera module 2300 may comprise an image sensor 2320. The image sensor 2320 may have a configuration in which light passing through the lens 2330 and the filter 2395 is incident to form an image. The image sensor 2320 may be disposed in the board 2310. The image sensor 2320 may be disposed on the board 2310. The image sensor 2320 may be disposed above the board 2310. The image sensor 2320 may be mounted on the board 2310. The image sensor 2320 may be electrically connected to the board 2310. For example, the image sensor 2320 may be coupled to the board 2310 by a surface mounting technology (SMT). As another example, the image sensor 2320 may be coupled to the board 2310 by a flip chip technology. The image sensor 2320 may be disposed such that the lens and the optical axis coincide. That is, the optical axis of the image sensor 2320 and the optical axis of the lens may be aligned. The image sensor 2320 may convert light irradiated to the effective image area of the image sensor 2320 into an electrical signal. The image sensor 2220 may be any one among a charge coupled device (CCD), a metal oxide semi-conductor (MOS), a CPD, and a CID.

The second camera module 2300 may comprise a lens module. The lens module may comprise at least one lens 2330. The lens 2330 may be disposed at a position corresponding to the image sensor 2320. The lens module may comprise a lens 2330 and a barrel. The lens module may be coupled to the bobbin 2350. The lens module may be coupled to the bobbin 2350 by screw-coupling and/or adhesive. The lens module may move together with the bobbin 2350. Through this, the distance between the lens 2330 and the image sensor 2320 may be changed.

The second camera module 2300 may comprise a lens driving device. The second camera module 2300 may comprise a voice coil motor. The second camera module 2300 may comprise an AF driving actuator that performs an auto focus (AF) function. The second camera module 2300 may comprise an OIS driving actuator that performs optical image stabilization (OIS) function.

The lens driving device may comprise a cover member 2340. The cover member 2340 may comprise a 'cover can'. The cover member 2340 may be disposed at an outer side of the housing 2360. The cover member 2340 may be coupled to the base 2370. The cover member 2340 may accommodate the housing 2360 therein. The cover member 2340 may form the outer appearance of the lens driving device. The cover member 2340 may have a hexahedral shape with an open lower surface. The cover member 2340 may be a non-magnetic material. The cover member 2340 may be formed of metal. The cover member 2340 may be formed of a metal plate. The cover member 2340 may be connected to a ground terminal of the board 2310. Through this, the cover member 2340 may be grounded. The cover member 2340 may block electromagnetic interference (EMI). At this time, the cover member 2340 may be referred to as an 'EMI shield can'.

The cover member 2340 may comprise an upper plate and a side plate. The cover member 2340 may comprise an upper plate comprising a hole, and a side plate being extended downward from an outer circumference or edge of the upper plate. The lower end of the side plate of the cover member 2340 may be disposed on the step portion of the base 2370. The inner surface of the side plate of the cover member 2340 may be fixed to the base 2370 by an adhesive.

The lens driving device may comprise a bobbin 2350. The bobbin 2350 may be disposed inside the housing 2360. The bobbin 2350 may be disposed in the hole of the housing 2360. The bobbin 2350 may be movably coupled to the housing 2360. The bobbin 2350 may move in an optical axis direction against the housing 2360. A lens 2330 may be coupled to the bobbin 2350. The bobbin 2350 and the lens 2330 may be coupled by screw-coupling and/or adhesive. A coil 2355 may be coupled to the bobbin 2350. An upper elastic member 2381 may be coupled to an upper portion or upper surface of the bobbin 2350. A lower elastic member 2382 may be coupled to a lower or lower surface of the bobbin 2350. The bobbin 2350 may be coupled to the upper elastic member 2381 and/or the lower elastic member 2382 by heat fusion and/or adhesive. The adhesive coupling the bobbin 2350 and the lens, and the bobbin 2350 and the elastic member 2380 may be an epoxy being cured by at least one among ultraviolet rays (UV), heat, and a laser.

The lens driving device may comprise a coil 2355. The coil 2355 may be an 'AF driving coil' used for AF driving. The coil 2355 may be disposed in the bobbin 2350. The coil 2355 may be disposed between the bobbin 2350 and the housing 2360. The coil 2355 may be disposed on an outer side surface or an outer circumferential surface of the bobbin 2350. The coil 2355 may be wound directly in the bobbin 2350. Or, the coil 2355 may be coupled to the bobbin 2350 in a state of being directly wound. The coil 2355 may face the magnet 2365. The coil 2355 may be disposed to face the magnet 2365. The coil 2355 may interact with the magnet 2365 electromagnetically. In this case, when a current is supplied to the coil 2355 and thereby an electromagnetic field around the coil 2355 formed, electromagnetic interaction between the coil 2355 and the magnet 2365 may cause the coil 2355 to move against the magnet 2365. The coil 2355 may be formed as a single coil. Or, the coil 2355 may comprise a plurality of coils being spaced apart from one another.

The coil 2355 may comprise a pair of lead wires for supplying power. At this time, one end portion (leading wire) of the coil 2355 is coupled to the first lower elastic unit and the other end portion (leading line) of the coil 2355 may be coupled to the second lower elastic unit. That is, the coil 2355 may be electrically connected to the lower elastic member 2382. In more detail, the coil 2355 may receive power through the lower elastic member 2382.

The lens driving device may comprise a housing 2360. The housing 2360 may be coupled to the base 2370. The housing 2360 may be disposed at an outer side of the bobbin 2350. The housing 2360 may accommodate at least a portion of the bobbin 2350. The housing 2360 may be disposed inside the cover member 2340. The housing 2360 may be disposed between the cover member 2340 and the bobbin 2350. The housing 2360 may be formed of a material different from that of the cover member 2340. The housing 2360 may be formed of an insulating material. The housing 2360 may be formed of an injection-molded material. A magnet 2365 may be disposed in the housing 2360. The housing 2360 and the magnet 2365 may be coupled by an adhesive. An upper elastic member 2381 may be coupled to an upper portion or upper surface of the housing 2360. A lower elastic member 2382 may be coupled to a lower portion or lower surface of the housing 2360. The housing 2360 may be coupled to an upper portion and the lower elastic members 2510 and 2520 by heat fusion and/or an adhesive. The adhesive for coupling the housing 2360 and the magnet 2365, the housing 2360, and the elastic member 2380 may be an epoxy being cured by any one or more among ultraviolet (UV), heat, and laser.

The lens driving device may comprise a magnet 2365. The magnet 2365 may be disposed in the housing 2360. The magnet 2365 may be fixed to the housing 2360 by an adhesive. The magnet 2365 may be disposed between the bobbin 2350 and the housing 2360. The magnet 2365 may face the coil 2355. The magnet 2365 may interact with the coil 2355 electromagnetically. The magnet 2365 may be used for AF driving. The magnet 2365 may be disposed on a side surface of the housing 2360. At this time, the magnet 2365 may be a flat magnet having a flat plate shape. Or, the magnet 2365 may be disposed in a corner portion of the housing 2360. At this time, the magnet 2365 may be a corner magnet having an inner side surface having a larger hexahedral shape than an outer side surface.

The lens driving device may comprise a base 2370. The base 2370 may be disposed below the bobbin 2350. The base 2370 may be spaced apart from the bobbin 2350. The base 2370 may be disposed below the housing 2360. The base 2370 may be coupled to the cover member 2340. The base 2370 may be disposed above the board 2310.

The lens driving device may comprise an elastic member 2380. The elastic member 2380 may have elasticity at least in part. The elastic member 2380 may be formed of metal. The elastic member 2380 may be formed of a conductive material. The elastic member 2380 may connect the bobbin 2350 and the housing 2360. The elastic member 2380 may be coupled to the bobbin 2350 and the housing 2360. The elastic member 2380 may elastically support the bobbin 2350. The elastic member 2380 may movably support the bobbin 2350. The elastic member 2380 may support the movement of the bobbin 2350 during AF driving. That is, the elastic member 2380 may comprise an 'AF support member'.

The elastic member 2380 may comprise an upper elastic member 2381. The upper elastic member 2381 may connect the housing 2360 and the bobbin 2350. The upper elastic member 2381 may be coupled to an upper portion of the bobbin 2350 and an upper portion of the housing 2360. The upper elastic member 2381 may be coupled to an upper surface of the bobbin 2350. The upper elastic member 2381 may be coupled to an upper surface of the housing 2360. The upper elastic member 2381 may be formed with a leaf spring. The upper elastic member 2381 may comprise an inner side portion coupled to the bobbin 2350, an outer side portion coupled to the housing 2360, and a connection portion connecting the inner side portion and the outer side portion.

The elastic member 2380 may comprise a lower elastic member 2382. The lower elastic member 2382 may be disposed below the upper elastic member 2381. The lower elastic member 2382 may connect the bobbin 2350 and the base 2370. The lower elastic member 2382 may connect the bobbin 2350 and the housing 2360. The lower elastic member 2382 may be disposed below the bobbin 2350. The lower elastic member 2382 may be coupled to a lower surface of the bobbin 2350. The lower elastic member 2382 may be coupled to a upper surface of the base 2370. The lower elastic member 2382 may be formed with a leaf spring. The lower elastic member 2382 may comprise an inner side portion coupled to the bobbin 2350, an outer side portion coupled to the base 2370, and a connection portion connecting the inner side portion and the outer side portion. The lower elastic member 2382 may comprise first and second lower elastic units spaced apart from each other.

The second camera module 2300 may comprise a sensor base 2390. The sensor base 2390 may be disposed between the lens driving device and the board 2310. The sensor base 2390 may comprise a protruded part in which the filter 2395 is disposed. An opening may be formed in a portion of the sensor base 2390 where the filter 2395 is disposed so that light passing through the filter 2395 may be incident on the image sensor 2320. The adhesive member may couple or attach the base 2370 of the lens driving device to the sensor base 2390. The adhesive member may additionally serve to prevent foreign substances from being introduced into the lens driving device. The adhesive member may comprise any one or more among an epoxy, a thermosetting adhesive, and an ultraviolet curable adhesive.

The second camera module 2300 may comprise a filter 2395. The filter 2395 may serve to block light of a specific frequency band among the light passing through the lens module from being incident on the image sensor 2320. The filter 2395 may be disposed perpendicular to the optical axis. The filter 2395 may be disposed between the lens 2330 and the image sensor 2320. The filter 2395 may be disposed in the sensor base 2390. In a modified embodiment, the filter 2395 may be disposed in the base 2370. The filter 2395 may comprise an infrared filter. The infrared filter may block light in the infrared region from being incident on the image sensor 2320.

The second camera module 2300 may comprise a motion sensor. The motion sensor may be mounted on the board 2310. The motion sensor may be electrically connected to the control unit through a circuit pattern provided in the board 2310. The motion sensor may output rotational angular velocity information due to the movement of the camera module. The motion sensor may comprise a 2-axis or 3-axis gyro sensor, or an angular velocity sensor.

The second camera module 2300 may comprise a control unit. The control unit may be disposed in the board 2310. The control unit may be electrically connected to the coil 2335 of the lens driving device. The control unit may individually control the direction, intensity, and amplitude of the current supplied to the coil 2335. The control unit may control the lens driving device to perform an autofocus function and/or a hand tremble correction function. Furthermore, the control unit may perform autofocus feedback control and/or hand tremble correction feedback control for the lens driving device.

The camera device may comprise a first magnet 2400. The first magnet 2400 may comprise a permanent magnet. The first magnet 2400 may be disposed at an outer surface of the first camera module 2200. The first magnet 2400 first magnet 2400 may be inserted and injected into the holder 2240 of the first camera module 2200. The first magnet 2400 may be integrally formed with the first camera module 2200.

The first magnet 2400 may comprise a plurality of magnets. The first magnet 2400 may comprise two magnets. The first magnets 2400 may be formed in a number corresponding to the number of the second magnets 2500. In a modified embodiment, the first magnet 2400 may comprise three magnets.

The first magnet 2400 may comprise a first internal magnet 2410 and a second internal magnet 2420. The first internal magnet 2410 may be disposed such that a first axis perpendicular to the optical axis of the first camera module 2200 passes. The second internal magnet 2420 may be disposed such that an optical axis of the first camera module 2200 and a second axis perpendicular to the first axis pass. At this time, the optical axis may be the z-axis, the first axis may be the x-axis, and the second axis may be the y-axis. Or, the first axis may be the y-axis and the second axis may be the x-axis.

The first magnet 2400 may comprise: a first internal magnet 2410 being disposed on a first outer side surface of the first camera module 2200; and a second internal magnet 2420 being disposed on a second outer side surface inclinedly to a first outer side surface of the first camera module 2200. At this time, the first outer side surface and the second outer side surface may be disposed adjacent to each other. The first outer side surface and the second outer side surface may be disposed neighbouring to each other. The first outer side surface and the second outer side surface may be orthogonal to each other.

The second magnet 2500 may comprise a permanent magnet. The second magnet 2500 may be disposed on an outer surface of the bracket 2100 at a position corresponding to the first magnet 2400. The second magnet 2500 may be movable inside the groove 2130 of the bracket 2100. An attractive force may act between the first magnet 2400 and the second magnet 2500. That is, a mutual attraction force may act between the first magnet 2400 and the second magnet 2500. Accordingly, the first magnet 2400 may also be pulled when the second magnet 2500 moves. That is, the first magnet 2400 may move together with the second magnet 2500.

In this embodiment, when the second magnet 2500 moves inside the groove 2130 of the bracket 2100, the first camera module 2200 may move together with the second magnet 2500 by the attractive force between the first magnet 2400 and the second magnet 2500. When the second magnet 2500 moves inside the groove 2130 of the bracket 2100, the first camera module 2200 may move to correspond to the second magnet 2500 by the attractive force between the first magnet 2400 and the second magnet 2500. Through this, in the present embodiment, the first camera module 2200 can be finely adjusted by moving the second magnet 2500 while the first camera module 2200 is inserted into the bracket 2100.

The first magnet 2400 and the second magnet 2500 may be formed in corresponding shapes. The first magnet 2400 may be formed to have a circular surface facing the second magnet 2500. The second magnet 2500 may be formed to have a circular surface facing the first magnet 2400. That is, each of the first magnet 2400 and the second magnet 2500 may be in the shape of a cylinder with a thin height or thickness. That is, each of the first magnet 2400 and the second magnet 2500 may be in the shape of a coin.

The second magnet 2500 may comprise a plurality of magnets. The second magnet 2500 may comprise two magnets. The second magnets 2500 may be formed in a number corresponding to the number of the first magnets 2400. As a modified embodiment, the second magnet 2500 may comprise three magnets.

The second magnet 2500 may comprise a first external magnet 2510 and a second external magnet 2520. The first external magnet 2510 and the second external magnet 2520 may move in different directions. The first external magnet 2510 may be disposed so that the first axis passes. The second external magnet 2520 may be disposed so that the second axis passes. The second internal magnet 2420 and the second external magnet 2520 may be disposed in the first axis direction. The first internal magnet 2410 and the first external magnet 2510 may be disposed in a second axis direction.

The second magnet 2500 may comprise a first external magnet 2510 being disposed on an outer surface of the first sidewall 2101 of the bracket 2100. The second magnet 2500 may comprise a second external magnet 2520 being disposed on an outer surface of the second sidewall 2102 of the bracket 2100.

The first internal magnet 2410 and the first external magnet 2510 may be disposed at positions corresponding to each other with the first sidewall 2101 of the bracket 2100 interposed therebetween. An attractive force may act between the first internal magnet 2410 and the first external magnet 2510. Through this, the first internal magnet 2410 may also move when the first external magnet 2510 moves.

The second internal magnet 2420 and the second external magnet 2520 may be disposed at positions corresponding to each other with the second sidewall 2102 of the bracket 2100 interposed therebetween. An attractive force may act between the second internal magnet 2420 and the second external magnet 2520. Through this, the second internal magnet 2420 may also move when the second external magnet 2520 moves.

The first external magnet 2510 may be movable in an optical axis direction. The first internal magnet 2410 and the first camera module 2200 may move together when the first external magnet 2510 moves in an optical axis direction. That is, the first external magnet 2510 may move the first camera module 2200 in an optical axis direction. Movement of the first external magnet 2510 may be restricted in a first axis direction perpendicular to the optical axis and a second axis direction perpendicular to the optical axis and the first axis.

As a modified embodiment, the first external magnet 2510 may be movable in an optical axis direction and a second axis direction. In this case, the first external magnet 2510 may move the first camera module 2200 in an optical axis direction and a second axis direction. Furthermore, in an embodiment, the first external magnet 2510 may move in a direction along any one among the optical axis, the first axis, and the second axis. In this case, movement may be restricted in the directions of the other two axes except for one axis.

The second external magnet 2520 may be movable in a first axis direction. The second internal magnet 2420 and the first camera module 2200 may move together when the second external magnet 2520 moves in the first axis direction. That is, the second external magnet 2520 may move the first camera module 2200 in a first axis direction. Movement of the second external magnet 2520 in an optical axis direction and a second axis direction may be restricted. In an embodiment, the second external magnet 2520 may move in a direction along any one among the optical axis, the first axis, and the second axis. In this case, movement may be restricted in the directions of the other two axes except for one axis. However, the second external magnet 2520 may be movable in a direction different from that of the first external magnet 2510.

The camera device may comprise a sealing member 2600. The sealing member 2600 may be disposed between the second camera module 2300 and the bracket 2100. The sealing member 2600 may fix the second camera module 2300 to the bracket 2100. The sealing member 2600 may comprise an epoxy. The sealing member 2600 may be an adhesive member. The sealing member 2600 may have viscosity. The sealing member 2600 may be non-conductive. The sealing member 2600 may be disposed at a step difference 2150 of the bracket 2100.

In the present embodiment, the optical axis of the first camera module 2200 may be aligned with an optical axis of the second camera module 2300 by moving the second magnet 2500 up, down, left and right. In the comparative example, the first camera module 2200 may be fixed to the bracket 2100 by a sealing member 2600 or an adhesive member. In this case, the first camera module 2200 cannot be finely adjusted after curing the sealing member 2600 or the adhesive member. However, in this embodiment, the first camera module 2200 may be finely adjusted at a desired stage of the assembly process. Furthermore, in this embodiment, after aligning the optical axis of the first camera module 2200 with the optical axis of the second camera module 2300 using the second magnet 2500, the first camera module 2200 may be fixed to the bracket 2100 using a sealing member 2600 or an adhesive member.

The manufacturing process of the present embodiment may be performed according to the following procedure. In a first step, a first camera module 2200 having a fixed focus (ff) and a second camera module 2300 having an auto focus (AF) are prepared. In a second step, the second camera module 2300 is fixed to the bracket 2100. In a third step, the first camera module 2200 is inserted into the bracket 2100. As a fourth step, the first camera module 2200 is finely adjusted through the second magnet 2500.

In the present embodiment, since the first magnet 2400 can be fixed by an insert method when the holder 2240 of the first camera module 2200 is injected, it has the advantage that a separate assembly process is not required. In addition, the present embodiment has the advantage of easy dispersion of the magnet fastening position. In addition, in the present embodiment, the position of the magnet is managed, so that it can be easy to manage the center of gravity when assembling with the bracket 2100. In addition, according to the present embodiment, it is possible to perform precise control by adjusting the number of magnets according to a module concept. The present embodiment is a concept of finely assembling the first camera module 2200 in the two axis directions using two pairs of magnets, but as a modified embodiment, it is possible to finely assemble the first camera module 2200 in three axis directions using three pairs of magnets.

According to the present embodiment, it may be easy to implement a magnet pocket in the bracket 2100. In addition, the first camera module 2200 has an advantage in that it can be fixed to the bracket 2100 without using a sealing member 2600 such as an epoxy. However, it is also possible to fix the first camera module 2200 to the bracket 2100 with an additional sealing member 2600.

Hereinafter, an optical apparatus according to a second embodiment of the present invention will be described with reference to the drawings.

Figure 34:
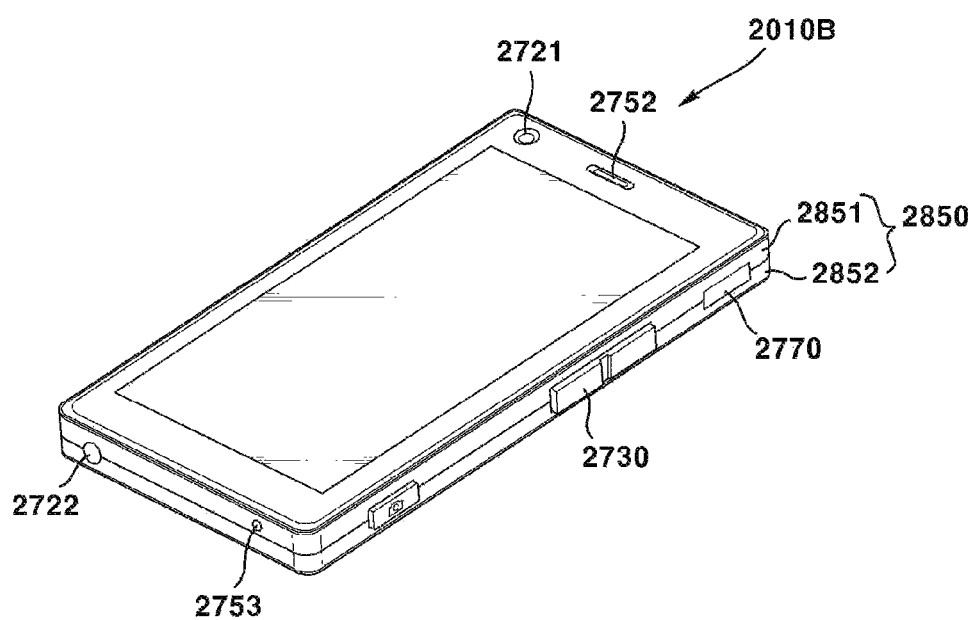
FIG. 34 is a perspective view illustrating an optical apparatus according to a second embodiment of the present invention.
Figure 35:
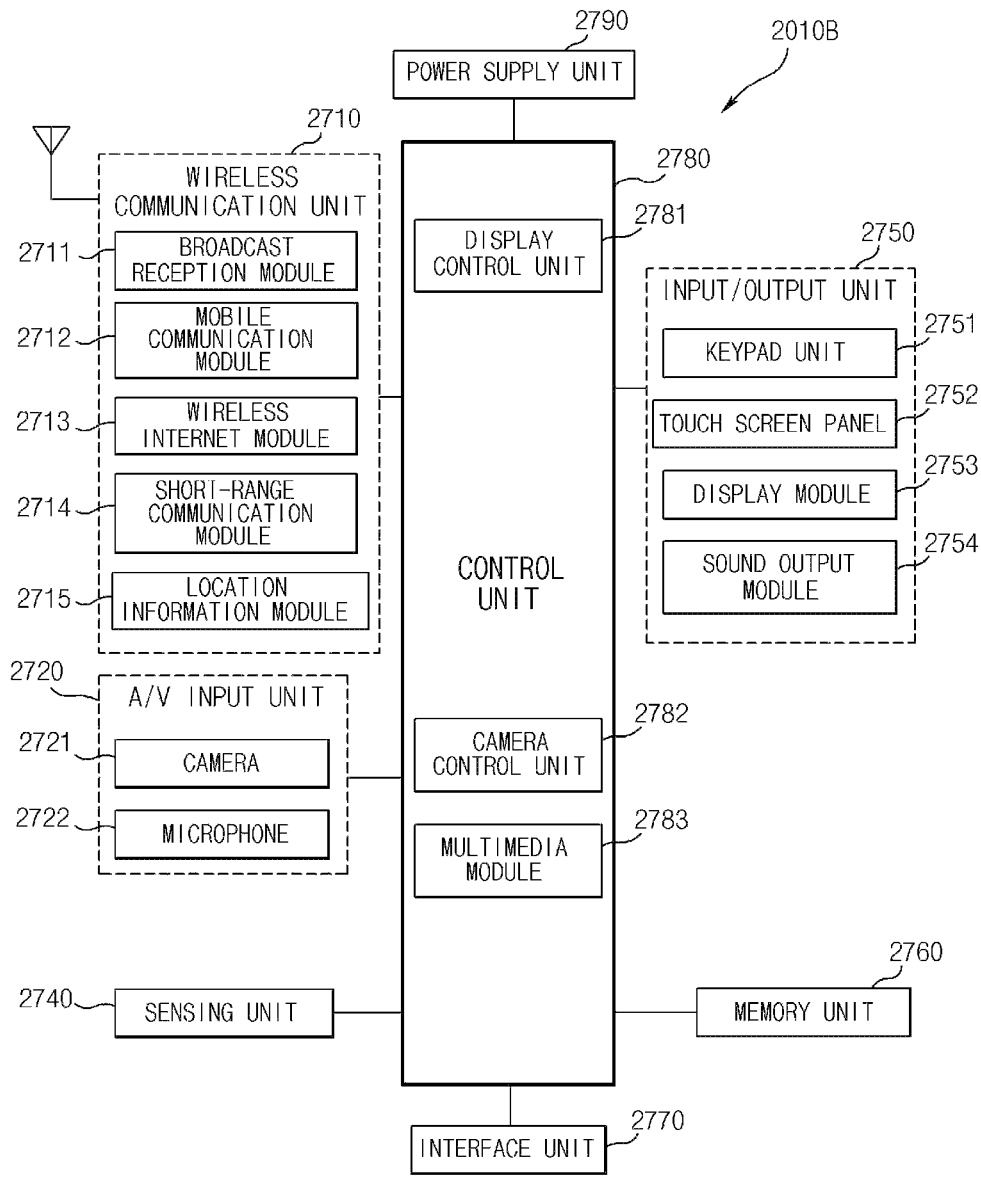
FIG. 35 is a block diagram of an optical apparatus according to a second embodiment of the present invention.

FIG. 34 is a perspective view illustrating an optical apparatus according to a second embodiment of the present invention; and FIG. 35 is a block diagram of an optical apparatus according to a second embodiment of the present invention.

The optical apparatus 2010B may comprise a portable terminal. The optical apparatus 2010B may be any one among a hand phone, a portable phone, a smart phone, a portable smart device, a digital camera, a laptop computer, a digital broadcasting terminal, a personal digital assistant (PDA), a portable multimedia player (PMP), and navigation. However, the type of the optical apparatus 2010B is not limited thereto, and any device for photographing a video or a picture may be comprised in the optical apparatus 2010B.

The optical apparatus 2010B may comprise a main body 2850. The main body 2850 may have a bar shape. Or, the main body 2850 may have various structures, such as a slide type, a folder type, a swing type, a swivel type, and the like in which two or more sub-bodies are coupled to be relatively movable. The main body 2850 may comprise a case (casing, housing, and cover) forming an outer appearance. For example, the main body 2850 may comprise a front case 2851 and a rear case 2852. Various electronic components of the optical apparatus 2010B may be embedded in a space formed between the front case 2851 and the rear case 2852. A display module 2753 may be disposed on one surface of the main body 2850. A camera 2721 may be disposed on one or more surfaces of one surface and the other surface being disposed at an opposite side of the one surface of the main body 2850.

In the present embodiment, the camera radar complex device may be disposed in a space corresponding to the bezel between the edge of the main body 2860 and the display.

The optical apparatus 2010B may comprise a wireless communication unit 2710. The wireless communication unit 2710 may comprise one or more modules enabling wireless communication between the optical apparatus 2010B and the wireless communication system, or between the optical apparatus 2010B and the network in which the optical apparatus 2010B is located. For example, the wireless communication unit 2710 may comprise any one or more among a broadcast reception module 2711, a mobile communication module 2712, a wireless Internet module 2713, a short-range communication module 2714, and a location information module 2715.

The optical apparatus 2010B may comprise an A/V input unit 2720. The A/V input unit 2720 is for inputting an audio signal or a video signal and may comprise any one or more of a camera 2721 and a microphone 2722. At this time, the camera 2721 may comprise a camera module according to the present embodiment.

The optical apparatus 2010B may comprise a sensing unit 2740. The sensing unit 2740 may generate a sensing signal for controlling the operation of the optical apparatus 2010B by detecting the current state of the optical apparatus 2010B such as the opening/closing state of the optical apparatus 2010B, the position of the optical apparatus 2010B, the presence or absence of user contact, the orientation of the optical apparatus 2010B, acceleration/deceleration of the optical apparatus 2010B, and the like. For example, when the optical apparatus 2010B is in the form of a slide phone, it is possible to sense whether the slide phone is opened or closed. In addition, it is responsible for sensing functions related to whether the power supply unit 2790 is supplied with power, whether the interface unit 2770 is coupled to an external device, and the like.

The optical apparatus 2010B may comprise an input/output unit 2750. The input/output unit 2750 may be configured to generate an input or output related to visual, auditory, or tactile sense. The input/output unit 2750 may generate input data for controlling the operation of the optical apparatus 2010B, and may output information processed by the optical apparatus 2010B.

The input/output unit 2750 may comprise any one or more among a keypad unit 2751, a touch screen panel 2752, a display module 2753, and a sound output module 2754. The keypad unit 2751 may generate input data in response to a keypad input. The touch screen panel 2752 may convert a change in capacitance generated due to a user's touch on a specific area of the touch screen into an electrical input signal. The display module 2753 may output an image photographed by the camera 2721. The display module 2753 may comprise a plurality of pixels whose color changes according to an electrical signal. For example, the display module 2753 may comprise at least one among a liquid crystal display, a thin film transistor liquid crystal display, an organic light emitting diode, a flexible display, and a 3D display. The sound output module 2754 may output audio data received from the wireless communication unit 2710 in a call signal reception, a call mode, a recording mode, a voice recognition mode, or a broadcast reception mode, or stored in the memory unit 2760.

The optical apparatus 2010B may comprise a memory unit 2760. A program for processing and controlling the control unit 2780 may be stored in the memory unit 2760. In addition, the memory unit 2760 may store input/output data, for example, any one or more of a phone book, a message, an audio, a still image, a photo, and a moving picture. The memory unit 2760 may store an image photographed by the camera 2721, for example, a photo or a video.

The optical apparatus 2010B may comprise an interface unit 2770. The interface unit 2770 serves as a path for connecting to an external device being connected to the optical apparatus 2010B. The interface unit 2770 may receive data from an external device, receive power and transmit it to each component inside the optical apparatus 2010B, or transmit data inside the optical apparatus 2010B to the external device. The interface unit 2770 may comprise any one or more among a wired/wireless headset port, an external charger port, a wired/wireless data port, a memory card port, a port for connecting a device equipped with an identification module, and an audio I/O port, a video I/O port, and an earphone port.

The optical apparatus 2010B may comprise a control unit 2780. The control unit 2780 may control the overall operation of the optical apparatus 2010B. The control unit 2780 may perform related control and processing for voice call, data communication, video call, and the like. The control unit 2780 may comprise a display control unit 2781 that controls a display module 2753 that is a display of the optical apparatus 2010B. The control unit 2780 may comprise a camera control unit 2782 that controls the camera module. The control unit 2780 may comprise a multimedia module 2783 for playing multimedia. The multimedia module 2783 may be provided inside the control unit 2180 or may be provided separately from the control unit 2780. The control unit 2780 may perform a pattern recognition process capable of recognizing a handwriting input or a drawing input performed on the touch screen as characters and images, respectively.

The optical apparatus 2010B may comprise a power supply unit 2790. The power supply unit 2790 may receive external power or internal power by the control of the control unit 2780 to supply power required for operation of each component.

The bracket 2100 and the magnet according to a second embodiment of the present invention can be used to dually dispose the camera module according to a first embodiment and the camera module according to a third embodiment of the present invention. That is, any one of a camera module according to a second embodiment and a camera module according to a third embodiment of the present invention replaces the first camera module 2200 and another one may replace the second camera module 2300.

Hereinafter, the configuration of a printed circuit board according to a third embodiment of the present invention will be described with reference to the drawings.

Figure 36A:
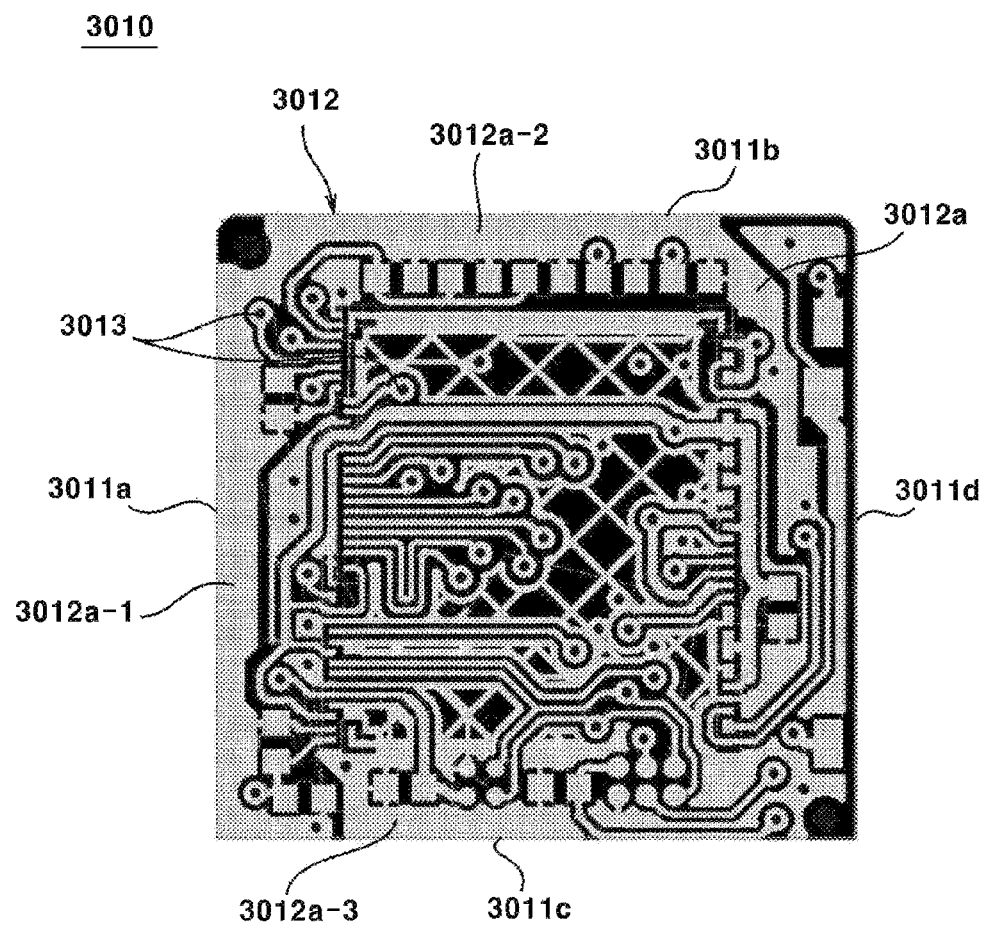
FIG. 36a is a plan view of a printed circuit board according to a third embodiment of the present invention.
Figure 36B:
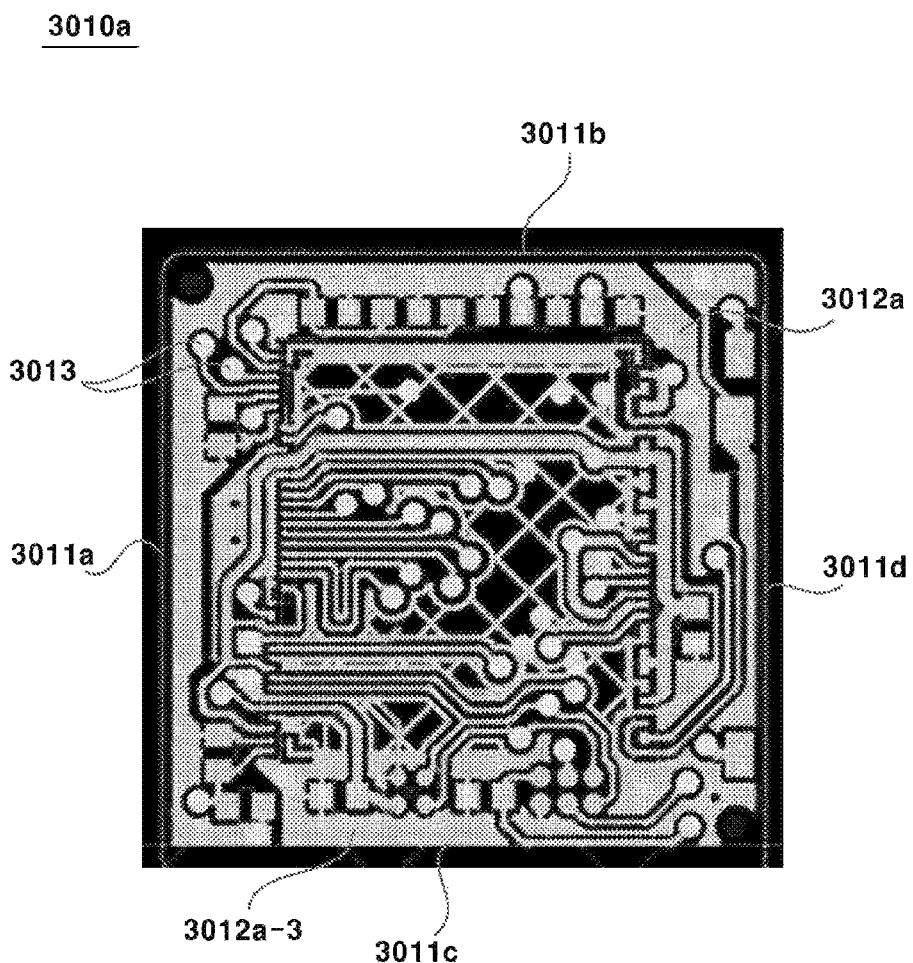
FIG. 36b is a plan view of a printed circuit board according to another embodiment.
Figure 37:
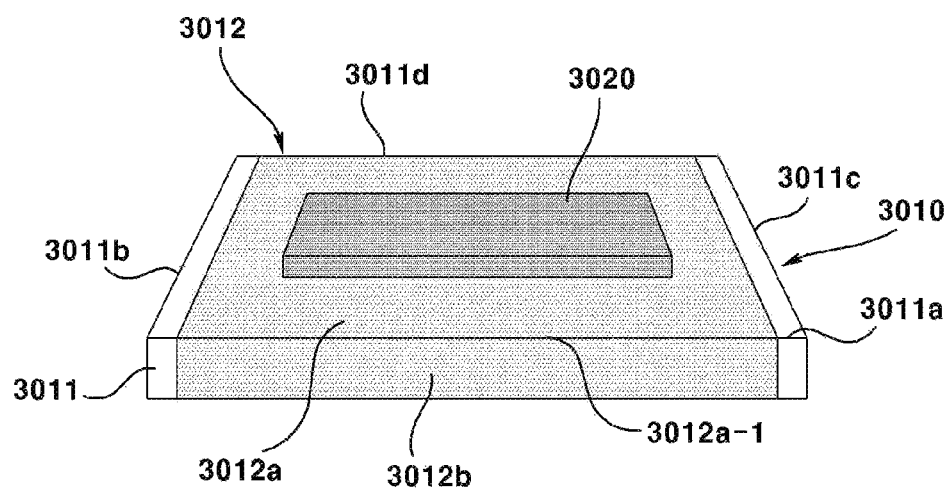
FIG. 37 is a conceptual diagram of a printed circuit board according to a modified embodiment.
Figure 38:
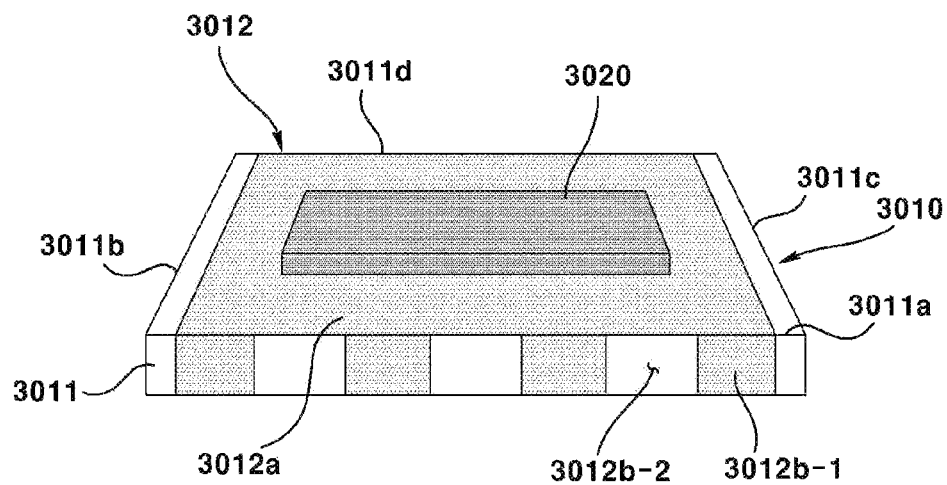
FIG. 38 is a conceptual diagram of a printed circuit board according to another modified embodiment.
Figure 39:
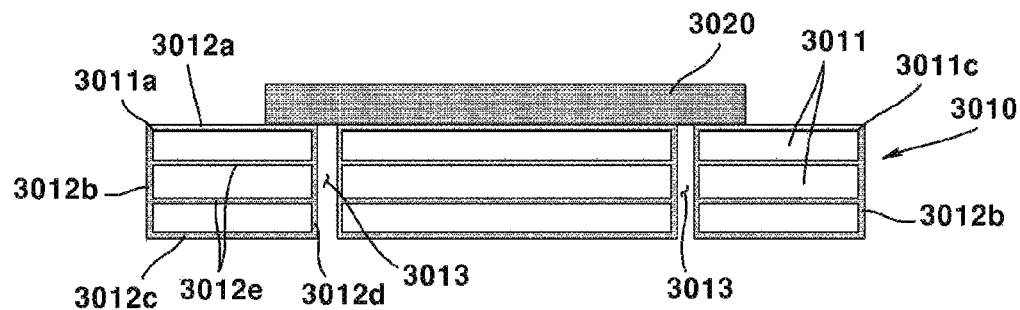
FIG. 39 is a conceptual diagram illustrating a cross section of a printed circuit board and an image sensor according to a third embodiment of the present invention.
Figure 40:
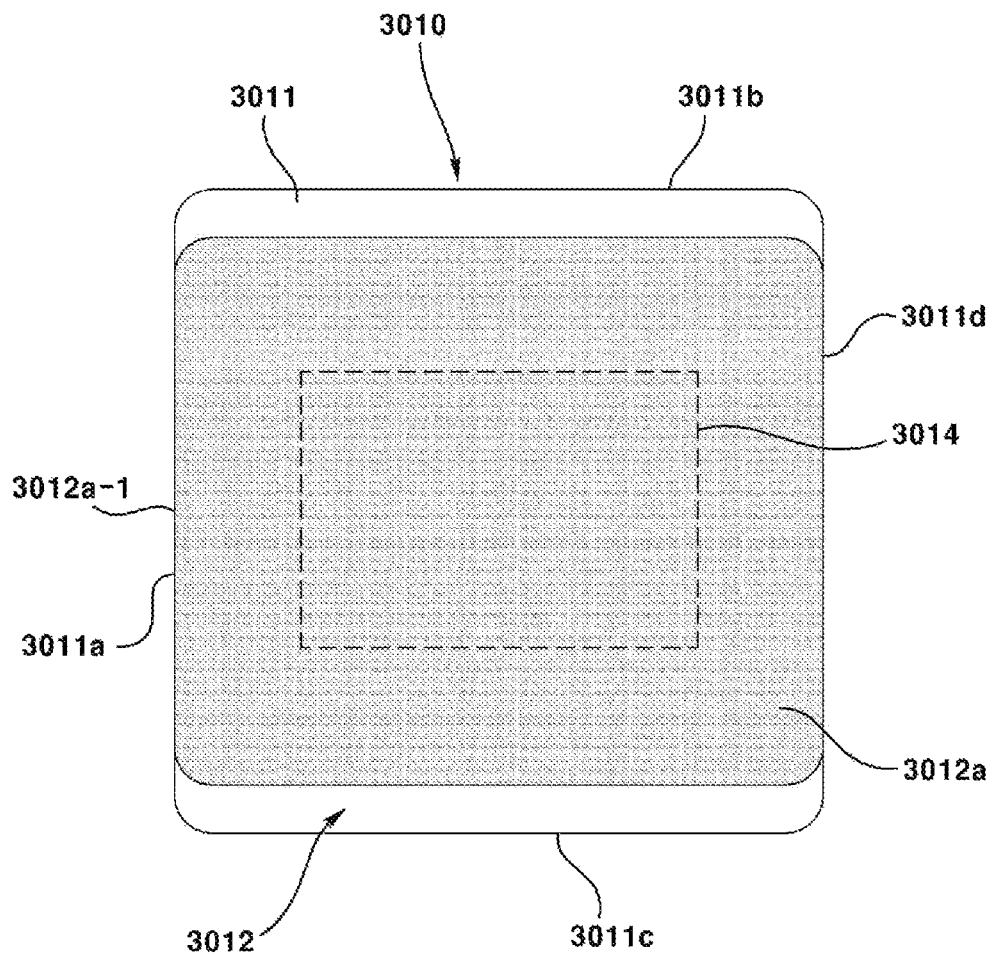
FIG. 40 is a conceptual diagram illustrating a printed circuit board according to a modified embodiment as viewed from above.

FIG. 36a is a plan view of a printed circuit board according to a third embodiment of the present invention; FIG. 36b is a plan view of a printed circuit board according to another embodiment; FIG. 37 is a conceptual diagram of a printed circuit board according to a modified embodiment; FIG. 38 is a conceptual diagram of a printed circuit board according to another modified embodiment; FIG. 39 is a conceptual diagram illustrating a cross section of a printed circuit board and an image sensor according to a third embodiment of the present invention; and FIG. 40 is a conceptual diagram illustrating a printed circuit board according to a modified embodiment as viewed from above.

A printed circuit board (PCB) 3010 may be one component of the camera module. The printed circuit board 3010 may be a board or a circuit board. The printed circuit board 3010 may comprise a rigid printed circuit board. The printed circuit board 3010 may comprise a flexible printed circuit board. A lens driving device may be disposed in the printed circuit board 3010. The lens driving device may be disposed on the printed circuit board 3010. The lens driving device may be disposed above the printed circuit board 3010. A sensor base may be disposed between the printed circuit board 3010 and the lens driving device. The printed circuit board 3010 may be electrically connected to the lens driving device. An image sensor 3020 may be disposed in the printed circuit board 3010. The printed circuit board 3010 may be provided with various circuits, devices, control units, and the like in order to convert an image formed on the image sensor 3020 into an electrical signal and transmit it to an external device.

The printed circuit board 3010 may comprise an insulation layer 3011. The insulation layer 3011 may be formed of an insulating material. The insulation layer 3011 may be formed of a material that does not conduct electricity. The insulation layer 3011 may form a body of the printed circuit board 3010. The insulation layer 3011 may be disposed in a direction perpendicular to the optical axis.

The insulation layer 3011 may comprise an upper surface facing the lens driving device, a lower surface being disposed at an opposite side of the upper surface, and a side surface connecting the upper surface and the lower surface. The side surface of the insulation layer 3011 may comprise a plurality of side surfaces. The side surface of the insulation layer 3011 may comprise four side surfaces. The side surface of the insulation layer 3011 may comprise first to fourth side surfaces.

The insulation layer 3011 may comprise a plurality of insulation layers. The insulation layer 3011 may comprise three insulation layers. The insulation layer 3011 may comprise first to third insulation layers. The insulation layer 3011 may comprise a first insulation layer, a second insulation layer being disposed on the first insulation layer, and a third insulation layer being disposed on the second insulation layer. A conductive layer 3012 may be disposed between the plurality of insulation layers. That is, the insulation layer and the conductive layer 3012 may be alternately laminated a plurality of times.

The insulation layer 3011 may comprise an edge being formed when the upper surface and the side surface meet. The edge may be a corner, a side, or a border. The edge of the insulation layer 3011 may comprise a plurality of edges. The edge of the insulation layer 3011 may be formed to correspond to the number of side surfaces. The edge of the upper surface of the insulation layer 3011 may comprise four edges corresponding to four side surfaces. The edge of the insulation layer 3011 may comprise four edges. The edge of the insulation layer 3011 may comprise first to fourth edges 3011a, 3011b, 3011c, and 3011d. The edge of the insulation layer 3011 may comprise a first edge 3011a being disposed in a first direction perpendicular to the optical axis. The edge of the insulation layer 3011 may comprise a second edge 3011b being disposed in a second direction perpendicular to the optical axis and the first direction. At this time, the first direction may be an x-axis direction and the second direction may be a y-axis direction. Conversely, the first direction may be a y-axis direction and the second direction may be an x-axis direction.

The printed circuit board may comprise a conductive layer 3012. The conductive layer 3012 may be an electrical conduction layer or an electrically conductive layer. The conductive layer 3012 may comprise conductive lines. The conductive layer 3012 may be disposed on the insulation layer 3011. The conductive layer 3012 may be electrically connected to the image sensor 3020. The conductive layer 3012 may be electrically conductive. Electricity may flow through the conductive layer 3012. The conductive layer 3012 may comprise a conductive material. The conductive layer 3012 may comprise copper. The conductive layer 3012 may be formed of copper. The conductive layer 3012 may be connected to the image sensor 3020. The conductive layer 3012 may be electrically connected to the image sensor 3020. The conductive layer 3012 may dissipate heat generated by the image sensor 3020. That is, the conductive layer 3012 being disposed over a large area may be advantageous for heat dissipation of the image sensor 3020. In the present embodiment, the conductive layer 3012 may be disposed in a larger area than that of a typical one.

The conductive layer 3012 may comprise a first conductive layer 3012a. The first conductive layer 3012a may be disposed on the upper surface of the insulation layer 3011. The first conductive layer 3012a may be spaced apart from a corner where the first edge 3011a and the second edge 3011b of the insulation layer 3011 meet. A first hole may be formed between the corners where the first edge 3011a and the second edge 3011b of the first conductive layer 3012a and the insulation layer 3011 meet. The printed circuit board 3010 may be coupled to a camera module or an optical apparatus through the first hole. In more detail, a screw may be inserted or coupled to the first hole of the printed circuit board 3010.

The first conductive layer 3012a may be extended from an edge of an upper surface of the insulation layer 3011. In the present embodiment, the first conductive layer 3012a may be extended from the first region 314 being disposed with the image sensor 3020 to the edge of the upper surface of the insulation layer 3011. Through this, the area of the conductive layer 3012 may be secured. That is, an area for dissipating heat generated from the image sensor 3020 may be secured. In addition, the first conductive layer 3012a and the second conductive layer 3012b may be connected.

The first conductive layer 3012a may comprise a first portion 3012a-1. The first portion 3012a-1 may be extended from the first edge 3011a of the insulation layer 3011. The first portion 3012a-1 may be disposed on the first edge 3011a of the insulation layer 3011. The first portion 3012a-1 may be extended to the first edge 3011a of the insulation layer 3011. The length of the first portion 3012a-1 of the first conductive layer 3012a in a first direction perpendicular to the optical axis may be longer than the length of the image sensor 3020 in a first direction. At this time, the first edge 3011a may be disposed in a first direction. The first portion 3012a-1 of the first conductive layer 3012a may be continuously disposed in a length section in a first direction.

The first conductive layer 3012a may comprise a second portion 3012a-2. The second portion 3012a-2 may be extended from the second edge 3011b of the insulation layer 3011. The second portion 3012a-2 may be disposed on the second edge 3011b of the insulation layer 3011. The second portion 3012a-2 may be extended to the second edge 3011b of the insulation layer 3011. The length of the second portion 3012a-2 of the first conductive layer 3012a in a second direction may be longer than the length of the image sensor 3020 in a second direction. At this time, the second edge 3011b may be disposed in a second direction. The second portion 3012a-2 of the first conductive layer 3012a may be continuously disposed in a length section in a second direction.

The first portion 3012a-1 and the second portion 3012a-2 of the first conductive layer 3012a may be connected on the upper surface of the insulation layer 3011. The first portion 3012a-1 and the second portion 3012a-2 may be interconnected. The first portion 3012a-1 and the second portion 3012a-2 may be integrally formed.

The first conductive layer 3012a may comprise a third portion 3012a-3. The third portion 3012a-3 may be connected from the third edge 3011c of the insulation layer 3011. The third portion 3012a-3 may be disposed in the third edge 3011c of the insulation layer 3011. The third portion 3012a-3 may be extended to the third edge 3011c of the insulation layer 3011. The third portion 3012a-3 may be intermittently disposed. As a modified embodiment, the third portion 3012a-3 may also be continuously disposed in the length section in a second direction like the second portion 3012a-2. The third portion 3012a-3 may be disposed at an opposite side of the second portion 3012a-2 with respect to the center of the printed circuit board 3010.

The first conductive layer 3012a may be spaced apart from at least one among the four edges of the upper surface of the insulation layer 3011. In a modified embodiment, the first conductive layer 3012a may be connected to all four edges of the upper surface of the insulation layer 3011.

In another embodiment, as shown in FIG. 36b, the first portion and the second portion of the first conductive layer 3012a may be omitted, and only the third portion 3012a-3 may be formed. That is, in another embodiment, the first conductive layer 3012a is connected to one edge among the four edges of the upper surface of the insulation layer 3011 and may be spaced apart from the other three edges.

The conductive layer 3012 may comprise a second conductive layer 3012b. The second conductive layer 3012b may be disposed on a side surface of the insulation layer 3011. The second conductive layer 3012b may dissipate heat generated in the image sensor 3020. The second conductive layer 3012b may be continuously disposed on a side surface of the insulation layer 3011. The second conductive layer 3012b may be disposed on each of the plurality of side surfaces of the insulation layer 3011. However, the second conductive layer 3012b may not be disposed on some side surfaces of the plurality of side surfaces of the insulation layer 3011. The second conductive layer 3012b may be disposed on at least three side surfaces among the four side surfaces of the insulation layer 3011. As a modified embodiment, as illustrated in FIG. 37, the second conductive layer 3012b may be disposed on two side surfaces being disposed at an opposite side from each other among the four side surfaces of the insulation layer 3011. The first conductive layer 3012a may be directly connected to the second conductive layer 3012b at the edge of the insulation layer 3011.

The second conductive layer 3012b may comprise a first portion being disposed on the first side surface of the insulation layer 3011. At this time, the first portion of the second conductive layer 3012b may cover an area of 90% or more of the first side surface of the insulation layer 3011. Or, the first portion of the second conductive layer 3012b may cover an area of 80% or more of the first side surface of the insulation layer 3011.

As a modified embodiment, as illustrated in FIG. 38, the second conductive layer 312b-1 may comprise a hole 312b-2 being formed in the second conductive layer 312b-1 and exposing a part of the side surface of the insulation layer 3011. The second conductive layer 312b-1 may be intermittently disposed. The length of the first conductive layer 3012a may be different from the length of the second conductive layer 312b-1 in a corresponding direction.

The conductive layer 3012 may comprise a third conductive layer 3012c. The third conductive layer 3012c may be disposed on a lower surface of the insulation layer 3011. The second conductive layer 3012b may connect the first conductive layer 3012a and the third conductive layer 3012c. That is, the third conductive layer 3012c may be connected to the first conductive layer 3012a through the second conductive layer 3012b. In addition, the third conductive layer 3012c may be connected to the first conductive layer 3012a through the fourth conductive layer 3012d.

The conductive layer 3012 may comprise a fourth conductive layer 3012d. The fourth conductive layer 3012d may be disposed on an inner circumferential surface of the via hole 3013. The fourth conductive layer 3012d may connect the first conductive layer 3012a and the third conductive layer 3012c.

The conductive layer 3012 may comprise a fifth conductive layer 3012e. The fifth conductive layer 3012e may be disposed between the plurality of insulation layers. The fifth conductive layer 3012e may be alternately laminated on a plurality of insulation layers. The fifth conductive layer 3012e may comprise a plurality of conductive layers. The fifth conductive layer 3012e may comprise two conductive layers. The fifth conductive layer 3012e may comprise a fifth-first conductive layer and a fifth-second conductive layer being disposed between the first to third insulation layers. The fifth conductive layer 3012e may be connected to at least one of the first conductive layer 3012a and the third conductive layer 3012c through the fourth conductive layer 3012d. The fifth conductive layer 3012e may be connected to at least one of the first conductive layer 3012a and the third conductive layer 3012c through the second conductive layer 3012b.

The printed circuit board 3010 may comprise a via hole 3013. The via hole 3013 may penetrate the insulation layer 3011 in an optical axis direction. The via hole 3013 may be formed for electrical connection between the conductive layers 3012. That is, a via hole 3013 may be provided to electrically connect the first conductive layer 3012a, the third conductive layer 3012c, and the fifth conductive layer 3012e. Or, the via hole 3013 may dissipate heat generated in the image sensor 3020. In the present embodiment, as the area of the conductive layer 3012 is increased, at least some of the via holes 3013 for heat dissipation may be omitted. The via hole 3013 may comprise a plurality of via holes.

Hereinafter, a configuration of a camera module according to a third embodiment of the present invention will be described with reference to the drawings.

Figure 41:
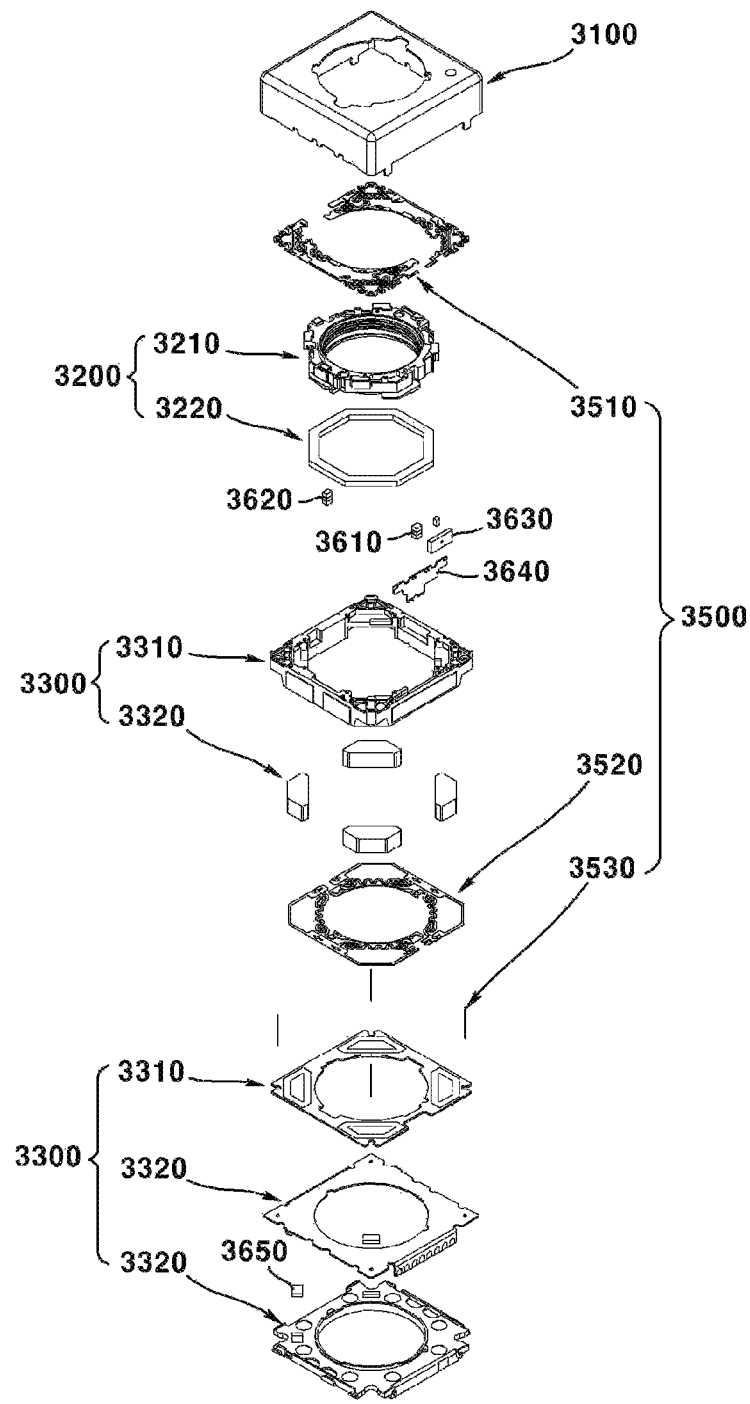
FIG. 41 is an exploded perspective view of a lens driving device according to a third embodiment of the present invention.
Figure 42:
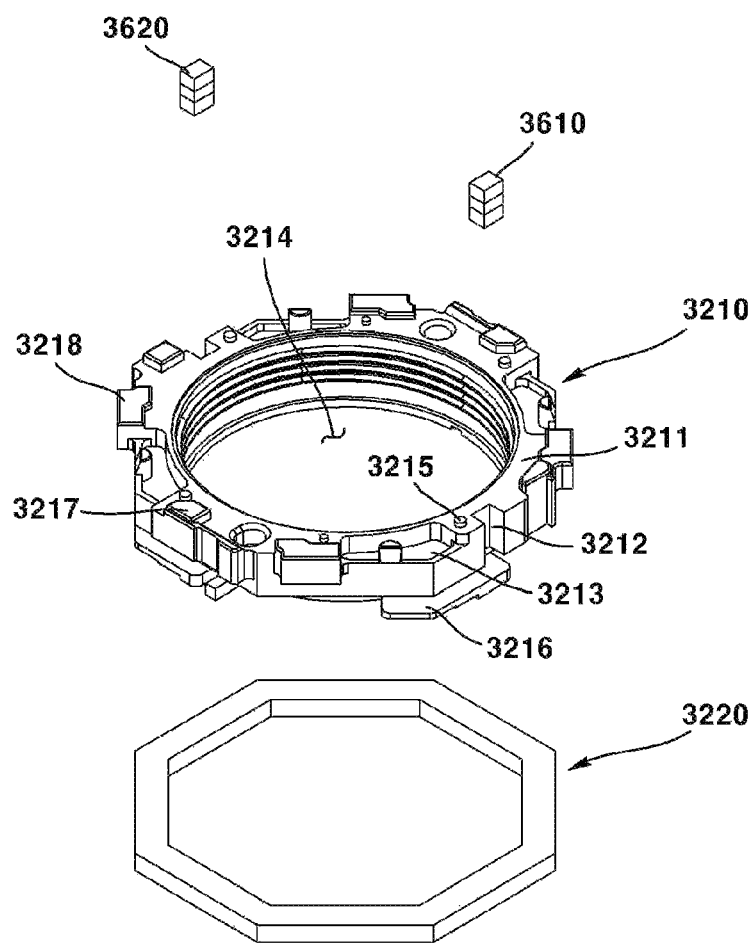
FIGS. 42 to 45 are exploded perspective views of a part of the lens driving device according to a third embodiment of the present invention.
Figure 43:
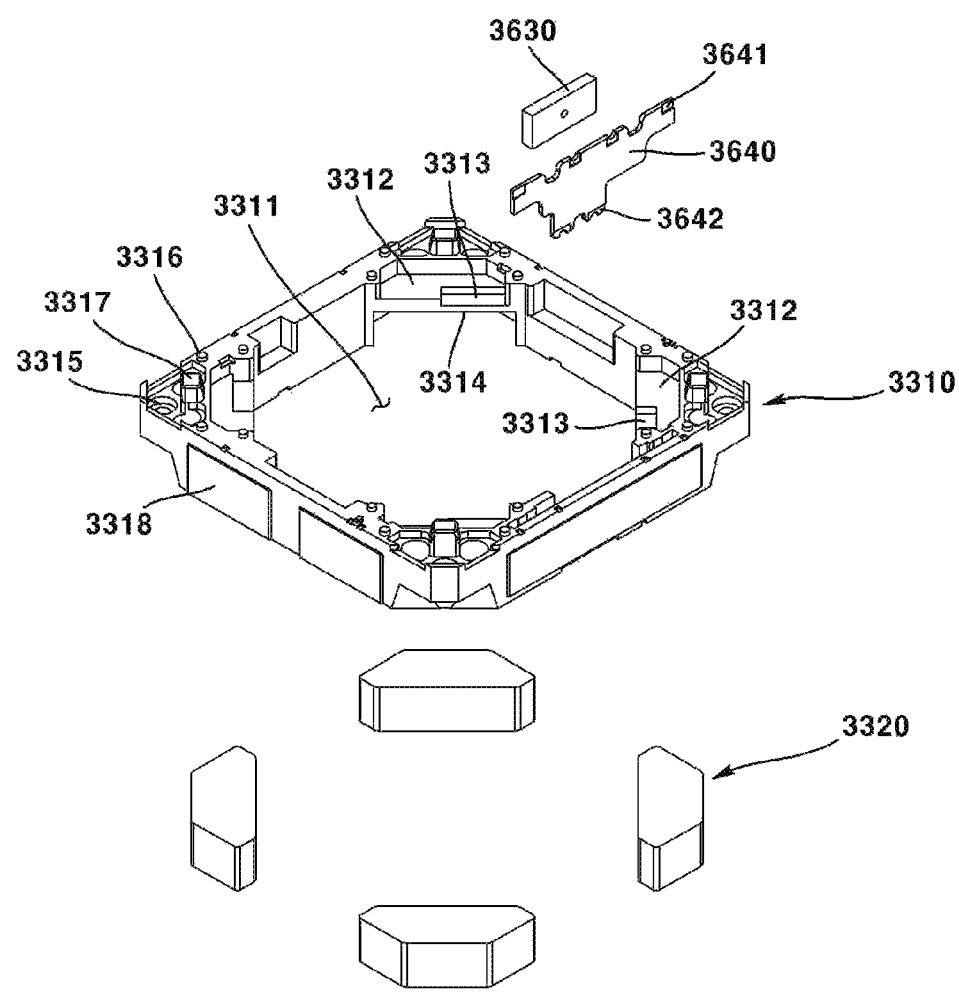
Figure 44:
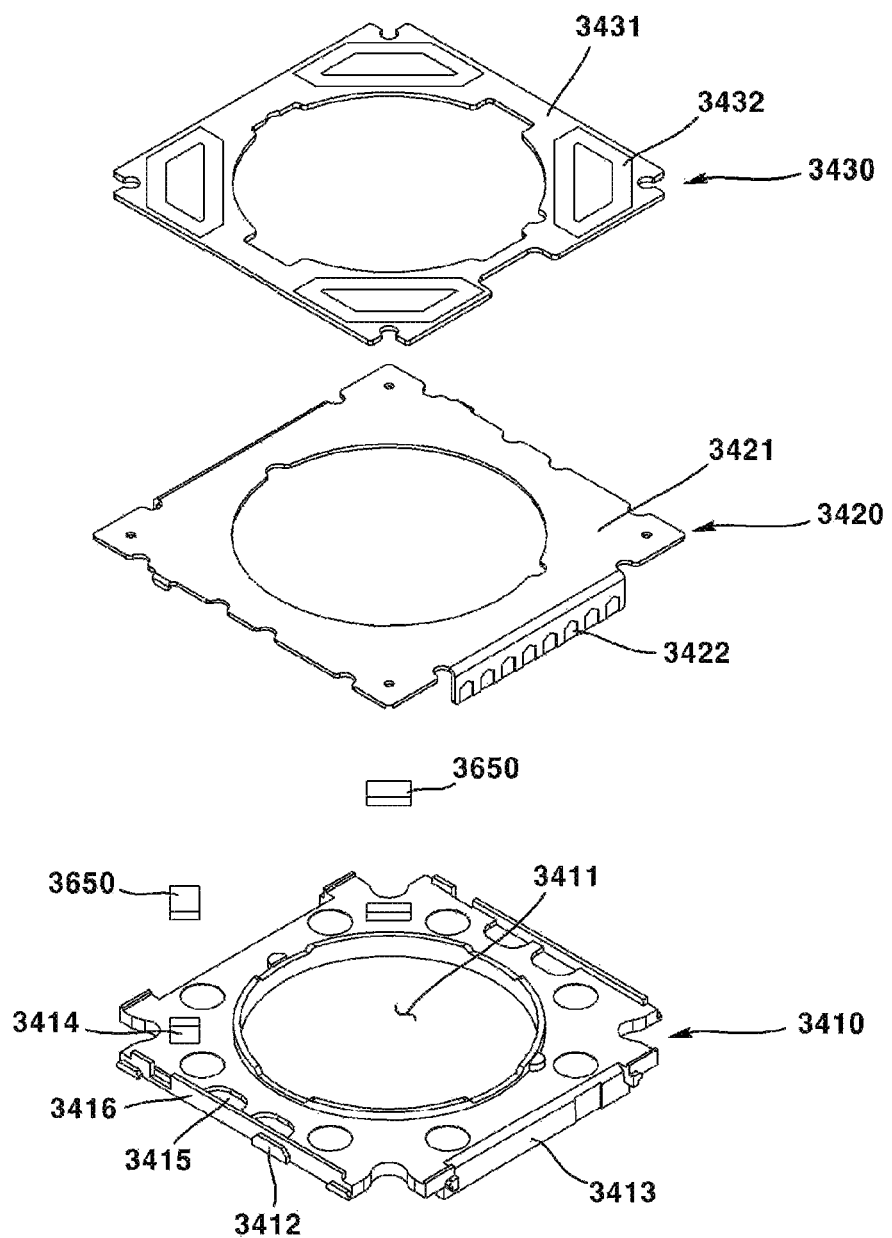
Figure 45:
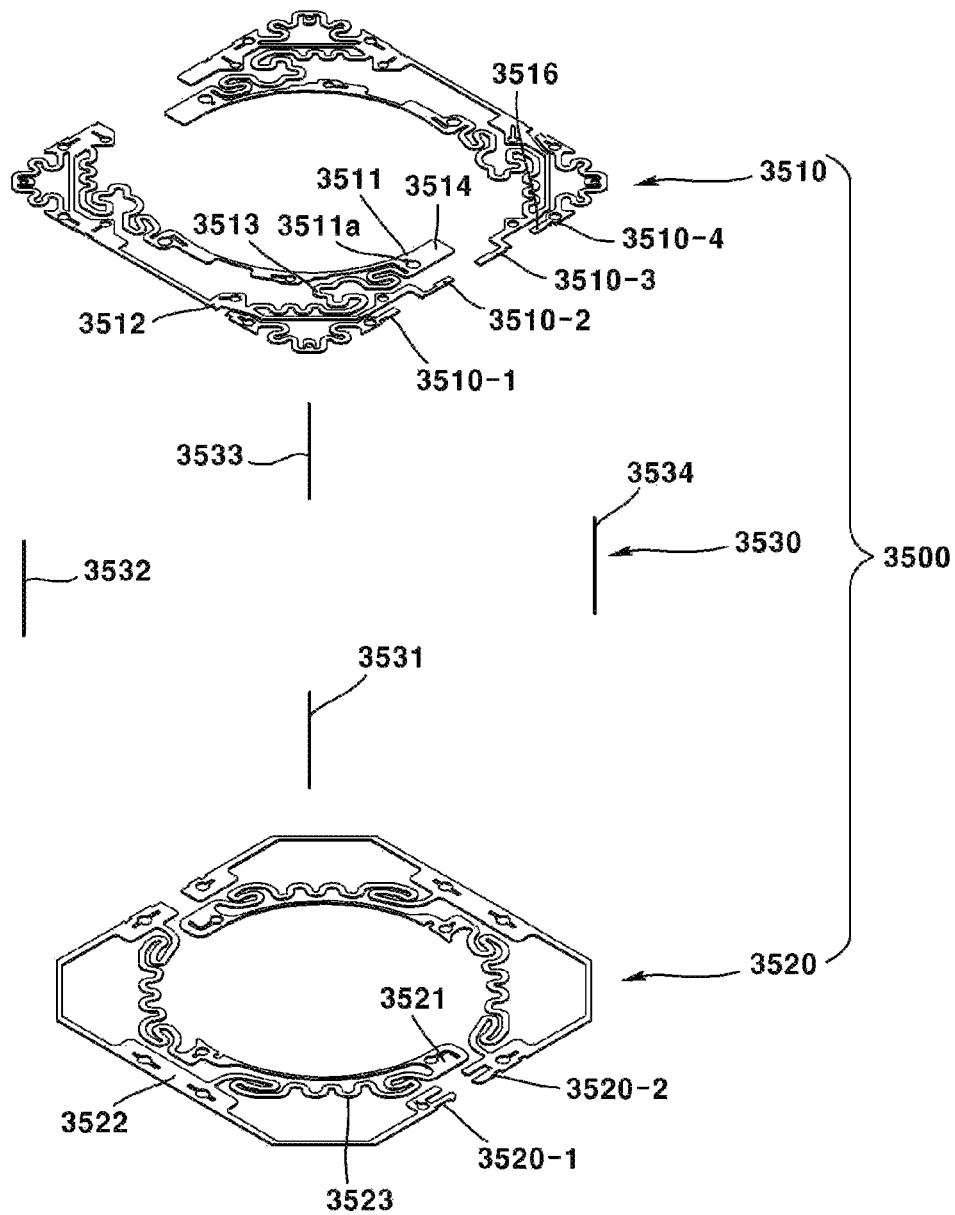

FIG. 41 is an exploded perspective view of a lens driving device according to a third embodiment of the present invention; and FIGS. 42 to 45 are exploded perspective views of a part of the lens driving device according to a third embodiment of the present invention.

The camera module may be a camera device.

The camera module may comprise a printed circuit board (PCB) 3010. The contents described above may be applied to the printed circuit board 3010 of the camera module.

The camera module may comprise an image sensor 3020. The image sensor 3020 may have a configuration in which light passing through a lens and a filter is incident to form an image. The image sensor 3020 may be disposed in the printed circuit board 3010. The image sensor 3020 may be disposed on the printed circuit board 3010. The image sensor 3020 may be disposed above the printed circuit board 3010. The image sensor 3020 may be disposed on an upper surface of the insulation layer 3011 of the printed circuit board 3010. The image sensor 3020 may be disposed above the insulation layer 3011 of the printed circuit board 3010. The image sensor 3020 may be mounted on the printed circuit board 3010. The image sensor 3020 may be electrically connected to the printed circuit board 3010. For example, the image sensor 3020 may be coupled to the printed circuit board 3010 by a surface mounting technology (SMT). As another example, the image sensor 3020 may be coupled to the printed circuit board 3010 by a flip chip technology. The image sensor 3020 may be disposed so that the lens and the optical axis coincide. That is, the optical axis of the image sensor 3020 and the optical axis of the lens may be aligned. The image sensor 3020 may convert light irradiated to the effective image area of the image sensor 3020 into an electrical signal. The image sensor 3020 may be any one among a charge coupled device (CCD), a metal oxide semi-conductor (MOS), a CPD, and a CID.

The camera module may comprise a lens module. The lens module may comprise at least one lens. The lens may be disposed at a position corresponding to the image sensor. The lens module may comprise a lens and a barrel. The lens module may be coupled to the bobbin 3210 of the lens driving device. The lens module may be coupled to the bobbin 3210 by screw-coupling and/or adhesive. The lens module may move integrally with the bobbin 3210.

The camera module may comprise a filter. The filter may serve to block light of a specific frequency band among the light passing through the lens module from being incident on the image sensor. The filter may be disposed parallel to the x-y plane. The filter may be disposed between the lens module and the image sensor. A filter may be disposed on the sensor base. In a modified embodiment, the filter may be placed in the base 3410. The filter may comprise an infrared filter. The infrared filter may block light in the infrared region from being incident on the image sensor.

The camera module may comprise a sensor base. The sensor base may be disposed between the lens driving device and the printed circuit board 3010. The sensor base may comprise a protruded part in which the filter is disposed. An opening may be formed in a portion of the sensor base where the filter is disposed so that light passing through the filter may be incident on the image sensor. The adhesive member may couple or attach the base 3410 of the lens driving device to the sensor base. The adhesive member may additionally serve to prevent foreign matters from entering the inside of the lens driving device. The adhesive member may comprise any one or more among an epoxy, a thermosetting adhesive, and an ultraviolet curable adhesive.

The camera module may comprise a motion sensor. The motion sensor may be mounted on the printed circuit board 3010. The motion sensor may be electrically connected to the control unit through a circuit pattern provided in the printed circuit board 3010. The motion sensor may output rotational angular velocity information due to the movement of the camera module. The motion sensor may comprise a 2-axis or 3-axis gyro sensor, or an angular velocity sensor.

The camera module may comprise a control unit. The control unit may be disposed in the printed circuit board 3010. The control unit may be electrically connected to the first and second coils 3220 and 3430 of the lens driving device. The control unit may individually control the direction, intensity, and amplitude of the current supplied to the first and second coils 3220 and 3430. The control unit may control the lens driving device to perform an autofocus function and/or a hand tremble correction function. Furthermore, the control unit may perform autofocus feedback control and/or hand tremble correction feedback control for the lens driving device.

The camera module may comprise a connector. The connector may be electrically connected to the printed circuit board 3010. The connector may comprise a port for electrically connecting to an external device.

The camera module may comprise a lens driving device. The lens driving device may be a voice coil motor (VCM). The lens driving device may be a lens driving motor. The lens driving device may be a lens driving actuator. The lens driving device may comprise an AF module. The lens driving device may comprise an OIS module.

The lens driving device may comprise a cover member 3100. The cover member 3100 may comprise a 'cover can'. The cover member 3100 may be disposed at an outer side of the housing 3310. The cover member 3100 may be coupled to the base 3410. The cover member 3100 may accommodate the housing 3310 therein. The cover member 3100 may form the outer appearance of the lens driving device. The cover member 3100 may have a hexahedral shape with an open lower surface. The cover member 3100 may be a non-magnetic material. The cover member 3100 may be directly soldered to the first conductive layer 3012a of the printed circuit board 3010 or connected by a conductive adhesive. The cover member 3100 may be connected to a ground terminal of the printed circuit board 3010. Through this, the cover member 3100 may be grounded. The cover member 3100 may block electromagnetic interference (EMI). At this time, the cover member 3100 may be referred to as an 'EMI shield can'.

The cover member 3100 may comprise an upper plate and a side plate. The cover member 3100 may comprise an upper plate comprising a hole 3111 and a side plate being extended downward from an outer circumference or edge of the upper plate. The lower end of the side plate of the cover member 3100 may be disposed in the step portion 3412 of the base 3410. The inner surface of the side plate of the cover member 3100 may be fixed to the base 3410 by an adhesive.

The lens driving device may comprise a first mover 3200. The first mover 3200 may be coupled to a lens. The first mover 3200 may be connected to the second mover 3300 through an upper elastic member 3510 and/or a lower elastic member 3520. The first mover 3200 may move through interaction with the second mover 3300. At this time, the first mover 3200 may move integrally with the lens. Meanwhile, the first mover 3200 may move during AF driving. At this time, the first mover 3200 may be referred to as an 'AF mover'. However, the first mover 3200 may move together with the second mover 3300 even during OIS driving.

The first mover 3200 may comprise a bobbin 3210. The bobbin 3210 may be disposed inside the housing 3310. The bobbin 3210 may be disposed in the hole 3311 of the housing 3310. The bobbin 3210 may be movably coupled to the housing 3310. The bobbin 3210 may move in an optical axis direction against the housing 3310. A lens may be coupled to the bobbin 3210. The bobbin 3210 and the lens may be coupled by screw-coupling and/or adhesive. A first coil 3220 may be coupled to the bobbin 3210. An upper elastic member 3510 may be coupled to an upper portion or upper surface of the bobbin 3210. A lower elastic member 3520 may be coupled to a lower portion or lower surface of the bobbin 3210. The bobbin 3210 may be coupled to the upper elastic member 3510 and/or the lower elastic member 3520 by heat fusion and/or an adhesive. The adhesive coupling the bobbin 3210 and the lens, and the bobbin 3210 and the elastic member 3500 may be an epoxy cured by at least one among ultraviolet rays (UV), heat, and a laser.

The bobbin 3210 may comprise an upper surface 3211. An inner portion 3511 of the upper elastic member 3510 may be disposed on an upper surface 3211 of the bobbin 3210. The upper surface 3211 of the bobbin 3210 may be disposed at a higher position than the upper surface 3611 of the second magnet 3610. The upper surface 3211 of the bobbin 3210 may be spaced apart from the upper surface 3611 of the second magnet 3610.

The bobbin 3210 may comprise a groove 3212. The groove 3212 may be a recess. A second magnet 3610 may be disposed in the groove 3212. A portion of the bobbin 3210 corresponding to the upper surface 3611 of the second magnet 3610 may be opened by the groove 3212 of the bobbin 3210. The groove 3212 of the bobbin 3210 may be formed in the upper surface 3211 of the bobbin 3210. The groove 3212 of the bobbin 3210 may be formed on an inner circumferential surface of the bobbin 3210. At least a portion of the groove 3212 of the bobbin 3210 may be formed to correspond to the shape and size of the second magnet 3610. The bobbin 3210 may comprise a groove formed below the first region 3514. The groove may be connected to a groove (recess) 3212 of the bobbin 3210. That is, the groove may be recognized as a single groove without being distinguished from the groove 3212 of the bobbin 3210. The groove 3212 may be a portion in which the second magnet 3610 is disposed, and the groove may be a portion in which the second magnet 3610 is not disposed.

The bobbin 3210 may comprise a recessed part 3213. The recessed part 3213 may be formed in a portion corresponding to the connection part 3513 of the upper elastic member 3510. The recessed part 3213 may be recessed from the upper surface 3211 of the bobbin 3210. Through this, when the connection part 3513 of the upper elastic member 3510 moves downward from the initial state, interference between the connection part 3513 and the bobbin 3210 may be prevented. The recessed part 3213 may be spaced apart from the groove 3212 of the bobbin 3210.

The bobbin 3210 may comprise a hole 3214. The hole 3214 may penetrate through the bobbin 3210 in an optical axis direction. A lens module may be accommodated in the hole 3214. For example, a thread corresponding to a thread formed on an outer circumferential surface of the lens module may be disposed on an inner circumferential surface of the bobbin 3210 forming the hole 3214.

The bobbin 3210 may comprise a protruded part 3215. The protruded part 3215 may comprise a protrusion. The protruded part 3215 may be formed on the upper surface 3211 of the bobbin 3210. The protruded part 3215 may be protruded from the upper surface 3211 of the bobbin 3210. The protruded part 3215 may be coupled to the inner side portion 3511 of the upper elastic member 3510. The protruded part 3215 may be inserted into the hole 3511a of the inner side portion 3511 of the upper elastic member 3510. The protruded part 3215 may be coupled to the hole 3511a of the inner side portion 3511.

The bobbin 3210 may comprise a coil accommodating groove 3216. A first coil 3220 may be coupled to the coil accommodating groove 3216. The coil accommodating groove 3216 may be formed on an outer circumferential surface of the bobbin 3210. The coil accommodating groove 3216 may comprise a groove formed as a portion of an outer side surface of the bobbin 3210 is recessed. The first coil 3220 may be accommodated in the groove of the coil accommodating groove 3216. The coil accommodating groove 3216 may comprise a protrusion for supporting the lower surface of the first coil 3220.

The bobbin 3210 may comprise an upper stopper 3217. The upper stopper 3217 may be formed on the upper surface 3211 of the bobbin 3210. The upper stopper 3217 may be formed to be protrudeD from the upper surface 3211 of the bobbin 3210. The upper stopper 3217 may be overlapped with an upper plate of the cover member 3100 in an optical axis direction. The upper stopper 3217 may form an uppermost end of the bobbin 3210. Through this, when the bobbin 3210 moves upward, the upper stopper 3217 may be in contact with the upper plate of the cover member 3100. That is, the upper stopper 3217 may physically limit the upper stroke of the bobbin 3210.

The bobbin 3210 may comprise a side stopper 3218. The side stopper 3218 may be formed on the side surface of the bobbin 3210. The side stopper 3218 may be formed to be protruded from a side surface of the bobbin 3210. At least a portion of the side stopper 3218 may be disposed in the second groove 3313 of the housing 3310. When the bobbin 3210 rotates through this structure, the side stopper 3218 of the bobbin 3210 may be in contact with the housing 3310. That is, the side stopper 3218 of the bobbin 3210 may limit the rotation of the bobbin 3210.

The first mover 3200 may comprise a first coil 3220. The first coil 3220 may be an 'AF driving coil' used for AF driving. The first coil 3220 may be disposed in the bobbin 3210. The first coil 3220 may be disposed between the bobbin 3210 and the housing 3310. The first coil 3220 may be disposed on an outer side surface or an outer circumferential surface of the bobbin 3210. The first coil 3220 may be directly wound in the bobbin 3210. Or, the first coil 3220 may be coupled to the bobbin 3210 in a state of being directly wound. The first coil 3220 may face the first magnet 3320. The first coil 3220 may be disposed to face the first magnet 3320. The first coil 3220 may electromagnetically interact with the first magnet 3320. In this case, when a current is supplied to the first coil 3220 and an electromagnetic field is formed around the first coil 3220, the first coil 3220 and the first magnet 3320 can interact with each other by electromagnetic interaction. The coil 3220 may move against the first magnet 3320. The first coil 3220 may be formed as a single coil. Or, the first coil 3220 may comprise a plurality of coils spaced apart from one another.

The first coil 3220 may comprise a pair of lead wires for supplying power. At this time, one end portion (lead wire) of the first coil 3220 is coupled to the first lower elastic unit 3520-1, and the other end portion (lead wire) of the first coil 3220 may be coupled to the second lower elastic unit 3520-2. That is, the first coil 3220 may be electrically connected to the lower elastic member 3520. In more detail, the first coil 3220 may be supplied with power sequentially through a printed circuit board, a first board 3420, a side elastic member 3530, an upper elastic member 3510, a second board 3640, and a lower elastic member 3520. As a modified embodiment, the first coil 3220 may be electrically connected to the upper elastic member 3510.

The lens driving device may comprise a second mover 3300. The second mover 3300 may be movably coupled to the stator 3400 through the side elastic member 3530. The second mover 3300 may support the first mover 3200 through the upper and lower elastic members 3510 and 3520. The second mover 3300 may move the first mover 3200 or may move together with the first mover 3200. The second mover 3300 may move through interaction with the stator 3400. The second mover 3300 may move during OIS driving. At this time, the second mover 3300 may be referred to as an 'OIS mover'. The second mover 3300 may move integrally with the first mover 3200 during OIS driving.

The second mover 3300 may comprise a housing 3310. The housing 3310 may be spaced apart from the base 3410. The housing 3310 may be disposed at an outer side of the bobbin 3210. The housing 3310 may accommodate at least a portion of the bobbin 3210. The housing 3310 may be disposed inside the cover member 3100. The housing 3310 may be disposed between the cover member 3100 and the bobbin 3210. The housing 3310 may be formed of a material different from that of the cover member 3100. The housing 3310 may be formed of an insulating material. The housing 3310 may be formed of an injection-molded material. The outer side surface of the housing 3310 may be spaced apart from the inner surface of the side plate of the cover member 3100. Through the space between the housing 3310 and the cover member 3100, the housing 3310 may move for OIS driving. A first magnet 3320 may be disposed in the housing 3310. The housing 3310 and the first magnet 3320 may be coupled by an adhesive. An upper elastic member 3510 may be coupled to an upper portion or upper surface of the housing 3310. A lower elastic member 3520 may be coupled to a lower portion or lower surface of the housing 3310. The housing 3310 may be coupled to the upper and lower elastic members 3510 and 3520 by heat fusion and/or an adhesive. The adhesive coupling the housing 3310 and the first magnet 3320, and the housing 3310 and the elastic member 3500 may be an epoxy cured by at least one among ultraviolet rays (UV), heat, and a laser.

The housing 3310 may comprise four side portions and four corner portions being disposed between the four side portions. The side portion of the housing 3310 may comprise a first side portion, a second side portion being disposed at an opposite side of the first side portion, and a third side portion and a fourth side portion being disposed at an opposite side thereof between the first side portion and the second side portion. The corner portion of the housing 3310 may comprise: a first corner portion being disposed between the first side portion and the third side portion; a second corner portion being disposed between the first side portion and the fourth side portion; a third corner portion being disposed between the second side portion and the third side portion; and a fourth corner portion being disposed between the second side portion and the fourth side portion. The side portion of the housing 3310 may comprise a 'sidewall'.

The housing 3310 may comprise a hole 3311. The hole 3311 may be formed in the housing 3310. The hole 3311 may be formed to penetrate through the housing 3310 in an optical axis direction. A bobbin 3210 may be disposed in the hole 3311. The hole 3311 may be formed in a shape corresponding to the bobbin 3210 at least in part. An inner circumferential surface or an inner side surface of the housing 3310 forming the hole 3311 may be spaced apart from the outer circumferential surface of the bobbin 3210. However, the housing 3310 and the bobbin 3210 may be overlapped with at least partially in an optical axis direction to limit the movement stroke distance of the bobbin 3210 in an optical axis direction.

The housing 3310 may comprise a first groove 3312. The first groove 3312 may be formed by being recessed in an upper surface of the housing 3310. The first groove 3312 may be formed at a position corresponding to the connection part 3513 of the upper elastic member 3510. The first groove 3312 may prevent interference between the upper elastic member 3510 and the housing 3310 when the connection part 3513 of the upper elastic member 3510 moves downward from the initial position.

The housing 3310 may comprise a second groove 3313. The second groove 3313 may accommodate at least a portion of the side stopper 3218 of the bobbin 3210. The second groove 3313 may be formed to have a predetermined gap between it and the side stopper 3218.

The housing 3310 may comprise a magnetic accommodating groove 3314. A first magnet 3320 may be coupled to the magnet accommodating groove 3314. The magnet accommodating groove 3314 may comprise a groove being formed by recessing a portion of an inner circumferential surface and/or a lower surface of the housing 3310. A magnet accommodating groove 3314 may be formed in each of the four corner portions of the housing 3310. In a modified embodiment, a magnet accommodating groove 3314 may be formed in each of the four side portions of the housing 3310.

The housing 3310 may comprise a hole 3315. The hole 3315 may be formed in a corner portion of the housing 3310. The hole 3315 may be formed to penetrate through the housing 3310 in an optical axis direction. A wire of the side elastic member 3530 may be disposed in the hole 3315 of the housing 3310.

The housing 3310 may comprise a protrusion 3316. The protrusion 3316 may be formed on an upper surface of the housing 3310. The protrusion 3316 may be protruded from an upper surface of the housing 3310. The protrusion 3316 may be coupled to the outer side portion 3512 of the upper elastic member 3510. The protrusion 3316 may be inserted into the hole of the outer side portion 3512 of the upper elastic member 3510.

The housing 3310 may comprise an upper stopper 3317. The upper stopper 3317 may be protruded from an upper surface of the housing 3310. The upper stopper 3317 may be formed on an upper surface of the housing 3310. The upper stopper 3317 may be overlapped with an upper plate of the cover member 3100 in an optical axis direction. The upper stopper 3317 may form an uppermost end of the housing 3310. Through this, when the housing 3310 moves upward, the upper stopper 3317 may be in contact with the upper plate of the cover member 3100. That is, the upper stopper 3317 may limit the upward movement of the housing 3310.

The housing 3310 may comprise a side stopper 3318. The side stopper 3318 may be protruded from an outer side surface of the housing 3310. The side stopper 3318 may face the inner surface of the side plate of the cover member 3100. The side stopper 3318 may be in contact with the side plate of the cover member 3100 when the housing 3310 moves in a lateral direction. That is, the side stopper 3318 may physically limit the stroke of the housing 3310 in a lateral direction.

The second mover 3300 may comprise a first magnet 3320. The first magnet 3320 may be disposed in the housing 3310. The first magnet 3320 may be fixed to the housing 3310 by an adhesive. The first magnet 3320 may be disposed between the bobbin 3210 and the housing 3310. The first magnet 3320 may face the first coil 3220. The first magnet 3320 may electromagnetically interact with the first coil 3220. The first magnet 3320 may face the second coil 3430. The first magnet 3320 may electromagnetically interact with the second coil 3430. The first magnet 3320 may be commonly used for AF driving and OIS driving. The first magnet 3320 may be disposed in a corner portion of the housing 3310. At this time, the first magnet 3320 may be a corner magnet having an inner side surface having a larger hexahedral shape than an outer side surface. As a modified embodiment, the first magnet 3320 may be disposed in a side portion of the housing 3310. At this time, the first magnet 3320 may be a flat magnet having a flat plate shape.

The lens driving device may comprise a stator 3400. The stator 3400 may be disposed below the first and second movers 3200 and 3300. The stator 3400 may movably support the second mover 3300. The stator 3400 may move the second mover 3300. At this time, the first mover 3200 may also move together with the second mover 3300.

The stator 3400 may comprise a base 3410. The base 3410 may be disposed below the housing 3310. The base 3410 may be disposed below a first board 3420. The first board 3420 may be disposed on an upper surface of the base 3410. The base 3410 may be coupled to the cover member 3100. The base 3410 may be disposed above the printed circuit board.

The base 3410 may comprise a hole 3411. The hole 3411 may be a hollow hole formed in the base 3410. The hole 3411 may penetrate through the base 3410 in an optical axis direction. The light that has passed through the lens module through the hole 3411 may be incident on the image sensor 360.

The base 3410 may comprise a step portion 3412. The step portion 3412 may be formed on a side surface of the base 3410. The step portion 3412 may be formed around the outer circumferential surface of the base 3410. The step portion 3412 may be formed when a portion of the side surface of the base 3410 is protruded or recessed. A lower end of the side plate of the cover member 3100 may be disposed in the step portion 3412.

The base 3410 may comprise a groove 3413. A terminal portion 3422 of the first board 3420 may be disposed in the groove 3413. The groove 3413 may be formed when a portion of the side surface of the base 3410 is recessed. The width of the groove 3413 may be formed to correspond to the width of the terminal portion 3422 of the first board 3420. The length of the groove 3413 may be formed to correspond to the length of the terminal portion 3422 of the first board 3420. Or, since the length of the terminal portion 3422 of the first board 3420 is longer than the length of the groove 3413, a portion of the terminal portion 3422 may be protruded below the base 3410.

The base 3410 may comprise a sensor accommodating groove 3414. An OIS sensor 3650 may be disposed in the sensor accommodating groove 3414. The sensor accommodating groove 3414 may accommodate at least a portion of the OIS sensor 3650. The sensor accommodating groove 3414 may comprise a groove being formed when the upper surface of the base 3410 is recessed. The sensor accommodating groove 3414 may comprise two grooves. At this time, the OIS sensor 3650 is disposed in each of the two grooves to detect the movement in the X-axis direction and the movement in the Y-axis direction of the first magnet 3320.

The base 3410 may comprise a groove 3415. The groove 3415 may be formed on an upper surface of the base 3410. An adhesive may be disposed in the groove 3415. The adhesive disposed in the groove 3415 may fix the first board 3420 to the base 3410.

The base 3410 may comprise a protruded part 3416. The protruded part 3416 may be formed on an upper surface of the base 3410. The protruded part 3416 may be formed on an outer circumferential surface of the base 3410. The protruded part 3416 may be formed at an outer side of the first board 3420. The protruded part 3416 is formed on both sides of the first board 3420 so that the position of the first board 3420 can be guided.

The stator 3400 may comprise a first board 3420. The first board 3420 may be disposed between the base 3410 and the housing 3310. The first board 3420 may be disposed on an upper surface of the base 3410. The first board 3420 may comprise a second coil 3430 facing the first magnet 3320. The first board 3420 may supply power to the second coil 3430. A side elastic member 3530 may be coupled to the first board 3420. The first board 3420 may be coupled to a printed circuit board being disposed below the base 3410 by a solder. The first board 3420 may comprise a flexible printed circuit board (FPCB). The first board 3420 may be partially bent.

The first board 3420 may comprise a body portion 3421. A hole may be formed in the body portion 3421. The first board 3420 may comprise a terminal portion 3422. The terminal portion 3422 may be extended downward from the body portion 3421 of the first board 3420. The terminal portion 3422 may be formed when a portion of the first board 3420 is bent. At least a portion of the terminal portion 3422 may be exposed to the outside. The terminal portion 3422 may be coupled to a printed circuit board being disposed below the base 3410 by a soldering. The terminal portion 3422 may be disposed in the groove 3413 of the base 3410. The terminal portion 3422 may comprise a plurality of terminals.

The stator 3400 may comprise a second coil 3430. The second coil 3430 may be one configuration of the first board 3420, but may be a separate configuration from the first board 3420. The second coil 3430 may electromagnetically interact with the first magnet 3320. In this case, when a current is supplied to the second coil 3430 and a magnetic field is formed around the second coil 3430, the first magnet 3320 may move against the second coil 3430 by electromagnetic interaction between the second coil 3430 and the first magnet 3320. The second coil 3430 may move the housing 3310 and the bobbin 3210 in a direction perpendicular to the optical axis against the base 3410 through electromagnetic interaction with the first magnet 3320. The second coil 3430 may be a fine pattern coil (FP coil) integrally formed in the body portion 3421.

The lens driving device may comprise an elastic member 3500. The elastic member 3500 may have elasticity at least in part. The elastic member 3500 may be formed of metal. The elastic member 3500 may be formed of a conductive material. The elastic member 3500 may be coupled to the bobbin 3210 and the housing 3310. The elastic member 3500 may elastically support the bobbin 3210. The elastic member 3500 may movably support the bobbin 3210. The elastic member 3500 may support the movement of the bobbin 3210 during AF driving. That is, the elastic member 3500 may comprise an 'AF member'. The elastic member 3500 may movably support the housing 3310. That is, the elastic member 3500 may comprise an 'OIS member'.

The elastic member 3500 may comprise an upper elastic member 3510. The upper elastic member 3510 may be in connect with the housing 3310 and the bobbin 3210. The upper elastic member 3510 may be coupled to an upper portion of the bobbin 3210 and an upper portion of the housing 3310. The upper elastic member 3510 may be coupled to an upper surface of the bobbin 3210. The upper elastic member 3510 may be coupled to an upper surface of the housing 3310. The upper elastic member 3510 may be coupled to the side elastic member 3530. The upper elastic member 3510 may be formed of a leaf spring.

The upper elastic member 3510 may comprise a plurality of upper elastic units. The upper elastic member 3510 may comprise four upper elastic units. The upper elastic member 3510 may comprise first to fourth upper elastic units 3510-1, 3510-2, 3510-3, and 3510-4. The first to fourth upper elastic units 3510-1, 3510-2, 3510-3, and 3510-4 may connect four upper terminals 3641 and four wires of the second board 3640. Each of the four upper elastic units may comprise a body portion being coupled to the housing 3310 and a connection terminal being connected to a terminal of the second board 3640.

The upper elastic member 3510 may comprise an inner side portion 3511. The inner side portion 3511 may be coupled to the bobbin 3210. The inner side portion 3511 may be coupled to an upper surface of the bobbin 3210. The inner side portion 3511 may comprise a hole 3511a or a groove being coupled to the protruded part 3215 of the bobbin 3210. The inner side portion 3511 may be fixed to the bobbin 3210 by an adhesive.

The upper elastic member 3510 may comprise an outer side portion 3512. The outer side portion 3512 may be coupled to the housing 3310. The outer side portion 3512 may be coupled to the upper surface of the housing 3310. The outer side portion 3512 may comprise a hole or groove being coupled to the protrusion 3316 of the housing 3310. The outer side portion 3512 may be fixed to the housing 3310 by an adhesive.

The upper elastic member 3510 may comprise a connection part 3513. The connection part 3513 may connect the inner side portion 3511 and the outer side portion 3512. The connection part 3513 may have elasticity. At this time, the connection part 3513 may be referred to as an 'elastic part'. The connection part 3513 may be formed by bending two or more times. The connection part 3513 may not be overlapped with the second magnet 3610 in an optical axis direction. That is, in the present embodiment, the connection part 3513 may be distinguished from the first region 3514 being overlapped with the second magnet 3610 in an optical axis direction.

The upper elastic member 3510 may comprise a first region 3514. The first region 3514 may be expressed as an extension portion, an extended cover region, a cover portion, a cover extension portion, a cap portion, a shielding portion, a light blocking portion, a UV beam blocking portion, and the like. The first region 3514 may be extended from an inner side portion 3511. The first region 3514 may be overlapped with the second magnet 3610 in an optical axis direction. The first region 3514 may be disposed above the second magnet 3610. The first region 3514 may cover the upper surface 3611 of the second magnet 3610 when viewed from above. The first region 3514 may cover 90% or more of the area of the upper surface 3611 of the second magnet 3610 when viewed from above. The first region 3514 may be overlapped with at least 40% of the upper surface of the second magnet 3610 in an optical axis direction. The first region 3514 may be overlapped with a portion of the upper surface 3611 of the second magnet 3610 in an optical axis direction. At least a portion of the first region 3514 may be overlapped with the entire upper surface 3611 of the second magnet 3610 in an optical axis direction. The first region 3514 may be disposed to cover the groove 3212 of the bobbin 3210 in which the second magnet 3610 is accommodated. The first region 3514 may have a size to completely cover the upper portion of the groove 3212 of the bobbin 3210.

The upper elastic member 3510 may comprise a coupling portion 3515. The coupling portion 3515 may be extended from an outer side portion 3512. The coupling portion 3515 may be coupled to the side elastic member 3530. The coupling portion 3515 may comprise a hole through which the wire of the side elastic member 3530 passes. The coupling portion 3515 and the wire may be coupled by a solder.

The upper elastic member 3510 may comprise a terminal portion 3516. The terminal portion 3516 may be extended from the outer side portion 3512. The terminal portion 3516 may be coupled to the second board 3640 by a solder. The upper elastic member 3510 may comprise four terminal portions 3516 corresponding to the first to fourth upper elastic units 3510-1, 3510-2, 3510-3, and 3510-4.

The elastic member 3500 may comprise a lower elastic member 3520. The lower elastic member 3520 may be disposed below the upper elastic member 3510. The lower elastic member 3520 may connect the bobbin 3210 and the housing 3310. The lower elastic member 3520 may be disposed below the bobbin 3210. The lower elastic member 3520 may be coupled to the bobbin 3210 and the housing 3310. The lower elastic member 3520 may be coupled to a lower surface of the bobbin 3210. The lower elastic member 3520 may be coupled to a lower surface of the housing 3310. The lower elastic member 3520 may be formed of a leaf spring.

The lower elastic member 3520 may comprise a plurality of lower elastic units. The lower elastic member 3520 may comprise two lower elastic units. The lower elastic member 3520 may comprise first and second lower elastic units 3520-1 and 3520-2. The first and second lower elastic units 3520-1 and 3520-2 may connect the two lower terminals 3642 of the second board 3640 and the first coil 3220.

The lower elastic member 3520 may comprise an inner side portion 3521. The inner side portion 3521 may be coupled to the bobbin 3210. The inner side portion 3521 may be coupled to a lower surface of the bobbin 3210. The inner side portion 3521 may comprise a hole or groove being coupled to the protrusion of the bobbin 3210. The inner side portion 3521 may be fixed to the bobbin 3210 by an adhesive.

The lower elastic member 3520 may comprise an outer side portion 3522. The outer side portion 3522 may be coupled to the housing 3310. The outer side portion 3522 may be coupled to a lower surface of the housing 3310. The outer side portion 3522 may comprise a hole or groove being coupled to the protrusion of the housing 3310. The outer side portion 3522 may be fixed to the housing 3310 by an adhesive.

The lower elastic member 3520 may comprise a connection part 3523. The connection part 3523 may connect the inner side portion 3521 and the outer side portion 3522. The connection part 3523 may have elasticity. At this time, the connection part 3523 may be referred to as an 'elastic part'. The connection part 3523 may be formed by bending two or more times.

The elastic member 3500 may comprise a side elastic member 3530. The side elastic member 3530 may connect the first board 3420 and the upper elastic member 3510. The side elastic member 3530 may be coupled to each of the upper elastic member 3510 and the first board 3420 by a solder. The side elastic member 3530 may movably support the housing 3310. The side elastic member 3530 may elastically support the housing 3310. The side elastic member 3530 may have elasticity at least in part. The side elastic member 3530 may support the movement of the housing 3310 and the bobbin 3210 during OIS driving. At this time, the side elastic member 3530 may be referred to as an 'OIS member'. The side elastic member 3530 may comprise an elastic member. The side elastic member 3530 may be formed of a wire. In a modified embodiment, the side elastic member 3530 may be formed as a leaf spring.

The side elastic member 3530 may comprise a wire. The side elastic member 3530 may comprise a wire spring. The side elastic member 3530 may comprise a plurality of wires. The side elastic member 3530 may comprise four wires being connected to pair with the four upper elastic units. The side elastic member 3530 may comprise first to fourth wires 3531, 3532, 3533, and 3534. The first wire 3531 may be electrically connected to the first upper elastic unit 3510-1. The second wire 3532 may be electrically connected to the second upper elastic unit 3510-2. The third wire 3533 may be electrically connected to the third upper elastic unit 3510-3. The fourth wire 3534 may be electrically connected to the fourth upper elastic unit 3510-4.

The lens driving device may comprise a second magnet 3610. The second magnet 3610 may be a 'sensing magnet'. The second magnet 3610 may be disposed in the bobbin 3210. The second magnet 3610 may be disposed on the upper surface 3611 of the first coil 3220. The second magnet 3610 may be detected by the sensor 3630. The second magnet 3610 may face the sensor 3630. The second magnet 3610 may be disposed on a side portion of the bobbin 3210. That is, the second magnet 3610 may be disposed to face a side portion of the housing 3310. The second magnet 3610 is disposed in the groove 3212 of the bobbin 3210 so that the upper surface 3611 of the second magnet 3610 may face the upper elastic member 3510.

The second magnet 3610 may comprise: an upper surface 3611; a lower surface being disposed at an opposite side of the upper surface 3611 of the second magnet 3610; and an inner surface, an outer surface, and both side surfaces connecting the upper surface 3611 of the second magnet 3610 and the lower surface of the second magnet 3610. At this time, the lower surface of the second magnet 3610 may be fixed to the first coil 3220. The inner surface and both side surfaces of the second magnet 3610 may be fixed to the bobbin 3210.

In the present embodiment, an adhesive may be disposed between the first region 3514 of the upper elastic member 3510 and the upper surface 3611 of the second magnet 3610. That is, the second magnet 3610 may be fixed to an upper surface in addition to the lower surface, the inner surface, and both side surfaces. Accordingly, the fixing force of the second magnet 3610 may be improved.

The lens driving device may comprise a third magnet 3620. The third magnet 3620 may be a 'compensation magnet'. The third magnet 3620 may be disposed in the bobbin 3210. The third magnet 3620 may be disposed to achieve magnetic force balance with the second magnet 3610. The third magnet 3620 may be symmetrical with the second magnet 3610 about the optical axis. The third magnet 3620 may be disposed in a position corresponding to the second magnet 3610 about the optical axis. The third magnet 3620 may have a size and/or shape corresponding to that of the second magnet 3610 about the optical axis. A second magnet 3610 is disposed in one side of the bobbin 3210, and a third magnet 3620 may be disposed in the other side of the bobbin 3210. The third magnet 3620 may be disposed in a side portion of the bobbin 3210. That is, the third magnet 3620 may be disposed to face the side portion of the housing 3310.

The lens driving device may comprise a sensor 3630. The sensor 3630 may be used for AF feedback driving. At this time, the sensor 3630 may be referred to as an 'AF feedback driving sensor'. The sensor 3630 may detect the second magnet 3610. The sensor 3630 may be disposed in the second board 3640. The sensor 3630 may be disposed in the housing 3310. In a modified embodiment, the sensor 3630 may be disposed in the bobbin 3210. The sensor 3630 may detect the movement of the first mover 3200. The sensor 3630 may comprise a Hall sensor. At this time, the Hall sensor may detect the movement of the bobbin 3210 and the lens by detecting the magnetic force of the second magnet 3610. The detected value detected by the sensor 3630 may be used for AF feedback control.

The lens driving device may comprise a second board 3640. The second board 3640 may be disposed in the housing 3310. The second board 3640 may be disposed in one sidewall of the housing 3310. The second board 3640 may be coupled to the sensor 3630. The second board 3640 may be electrically connected to the sensor 3630. The second board 3640 may be coupled to the upper elastic member 3510. The second board 3640 may not be overlapped with an imaginary line connecting the first corner portion of the housing 3310 and the optical axis.

The second board 3640 may comprise a body portion in which the first terminal and the second terminal are disposed, and an extension portion being extended downwardly from the body portion. At this time, the first terminal and the second terminal may be disposed adjacent to both ends of the body portion of the second board 3640, respectively.

The second board 3640 may comprise a terminal. The second board 3640 may comprise a plurality of terminals. The second board 3640 may comprise an upper terminal 3641. The second board 3640 may comprise four terminals disposed at an upper portion of the second board 3640. That is, the upper terminal 3641 may comprise four terminals. The four terminals of the second board 3640 may be electrically connected to the first board 3420 through four upper elastic units and four wires. The terminal of the second board 3640 may comprise a first terminal, a second terminal, a third terminal, and a fourth terminal being disposed between the first terminal and the second terminal. At this time, the housing 3310 may comprise a first corner portion and a second corner portion adjacent to the first corner portion, the first terminal may be adjacent to the first corner portion, and the second terminal may be adjacent to the second corner portion. The first terminal may be connected to the first wire 3531 through the first upper elastic unit 3510-1. The second terminal may be connected to the fourth wire 3534 through the fourth upper elastic unit 3510-4. The first terminal and the second terminal of the second board 3640 may be terminals for providing a power signal to the sensor 3630.

The third terminal may be connected to the second wire 3532 through the second upper elastic unit 3510-2. The fourth terminal may be connected to the third wire 3533 through the third upper elastic unit 3510-3. At this time, the second wire 3532 may be disposed in the third corner portion of the housing 3310 and the third wire 3533 may be disposed in the fourth corner portion of the housing 3310. The third terminal may be a terminal for providing a clock signal to the sensor 3630. The fourth terminal may be a terminal for providing a data signal to the sensor 3630.

The second board 3640 may comprise a lower terminal 3642. The second board 3640 may comprise two terminals being disposed at a lower portion of the second board 3640. That is, the lower terminal 3642 may comprise two terminals. The two terminals of the second board 3640 may be electrically connected to the first coil 3220 through the two lower elastic units.

The second board 3640 may comprise a groove. The groove of the second board 3640 may comprise a first groove being formed between the first terminal and the third terminal, and a second groove being formed between the second terminal and the fourth terminal. A portion of the first upper elastic unit 3510-1 may be connected to the first terminal. A portion of the fourth upper elastic unit 3510-4 may be connected to the second terminal. A portion of the second upper elastic unit 3510-2 passes through the first groove of the second board 3640 and may be connected to the third terminal. A portion of the third upper elastic unit 3510-3 passes through the second groove of the second board 3640 and may be connected to the fourth terminal.

The lens driving device may comprise an OIS sensor 3650. The OIS sensor 3650 may be used for OIS feedback control. At this time, the OIS sensor 3650 may be referred to as a 'sensor for OIS feedback driving'. The OIS sensor 3650 may be disposed between the base 3410 and the first board 3420. The OIS sensor 3650 may detect the movement of the second mover 3300. The OIS sensor 3650 may comprise a Hall sensor. At this time, the Hall sensor detects the magnetic force of the first magnet 3320 and may detect the movement of the housing 3310 and the first magnet 3320. The detected value detected by the OIS sensor 3650 may be used for OIS feedback control.

Hereinafter, an optical apparatus according to a third embodiment of the present invention will be described with reference to the drawings.

Figure 46:
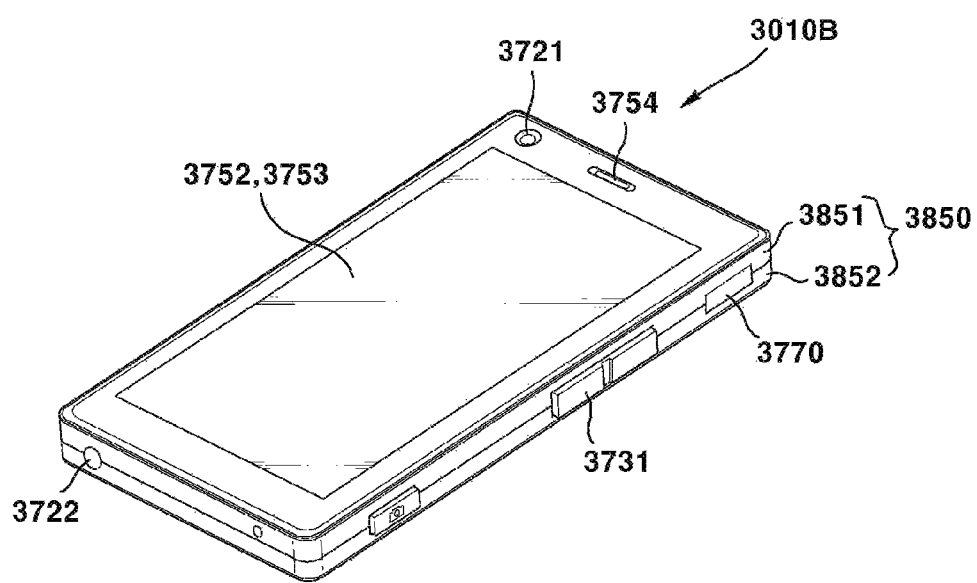
FIG. 46 is a perspective view illustrating an optical apparatus according to a third embodiment of the present invention.
Figure 47:
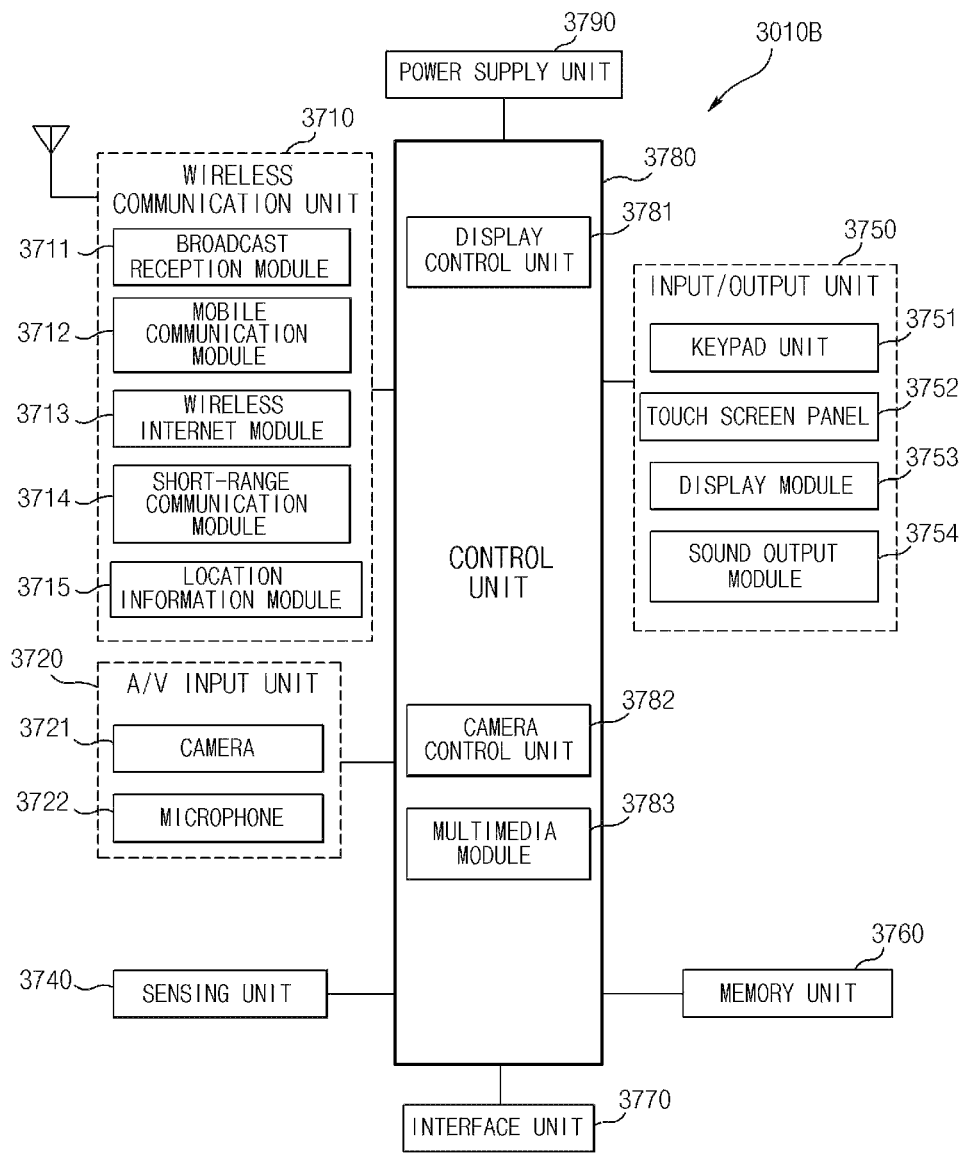
FIG. 47 is a block diagram of an optical apparatus according to a third embodiment of the present invention.

FIG. 46 is a perspective view illustrating an optical apparatus according to a third embodiment of the present invention; and FIG. 47 is a block diagram of an optical apparatus according to a third embodiment of the present invention.

The optical apparatus 3010B may comprise a portable terminal. The optical apparatus 3010B may be any one among a hand phone, a portable phone, a smart phone, a portable smart device, a digital camera, a laptop computer, a digital broadcasting terminal, a personal digital assistant (PDA), a portable multimedia player (PMP), and navigation. However, the type of the optical apparatus 3010B is not limited thereto, and any device for photographing a video or a picture may be comprised in the optical apparatus 3010B.

The optical apparatus 3010B may comprise a main body 3850. The main body 3850 may have a bar shape. Or, the main body 3850 may have various structures, such as a slide type, a folder type, a swing type, a swivel type, and the like in which two or more sub-bodies are coupled to be relatively movable. The main body 3850 may comprise a case (casing, housing, and cover) forming an outer appearance. For example, the main body 3850 may comprise a front case 3851 and a rear case 3852. Various electronic components of the optical apparatus 3010B may be embedded in a space formed between the front case 3851 and the rear case 3852. A display module 3753 may be disposed on one surface of the main body 3850. A camera 3721 may be disposed on one or more surfaces of one surface and the other surface being disposed at an opposite side of the one surface of the main body 3850.

In the present embodiment, the camera radar complex device may be disposed in a space corresponding to the bezel between the edge of the main body 3860 and the display.

The optical apparatus 3010B may comprise a wireless communication unit 3710. The wireless communication unit 3710 may comprise one or more modules enabling wireless communication between the optical apparatus 3010B and the wireless communication system, or between the optical apparatus 3010B and the network in which the optical apparatus 3010B is located. For example, the wireless communication unit 3710 may comprise any one or more among a broadcast reception module 3711, a mobile communication module 3712, a wireless Internet module 3713, a short-range communication module 3714, and a location information module 3715.

The optical apparatus 3010B may comprise an A/V input unit 3720. The A/V input unit 3720 is for inputting an audio signal or a video signal and may comprise any one or more of a camera 3721 and a microphone 3722. At this time, the camera 3721 may comprise a camera module according to the present embodiment.

The optical apparatus 3010B may comprise a sensing unit 3740. The sensing unit 3740 may generate a sensing signal for controlling the operation of the optical apparatus 3010B by detecting the current state of the optical apparatus 3010B such as the opening/closing state of the optical apparatus 3010B, the position of the optical apparatus 3010B, the presence or absence of user contact, the orientation of the optical apparatus 3010B, acceleration/deceleration of the optical apparatus 3010B, and the like. For example, when the optical apparatus 3010B is in the form of a slide phone, it is possible to sense whether the slide phone is opened or closed. In addition, it is responsible for sensing functions related to whether the power supply unit 3790 is supplied with power, whether the interface unit 3770 is coupled to an external device, and the like.

The optical apparatus 3010B may comprise an input/output unit 3750. The input/output unit 3750 may be configured to generate an input or output related to visual, auditory, or tactile sense. The input/output unit 3750 may generate input data for controlling the operation of the optical apparatus 3010B, and may output information processed by the optical apparatus 3010B.

The input/output unit 3750 may comprise any one or more among a keypad unit 3751, a touch screen panel 3752, a display module 3753, and a sound output module 3754. The keypad unit 3751 may generate input data in response to a keypad input. The touch screen panel 3752 may convert a change in capacitance generated due to a user's touch on a specific area of the touch screen into an electrical input signal. The display module 3753 may output an image photographed by the camera 3721. The display module 3753 may comprise a plurality of pixels whose color changes according to an electrical signal. For example, the display module 3753 may comprise at least one among a liquid crystal display, a thin film transistor liquid crystal display, an organic light emitting diode, a flexible display, and a 3D display. The sound output module 3754 may output audio data received from the wireless communication unit 3710 in a call signal reception, a call mode, a recording mode, a voice recognition mode, or a broadcast reception mode, or stored in the memory unit 3760.

The optical apparatus 3010B may comprise a memory unit 3760. A program for processing and controlling the control unit 3780 may be stored in the memory unit 3760. In addition, the memory unit 3760 may store input/output data, for example, any one or more of a phone book, a message, an audio, a still image, a photo, and a moving picture. The memory unit 3760 may store an image photographed by the camera 3721, for example, a photo or a video.

The optical apparatus 3010B may comprise an interface unit 3770. The interface unit 3770 serves as a path for connecting to an external device being connected to the optical apparatus 3010B. The interface unit 3770 may receive data from an external device, receive power and transmit it to each component inside the optical apparatus 3010B, or transmit data inside the optical apparatus 3010B to the external device. The interface unit 3770 may comprise any one or more among a wired/wireless headset port, an external charger port, a wired/wireless data port, a memory card port, a port for connecting a device equipped with an identification module, and an audio I/O port, a video I/O port, and an earphone port.

The optical apparatus 3010B may comprise a control unit 3780. The control unit 3780 may control the overall operation of the optical apparatus 3010B. The control unit 3780 may perform related control and processing for voice call, data communication, video call, and the like. The control unit 3780 may comprise a display control unit 3781 that controls a display module 3753 that is a display of the optical apparatus 3010B. The control unit 3780 may comprise a camera control unit 3782 that controls the camera module. The control unit 3780 may comprise a multimedia module 3783 for playing multimedia. The multimedia module 3783 may be provided inside the control unit 3180 or may be provided separately from the control unit 3780.

The control unit 3780 may perform a pattern recognition process capable of recognizing a handwriting input or a drawing input performed on the touch screen as characters and images, respectively.

The optical apparatus 3010B may comprise a power supply unit 3790. The power supply unit 3790 may receive external power or internal power by the control of the control unit 3780 to supply power required for operation of each component.

The first to third embodiments of the present invention have been separately described above. Some configurations of the first embodiment may be comprised in the second embodiment. Some configurations of the first embodiment may be comprised in the third embodiment. For example, the holder 310 of the first embodiment may be applied to the second embodiment and the third embodiment. The camera module according to the first embodiment and the camera module according to the third embodiment may be applied to the first camera module 200 and the second camera module 300 of the second embodiment. Some configurations of the third embodiment may be comprised in the first embodiment. Some configurations of the third embodiment may be comprised in the second embodiment. For example, the printed circuit board 3010 of the third embodiment may be applied to the first and second embodiments.

Although the embodiment of the present invention has been described above with reference to the accompanying drawings, those of ordinary skill in the art to which the present invention belongs will understand that the present invention may be embodied in other specific forms without changing the technical spirit or essential features thereof. Therefore, it should be understood that the embodiments described above are illustrative in all respects and not restrictive.

The invention claimed is:

1. A camera device comprising:
   a bracket comprising a first hole and a second hole;
   a first camera module disposed on the first hole of the bracket;
   a second camera module disposed on the second hole of the bracket;
   a first magnet disposed on an outer surface of the first camera module; and
   a second magnet disposed on an outer surface of the bracket at a position corresponding to the first magnet,
   wherein the first magnet is fixed to the outer surface of the first camera module, and
   wherein the second magnet is movably disposed on the bracket.

2. The camera device of claim 1, wherein the bracket comprises a groove formed on the outer surface of the bracket, and
   wherein the second magnet is movable in the groove of the bracket.

3. The camera device of claim 1, wherein an attractive force acts between the first magnet and the second magnet.

4. The camera device of claim 2, wherein the first camera module moves together with the second magnet by an attractive force between the first magnet and the second magnet, when the second magnet moves in the groove of the bracket.

5. The camera device of claim 2, wherein the first magnet comprises a first internal magnet through which a first axis perpendicular to an optical axis of the first camera module passes and a second internal magnet through which a second axis perpendicular to both the first axis and the optical axis of the first camera module passes, and
   wherein the second magnet comprises a first external magnet through which the first axis passes and a second external magnet through which the second axis passes.

6. The camera device of claim 5, wherein the first external magnet and the second external magnet are movable in different directions.

7. The camera device of claim 5, wherein the first external magnet is movable in a direction of the optical axis, and
   wherein the second external magnet is movable in a direction of the first axis.

8. The camera device of claim 7, wherein the first external magnet is limited in movement in directions of the first axis and the second axis, and
   wherein the second external magnet is limited in movement in directions of the optical axis and the second axis.

9. The camera device of claim 5, wherein the first external magnet is movable in directions of the optical axis and the second axis.

10. The camera device of claim 5, wherein the groove of the bracket comprises a first groove disposed with the first external magnet and a second groove disposed with the second external magnet, and
wherein a length of the first groove in a direction of the optical axis is greater than a length of the first groove in a direction of the second axis.

11. The camera device of claim 10, wherein the length of the first groove in the direction of the second axis is same as a length of the first external magnet in a direction of the second axis.

12. The camera device of claim 10, wherein a length of the second groove in a direction of the first axis is greater than a length of the second groove in a direction of the optical axis.

13. The camera device of claim 12, wherein the length of the second groove in the direction of the optical axis is same as a length of the second external magnet in a direction of the optical axis.

14. The camera device of claim 2, wherein the groove of the bracket is spaced apart from an edge of the outer surface of the bracket.

15. An optical device comprising:
a main body;
the camera device of claim 1 disposed on the main body; and
a display disposed on the main body and outputting an image photographed by the camera device.

16. A camera device comprising:
a bracket;
a first camera module disposed on the bracket;
a second camera module disposed on the bracket and facing a same direction with the first camera module;
a first magnet disposed on the first camera module; and
a second magnet movably disposed on the bracket,
wherein the first magnet and the second magnet are disposed so that an attractive force is formed between the first magnet and the second magnet.

17. The camera device of claim 16, wherein the bracket is disposed between the first magnet and the second magnet.

18. The camera device of claim 16, wherein the bracket comprises a groove formed on an outer surface of the bracket, and
wherein the second magnet is disposed in the groove of the bracket.

19. The camera device of claim 16, wherein the first magnet comprises a first internal magnet and a second internal magnet,
wherein the second magnet comprises a first external magnet disposed at a position corresponding to the first internal magnet and a second external magnet disposed at a position corresponding to the second internal magnet,
wherein the first external magnet is movable in an optical axis direction, and
wherein the second external magnet is movable in a first direction perpendicular to the optical axis direction.

20. A camera device comprising:
a bracket comprising a first hole and a second hole;
a first camera module disposed on the first hole of the bracket;
a second camera module disposed on the second hole of the bracket;
a first magnet disposed on the first camera module; and
a second magnet movably disposed on the bracket,
wherein the first magnet and the second magnet are disposed at positions corresponding to each other with the bracket interposed therebetween, and
wherein the first camera module moves together with the second magnet by an attractive force between the first magnet and the second magnet, when the second magnet moves.

\* \* \* \* \*